(12) United States Patent
Hatakeyama et al.

(10) Patent No.: US 12,271,112 B2
(45) Date of Patent: Apr. 8, 2025

(54) NEGATIVE RESIST COMPOSITION AND PATTERN FORMING PROCESS

(71) Applicant: Shin-Etsu Chemical Co., Ltd., Tokyo (JP)

(72) Inventors: Jun Hatakeyama, Joetsu (JP); Naoya Inoue, Joetsu (JP); Kenji Funatsu, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 555 days.

(21) Appl. No.: 17/592,711

(22) Filed: Feb. 4, 2022

(65) Prior Publication Data

US 2022/0260909 A1 Aug. 18, 2022

(30) Foreign Application Priority Data

Feb. 17, 2021 (JP) ................. 2021-023472

(51) Int. Cl.
| | |
|---|---|
| G03F 7/038 | (2006.01) |
| C08F 212/14 | (2006.01) |
| C08F 220/38 | (2006.01) |
| G03F 1/76 | (2012.01) |
| G03F 7/30 | (2006.01) |

(52) U.S. Cl.
CPC .......... *G03F 7/0382* (2013.01); *C08F 212/24* (2020.02); *G03F 1/76* (2013.01); *G03F 7/0387* (2013.01); *G03F 7/30* (2013.01)

(58) Field of Classification Search
CPC .... G03F 7/0392; G03F 7/0382; G03F 7/0388; G03F 1/76; G03F 7/30; C08F 220/38
See application file for complete search history.

(56) References Cited

U.S. PATENT DOCUMENTS

| | | |
|---|---|---|
| 7,300,739 B2 | 11/2007 | Allen et al. |
| 2003/0215736 A1 | 11/2003 | Oberlander et al. |
| 2013/0209922 A1 | 8/2013 | Masunaga et al. |
| 2020/0133121 A1 | 4/2020 | Domon et al. |

FOREIGN PATENT DOCUMENTS

| | | | | |
|---|---|---|---|---|
| JP | 2004-115630 A | | 4/2004 | |
| JP | 2006-169302 A | | 6/2006 | |
| JP | 2013-164588 A | | 8/2013 | |
| JP | 2017-222832 A | | 12/2017 | |
| KR | 2018048651 A | * | 5/2018 | ............ C08G 59/62 |
| TW | 200303451 A | | 9/2003 | |
| TW | 202024031 A | | 7/2020 | |

OTHER PUBLICATIONS

Office Action dated Sep. 27, 2022, issued in counterpart TW application No. 111105365. (6 pages).

* cited by examiner

*Primary Examiner* — John S. Chu

(74) *Attorney, Agent, or Firm* — WHDA, LLP

(57) ABSTRACT

A negative resist composition comprising a base polymer comprising repeat units derived from a triple bond-containing maleimide compound is provided. A pattern with a high resolution and reduced edge roughness is formed therefrom.

11 Claims, No Drawings

NEGATIVE RESIST COMPOSITION AND PATTERN FORMING PROCESS

CROSS-REFERENCE TO RELATED APPLICATION

This non-provisional application claims priority under 35 U.S.C. § 119(a) on Patent Application No. 2021-023472 filed in Japan on Feb. 17, 2021, the entire contents of which are hereby incorporated by reference.

TECHNICAL FIELD

This invention relates to a negative resist composition and a pattern forming process.

BACKGROUND ART

To meet the demand for higher integration density and operating speed of LSIs, the effort to reduce the pattern rule is in rapid process. As the use of 5G high-speed communications and artificial intelligence (AI) is widely spreading, high-performance devices are needed for their processing. As the advanced miniaturization technology, manufacturing of microelectronic devices at the 5-nm node by the lithography using EUV of wavelength 13.5 nm has been implemented in a mass scale. Studies are made on the application of EUV lithography to 3-nm node devices of the next generation and 2-nm node devices of the next-but-one generation.

The process for the fabrication of mask patterns involves formation of a resist pattern by electron beam (EB) writing. To increase the throughput of EB imaging, chemically amplified resist materials are generally used. Exemplary are chemically amplified resist materials comprising a base polymer in the form of a polyhydroxystyrene which some hydroxy groups are substituted with acid labile groups, an acid generator, a quencher for controlling acid diffusion, a surfactant, and an organic solvent. Despite the benefit of high sensitivity, the chemically amplified resist materials have the shortcoming that resolution and pattern accuracy are degraded by image blurs due to acid diffusion.

The resolution is improved by throttling the beam radius or by increasing the accelerating voltage from 50 kV to 100 kV. Since the imaging area is narrower in the former case, and the scattering of electrons in resist film is reduced in the latter case, the resist film has a lower sensitivity, taking a longer imaging time. The imaging time is also prolonged by the progress of miniaturization and an increasing number of imaging pattern features.

To overcome the tradeoff between resolution improvement and imaging time reduction, a multibeam EB writing tool capable of simultaneous imaging using a plurality of throttled electron beams has been developed. The tool enables to shorten the imaging time while ameliorating the resolution.

As the resolution of resist pattern by EB writing improves, the aspect ratio of resist pattern increases, which raises the problem that pattern collapse occurs by the stresses applied during rinsing and drying after development. To prevent such inconvenience, a transition of resist film to a thinner film is proceeding. An improvement in dry etching resistance is necessary as well as the film thickness reduction. For improving the dry etching resistance of a resist film, Patent Documents 1 and 2 propose positive resist compositions based on copolymers of acid labile group-substituted hydroxystyrene with indene and acenaphthylene. The copolymerization of indene or acenaphthylene is not only effective for improving dry etching resistance, but also contributes to an improvement in resolution by virtue of the advantage that acid diffusion is controlled.

Patent Document 3 discloses a negative resist material adapted to switch its polarity from hydrophilic to hydrophobic as a result of acid-catalyzed dehydrating reaction. Since no crosslinking reaction is involved, this resist material undergoes smaller swell in developer than conventional negative resist materials having a crosslinker added thereto, indicating an unlikelihood of pattern collapse.

Patent Document 4 discloses a polymer comprising repeat units derived from indene or acenaphthylene, which is useful not only in negative resist material using a crosslinker or a base polymer containing crosslinking units, but also in negative resist material adapted to reduce hydrophilicity by acid-catalyzed dehydrating reaction.

Nowadays, oxide film-bearing hard masks are applied as the mask substrate, eliminating the need far an extreme improvement in dry etching resistance of resist film. For the resist material, a better resolution is required rather than the dry etching resistance improvement, Along with the resolution improvement, a reduction of edge roughness (LER, LWR) also becomes important at present.

For the purposes of improvement in resolution and reduction of edge roughness, it is important to reduce acid diffusion, to improve dissolution contrast, and to reduce swell. Patent Document 5 proposes to incorporate bulky repeat units having a polar group such as vinylanthraquinone, which is effective for suppressing acid diffusion. There is still a need for a resist material with lower acid diffusion.

CITATION LIST

Patent Document 1: JP-A 2004-115630
Patent Document 2: JP-A 2006-169302
Patent Document 3: U.S. Pat. No. 7,300,739
Patent Document 4: JP-A 2013-164588
Patent Document 5: JP-A 2017-722832

DISCLOSURE OF INVENTION

An object of the invention is to provide a negative resist composition having a resolution surpassing any prior art negative resist compositions and reduced edge roughness, and a pattern forming process using the same.

Searching for a negative resist composition featuring high resolution and minimal edge roughness, the inventors have found that a polymer comprising specific repeat units is an effective base polymer in the negative resist composition.

While polymers comprising repeat units derived from indene or acenaphthylene as described in Patent Document 4 are effective for improving acid diffusion control and reducing edge roughness, a further improvement in performance is needed. As a result of copolymerization of indene or acenaphthylene, the resulting polymer has a more robust backbone and a higher glass transition temperature, and accordingly, the acid diffusion distance becomes shorter. These copolymers are more effective in acid diffusion control than styrene copolymers. On the other hand, since indene and acenaphthylene are hydrophobic aromatic compounds, a hydrophilic portion and a hydrophobic portion co-exist in the polymer. The dissolution of the polymer in alkaline developer becomes non-uniform, which incurs swell and causes degradation of edge roughness.

Making investigations to reduce edge roughness by suppressing acid diffusion for ameliorating alkaline dissolution uniformity, the inventors have found that when a polymer comprising repeat units derived from a triple bond-containing maleimide is used as a base polymer to formulate a negative resist composition, there are obtained advantages including a high contrast of alkaline dissolution rate before and after exposure, full suppression of acid diffusion, a high resolution, a good pattern profile and reduced edge roughness after exposure. This negative resist composition is best suited as the fine pattern-forming material for the manufacture of VLSIs and photomasks.

In one aspect, the invention provides a negative resist composition comprising a base polymer comprising repeat units (a) derived from a triple bond-containing maleimide compound.

Typically, the repeat units (a) are repeat units (a1) having the formula (a1) or repeat units (a2) having the formula (a2).

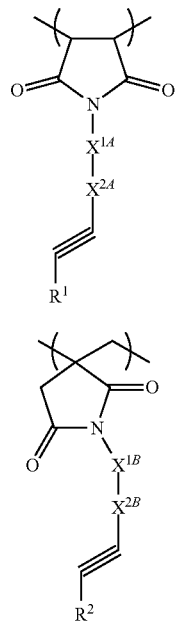

Herein $R^1$ and $R^2$ are each independently hydrogen or methyl, $X^{1A}$ and $X^{1B}$ are each independently a single bond, a $C_1$-$C_6$ saturated hydrocarbylene group or phenylene group, $X^{2A}$ and $X^{2B}$ are each independently a single bond, ester bond or ether bond.

In a preferred embodiment, the base polymer further comprises repeat units (b) having a phenolic hydroxy group.

Typically, the repeat units (b) have the formula (b).

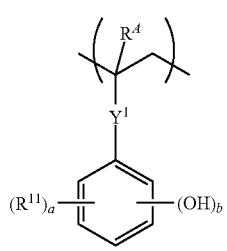

Herein $R^A$ is hydrogen or methyl, $R^{11}$ is a $C_1$-$C_4$ alkyl group, $C_1$-$C_4$ alkoxy group, acetoxy group or halogen, $Y^1$ is a single bond, ester bond or amide bond, a is an integer of 0 to 4, b is 1 or 2, and the sum of a+b is from 1 to 5.

In a preferred embodiment, the base polymer further comprises repeat units (c) having the formula (c).

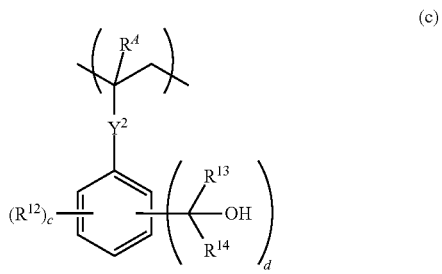

Herein $R^A$ is hydrogen or methyl, $R^{12}$ is a $C_1$-$C_6$ alkyl group or halogen, $R^{13}$ and $R^{14}$ are each independently hydrogen or a $C_1$-$C_6$ saturated hydrocarbyl group, $R^{13}$ and $R^{14}$ may bond together to form a ring with the carbon atom to which they are attached, $Y^2$ is a single bond or ester bond, c is an integer of 0 to 4, d is 1 or 2, and the sum of c+d is from 1 to 5.

In a preferred embodiment, the base polymer further comprises repeat units having the formula (d1), (d2) or (d3).

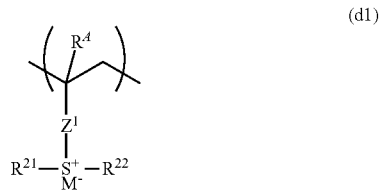

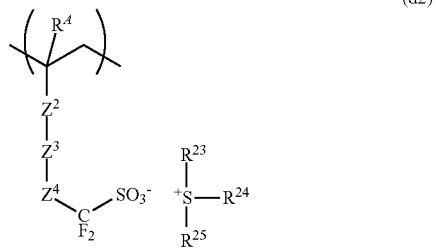

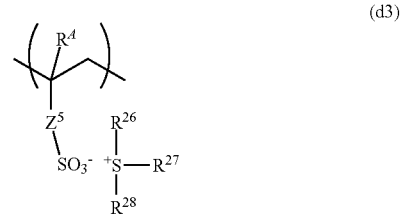

Herein $R^A$ is hydrogen or methyl,
$Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(=O)—O—$Z^{11}$— or —C(=O)—NH—$Z^{11}$—, $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety,
$Z^2$ is a single bond or ester bond.
$Z^3$ is a single bond, —$Z^{31}$—C(=O)—O—, —$Z^{31}$—O— or —$Z^{31}$—O—C(=O)—, $Z^{31}$ is a $C_1$-$C_{12}$ aliphatic hydrocarbylene group, phenylene group, or $C_7$-$C_{18}$ group obtained by combining the foregoing, which may contain a carbonyl moiety, ester bond, ether bond, bromine or iodine, $Z^4$ is methylene, 2,2,2-trifluoro-1,1-ethanediyl, or carbonyl, $Z^5$ is a single bond, methylene, ethylene, phenylene, fluorinated phenylene, trifluoromethyl-substituted phenylene group, —O—$Z^{51}$—, —C(=O)—O—$Z^{51}$—, or —C(=O)—NH—$Z^{51}$—, $Z^{51}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond, halogen or hydroxy moiety, $R^{21}$ to $R^{28}$ are each independently halogen or a $C_1$-$C_{20}$ hydrocarbyl group which may contain a heteroatom, a pair of $R^{23}$ and $R^{24}$ or R 6 and $R^{27}$ may bond together to form a ring with the sulfur atom to which they are attached, and $M^-$ is a non-nucleophilic counter ion.

The negative resist composition may further comprise an organic solvent, acid generator, quencher, and or surfactant.

In another aspect, the invention provides a pattern forming process comprising the steps of applying the negative resist composition defined above onto a substrate to forum a resist filth thereon, exposing the resist film to high-energy radiation, and developing the exposed resist film in a developer.

Typically, the substrate is a photomask blank.

Preferably, the high-energy radiation is UV radiation of wavelength 180 to 400 nm, EB or EUV of wavelength 3 to 15 nm.

A photomask blank having the negative resist composition defines above coated thereon is also contemplated.

Advantageous Effects of Invention

A resist film formed from the negative resist composition of the invention has advantages including a significantly high contrast of alkaline dissolution rate before and after exposure, a high resolution, an exposure latitude, process adaptability, a good pattern profile and reduced edge roughness after exposure, and deceleration of acid diffusion rate. Because of these advantages, the resist composition is best suited as a fine pattern-forming material for the manufacture of VLSIs and photomasks and a pattern-forming material for lithography using EB, EUV and ArF excimer laser. The resist composition is used not only in the lithography for semiconductor circuit formation, but also in the formation of mask circuit patterns, micro-machines, and thin-film magnetic head circuits.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. The terms "group" and "moiety" are interchangeable.

The abbreviations and acronyms have the following meaning.
EB: electron beam
EUV: extreme ultraviolet
Mw: weight average molecular weight
Mn: number average molecular weight
Mw/Mn: molecular weight dispersity
GPC: gel permeation chromatography
PEB: post-exposure bake
PAG: photoacid generator
LER: line edge roughness
CDU: critical dimension uniformity Resist Composition The invention provides a negative resist composition comprising a base polymer comprising repeat units (a) derived from a triple bond-containing male imide compound.

In a preferred embodiment, the repeat units (a) are repeat units having the formula (a1) or repeat units having the formula (a2). These repeat units are also referred to as repeat units (a1) and (a2).

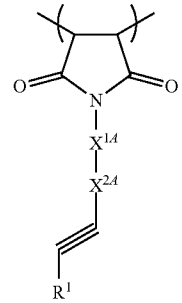

(a1)

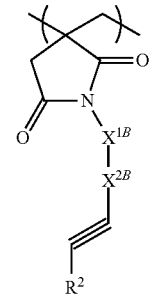

(a2)

In formulae (a1) and (a2), $R^1$ and $R^2$ are each independently hydrogen or methyl. $X^{1A}$ and $X^{1B}$ are each independently a single bond, a $C_1$-$C_6$ saturated hydrocarbylene group or phenylene group. $X^{2A}$ and $X^{2B}$ are each independently a single bond, ester bond or ether bond.

The saturated hydrocarbylene group represented by $X^{1A}$ and $X^{1B}$ may be straight, branched or cyclic. Examples thereof include $C_1$-$C_6$ alkanediyl groups such as methanediyl, ethane-1,1-diyl, ethane-1,2-diyl, propane-1,2-diyl, propane-1,3-diyl, propane-2,2-diyl, butane-1,2-diyl, butane-1,3-diyl, butane-1,4-diyl, butane-2,2-diyl, butane-2,3-diyl, 2-methylpropane-1,3-diyl, pentane-1,5-diyl, and hexane-1,6-diyl; cyclic saturated hydrocarbylene groups such as cyclopropanediyl, cyclobutanediyl, cyclopentylene, and cyclohexylene; and combinations thereof.

Examples of the monomer from which repeat units (a1) are derived are shown below, but not limited thereto.

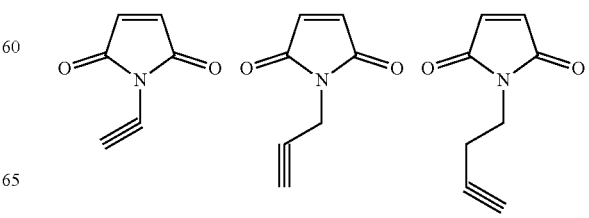

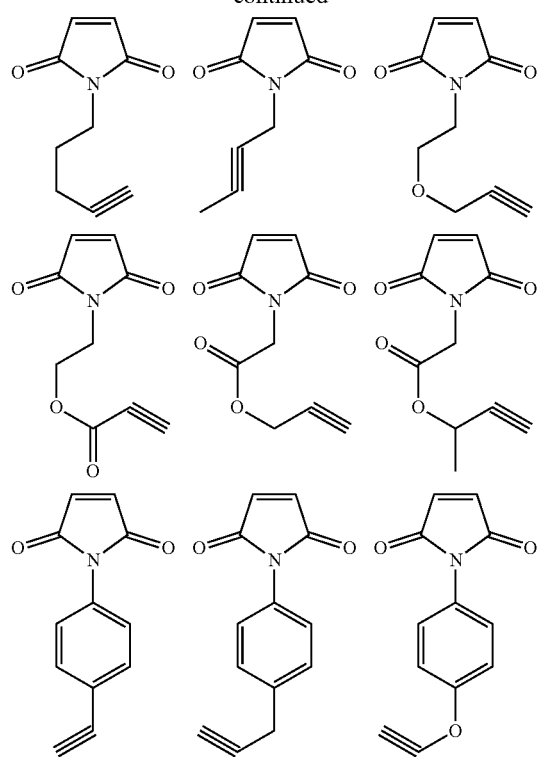
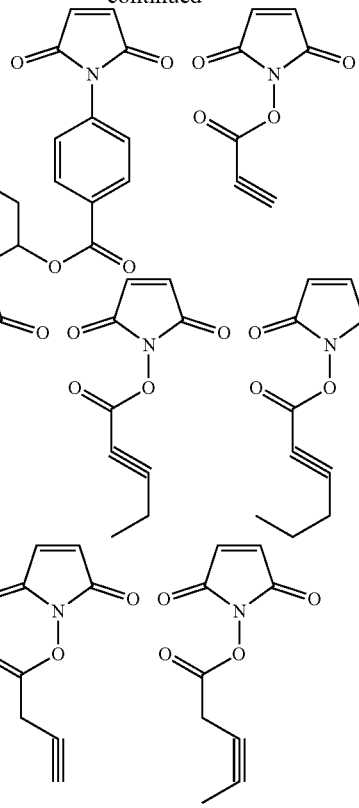
Examples of the monomer from which repeat units (a2) are derived are shown below, but not limited thereto.
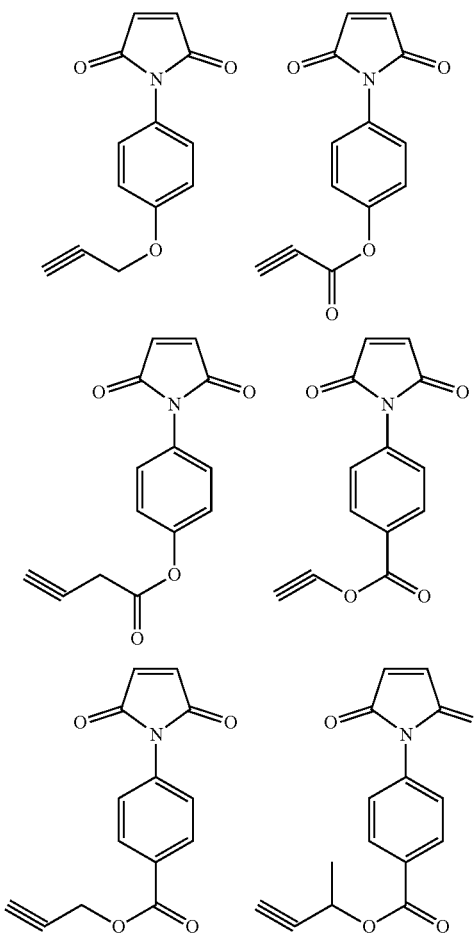

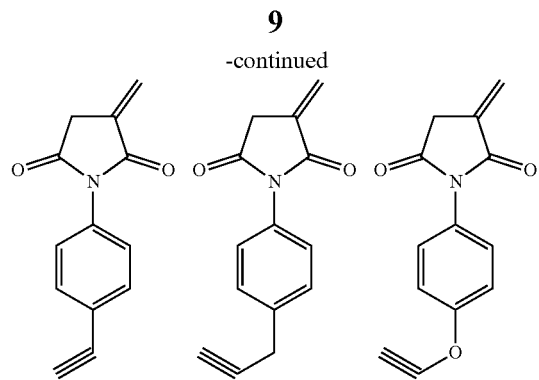
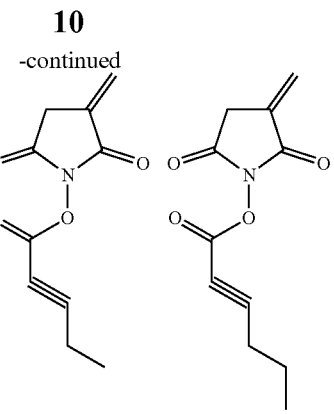
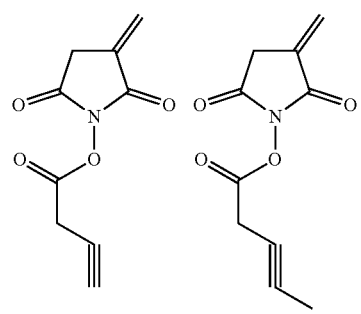

The maleimide compound can be synthesized, for example, by reaction of maleic anhydride or itaconic anhydride with an amine compound having an ethynyl group, or reaction of maleimide or itaconimide with a halogen compound having an ethynyl group.

The repeat units (a1) and (a2) have a nitrogen-containing maleimide group and hence, an acid diffusion controlling ability. Additionally, an acid diffusion reducing effect is exerted as a result of the backbone becoming robust. Since the triple bond is acidic, an adequate alkali dissolution is available and swell is reduced. Many advantages including low acid diffusion, low swell, high alkaline dissolution contrast, high resolution, low LER, and improved CDU are simultaneously achieved.

The base polymer may further comprise repeat units (b) having a phenolic hydroxy group. The repeat units (b) preferably have the formula (b).

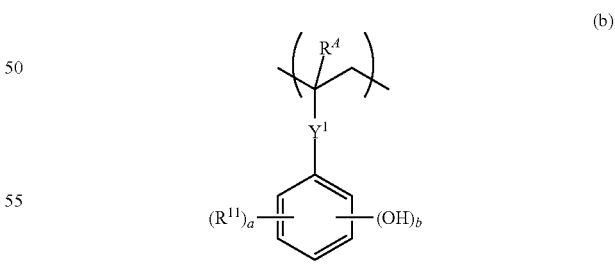

In formula (b), $R^A$ is hydrogen or methyl. $R^{11}$ is a $C_1$-$C_4$ alkyl group, $C_1$-$C_4$ alkoxy group, acetoxy group or halogen. $Y^1$ is a single bond, ester bond or amide bond, "a" is an integer of to 4, b is 1 or 2, and the sum of a+b is from 1 to 5 ($1 \leq a+b \leq 5$).

Examples of the monomer from which repeat units (b) are derived are shown below, but not limited thereto. Herein $R^A$ is as defined above.

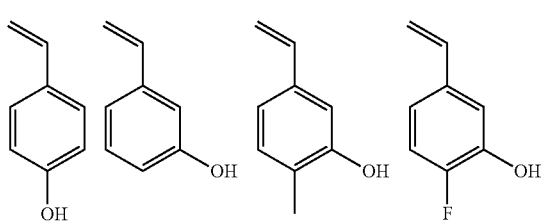
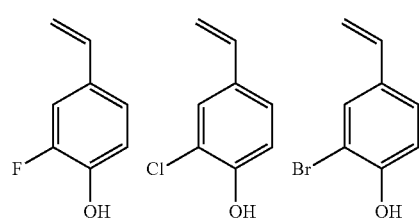
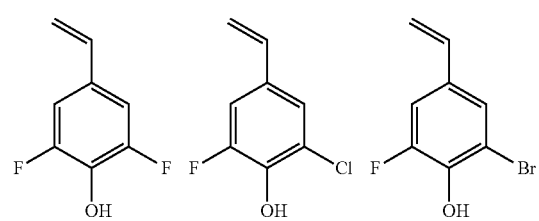
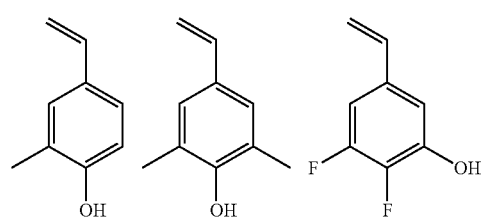
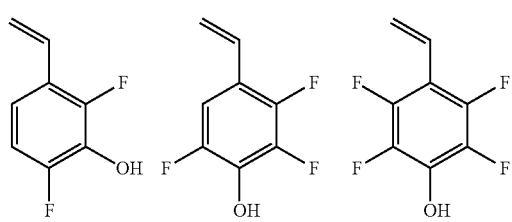
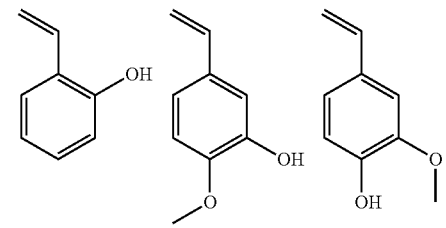
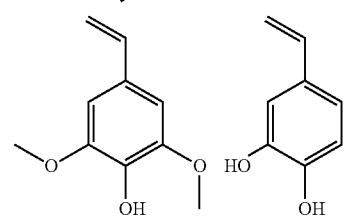

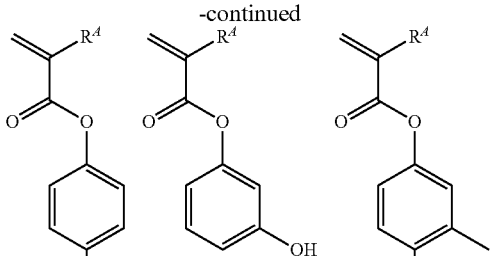
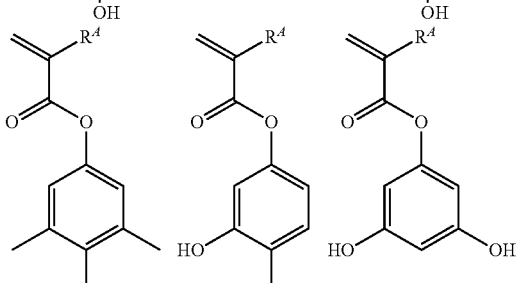
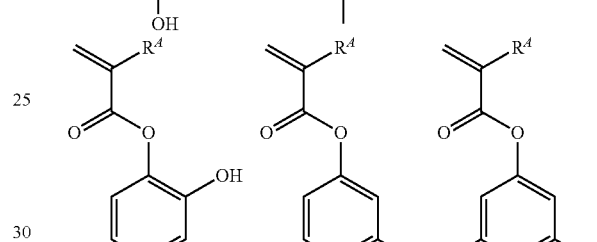
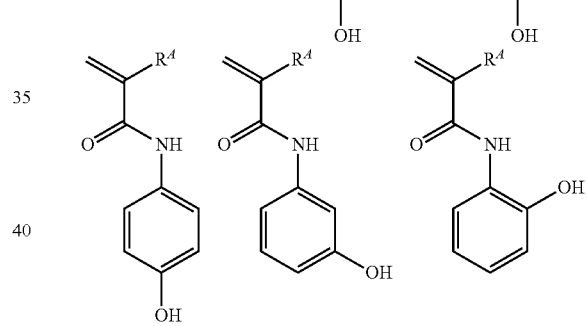

The base polymer may further comprise repeat units (c) having the formula (c). The repeat unit (c) is adapted to switch its polarity from hydrophilic to hydrophobic as a result of acid-catalyzed dehydrating reaction or the like.

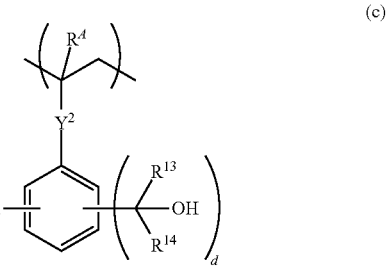

(c)

In formula (c), $R^A$ is hydrogen or methyl. $R^{12}$ is a $C_1$-$C_6$ alkyl group or halogen. $R^{13}$ and $R^{14}$ are each independently hydrogen or a $C_1$-$C_6$ saturated hydrocarbyl group, $R^{13}$ and $R^{14}$ may bond together to form a ring with the carbon atom to which they are attached. $Y^2$ is a single bond or ester bond, c is an integer of 0 to 4, d is 1 or 2, and the sum of c+d is from 1 to 5.
Examples of the monomer from which repeat units (c) are derived are shown below, but not limited thereto. Herein $R^A$ is as defined above.
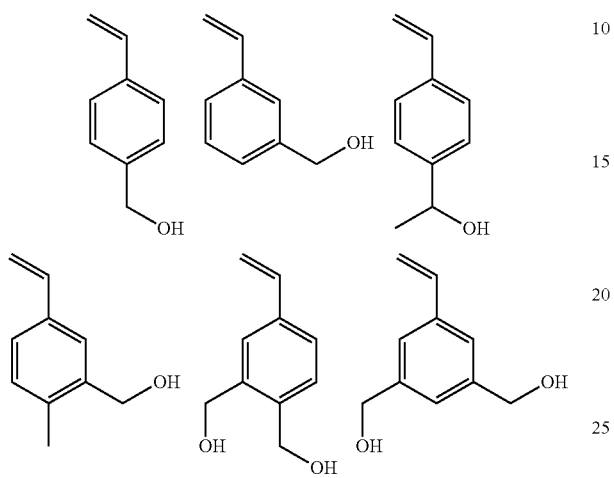
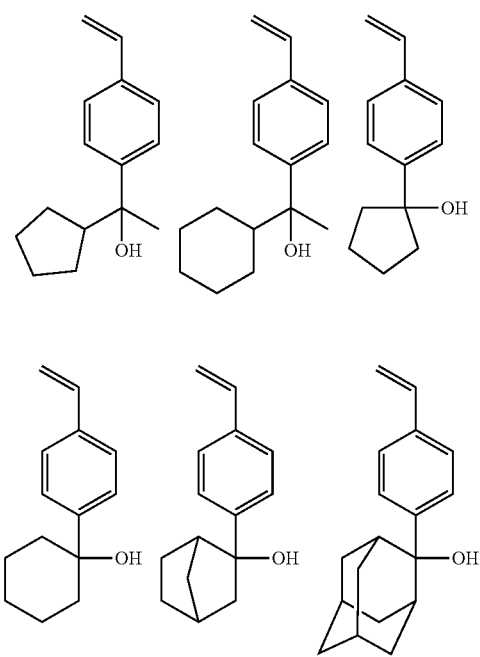
-continued
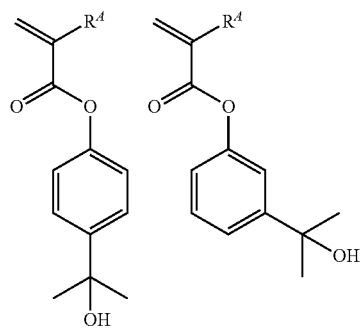
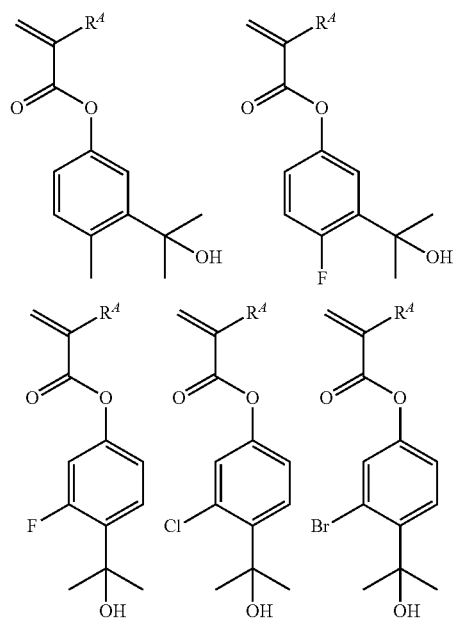

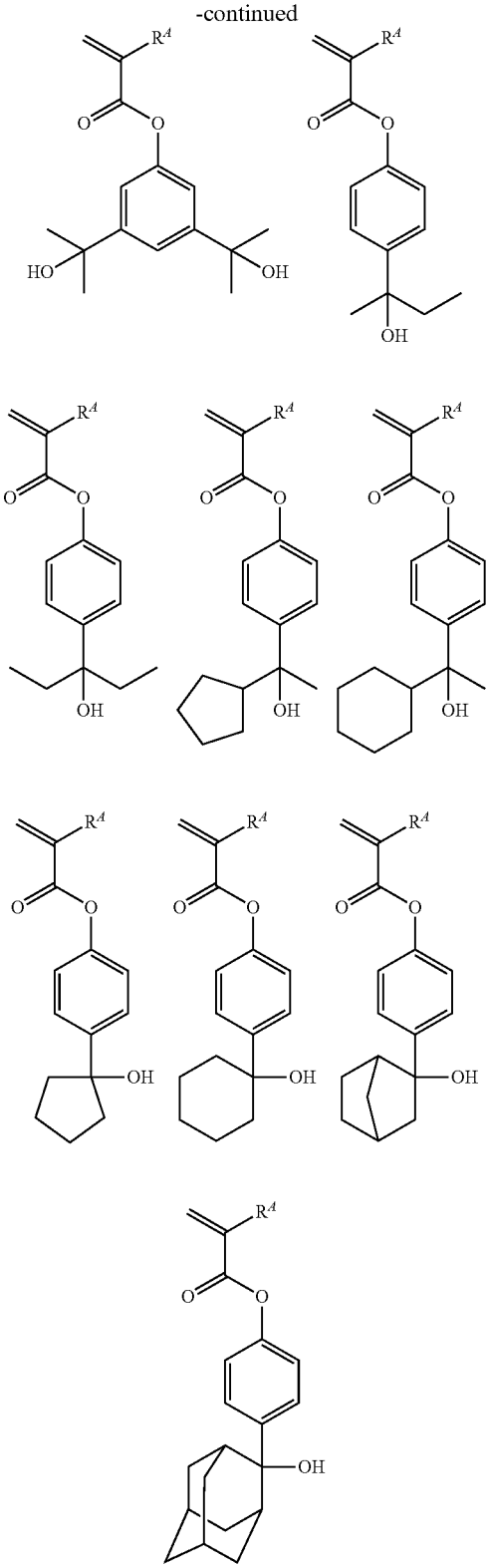

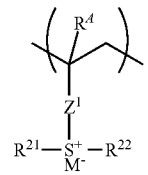

(d1)

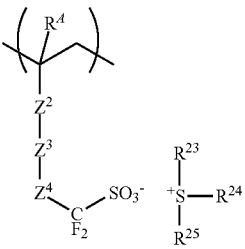

(d2)

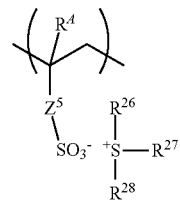

(d3)

In formulae (d1) to (d3), $R^A$ is independently hydrogen or methyl. $Z^1$ is a single bond, $C_1$-$C_6$ aliphatic hydrocarbylene group, phenylene group, naphthylene group, or $C_7$-$C_{18}$ group obtained by combining the foregoing, —O—$Z^{11}$—, —C(=O)—O—$Z^{11}$— or —C(=O)—NH—$Z^{11}$—. $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond or ester bond. $Z^3$ is a single bond, —$Z^{31}$—C(=O)—O—, —$Z^{31}$—O— or —$Z^{31}$—O—C(=O)—. $Z^{31}$ is a $C_1$-$C_{12}$ aliphatic hydrocarbylene group, phenylene group, or $C_7$-$C_{18}$ group obtained by combining the foregoing, which may contain a carbonyl moiety, ester bond, ether bond, bromine or iodine. $Z^4$ is a methylene, 2,2,2-trifluoro-1,1-ethanediyl or carbonyl group. $Z^5$ is a single bond, methylene, ethylene, phenylene, fluorinated phenylene, trifluoromethyl-substituted phenylene group, —O—$Z^{51}$—, —C(=O)—O—$Z^{51}$—, or —C(=O)—NH—$Z^{51}$—. $Z^{51}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond, halogen or hydroxy moiety. The aliphatic hydrocarbylene groups represented by $Z^1$, $Z^{11}$, $Z^{31}$, and $Z^{51}$ may be saturated or unsaturated and straight, branched or cyclic.

In formula (d1), is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoromethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (d1-1) and The base polymer may further comprise repeat units of at least one type selected from repeat units having the formula (d1), repeat units having the formula ($d_2$), and repeat units having the formula (d3). These units are simply referred to as repeat units (d1), (d2) and (d3) and may be used alone or in combination of two or more types.

sulfonate ions having fluorine substituted at α-position and trifluoromethyl at β-position as represented by the formula (d1-2).

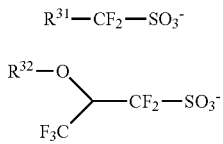

In formula (d1-1), $R^{31}$ is hydrogen or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic. Examples of the hydrocarbyl group are as will be exemplified later for $R^{11}$ in formula (1A').

In formula (d1-2), $R^{32}$ is hydrogen, or a $C_1$-$C_{30}$ hydrocarbyl group or $C_2$-$C_{30}$ hydrocarbylcarbonyl group, which may contain an ether bond, ester bond, carbonyl moiety or lactone ring. The hydrocarbyl group and hydrocarbyl moiety in the hydrocarbylcarbonyl group may be saturated or unsaturated and straight, branched or cyclic. Examples of the hydrocarbyl group are as will be exemplified later for $R^{11}$ in formula (1A').

Examples of the cation in the monomer from which repeat unit (d1) is derived are shown below, but not limited thereto. $R^A$ is as defined above.

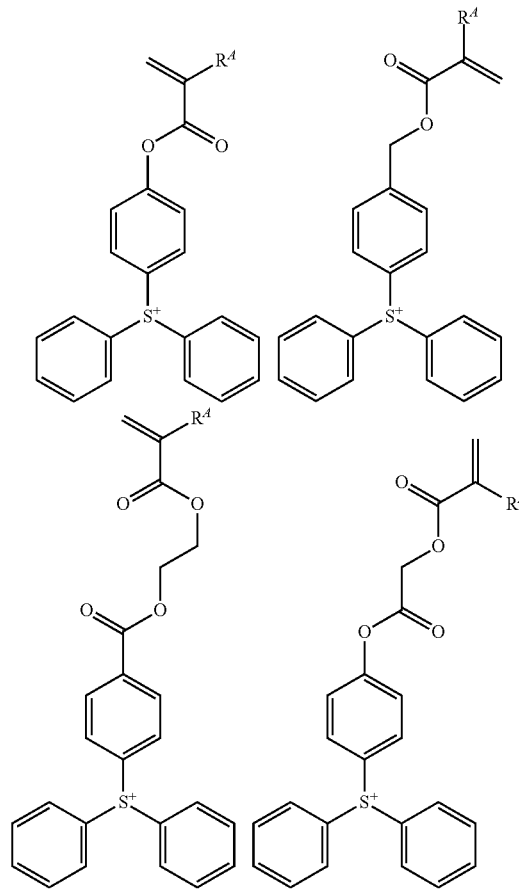

-continued

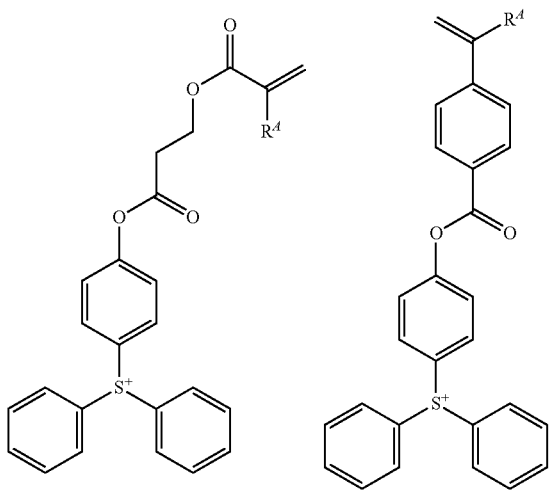

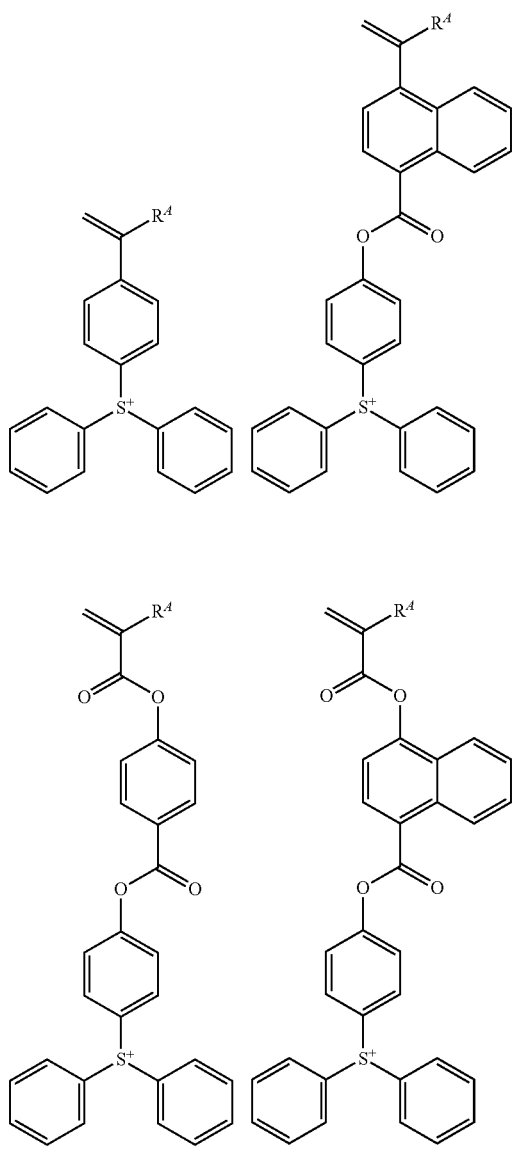

-continued
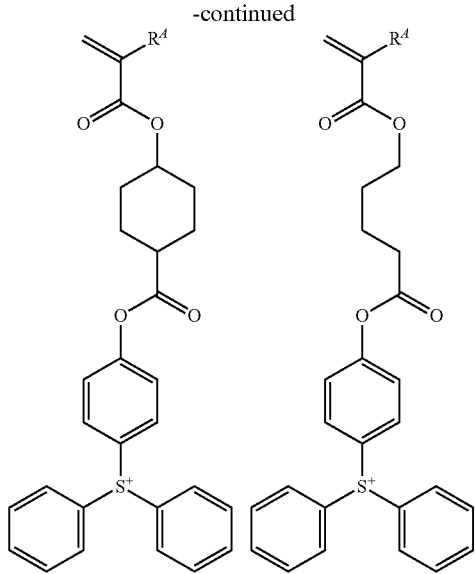
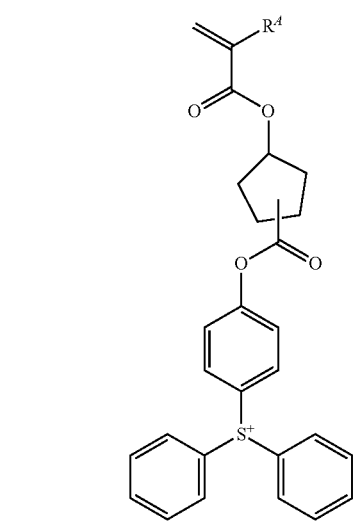
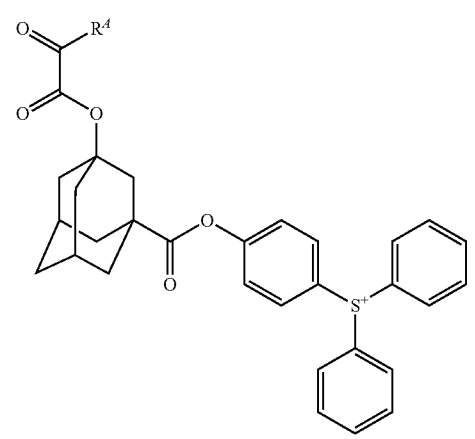
-continued
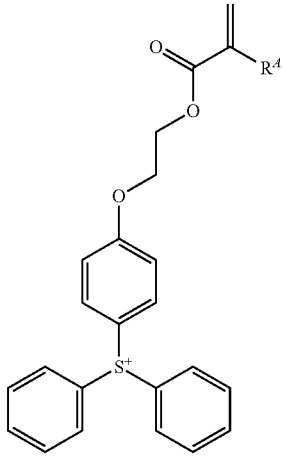
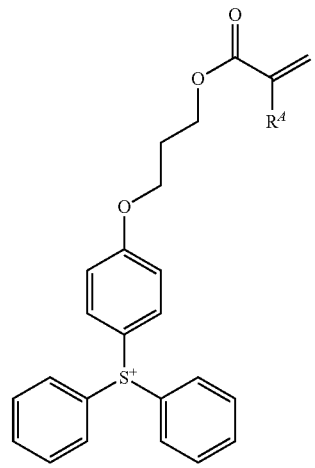
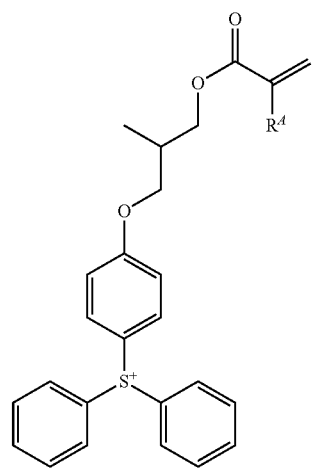

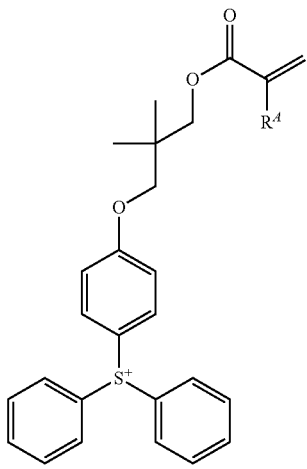
Examples of the anion in the monomer from which repeat unit (2) is derived are shown below, but not limited thereto. $R^A$ is as defined above.
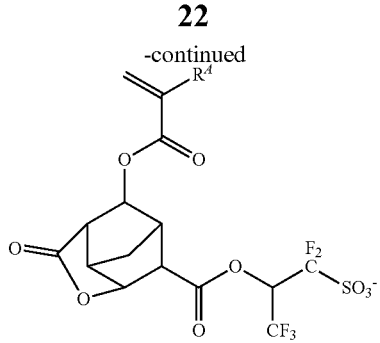
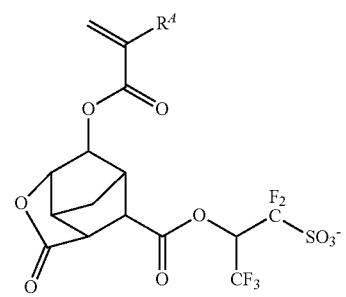
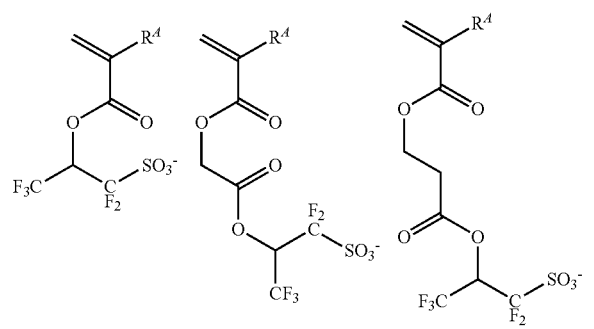
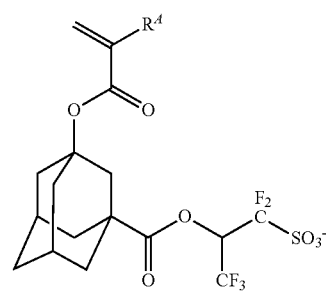
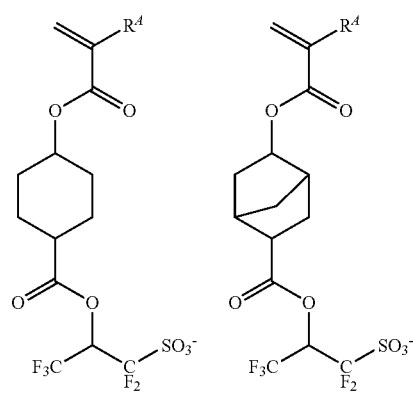
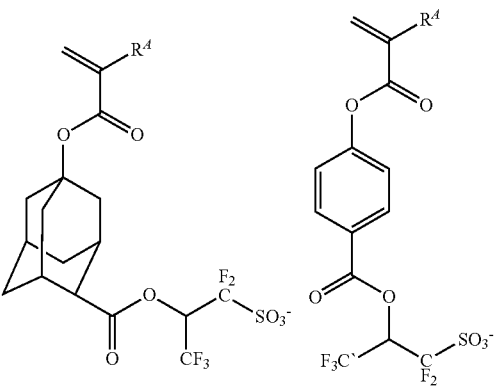
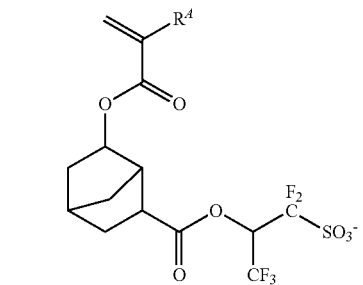
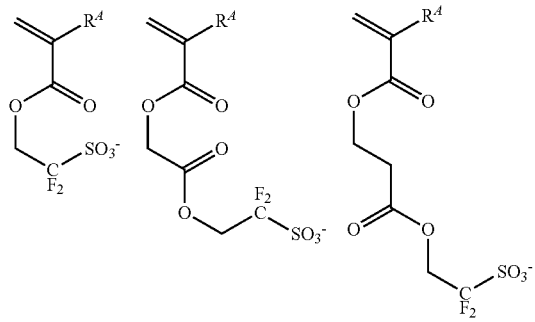

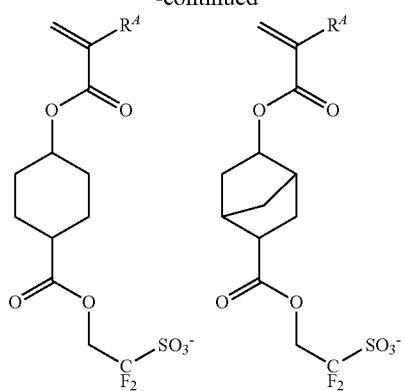
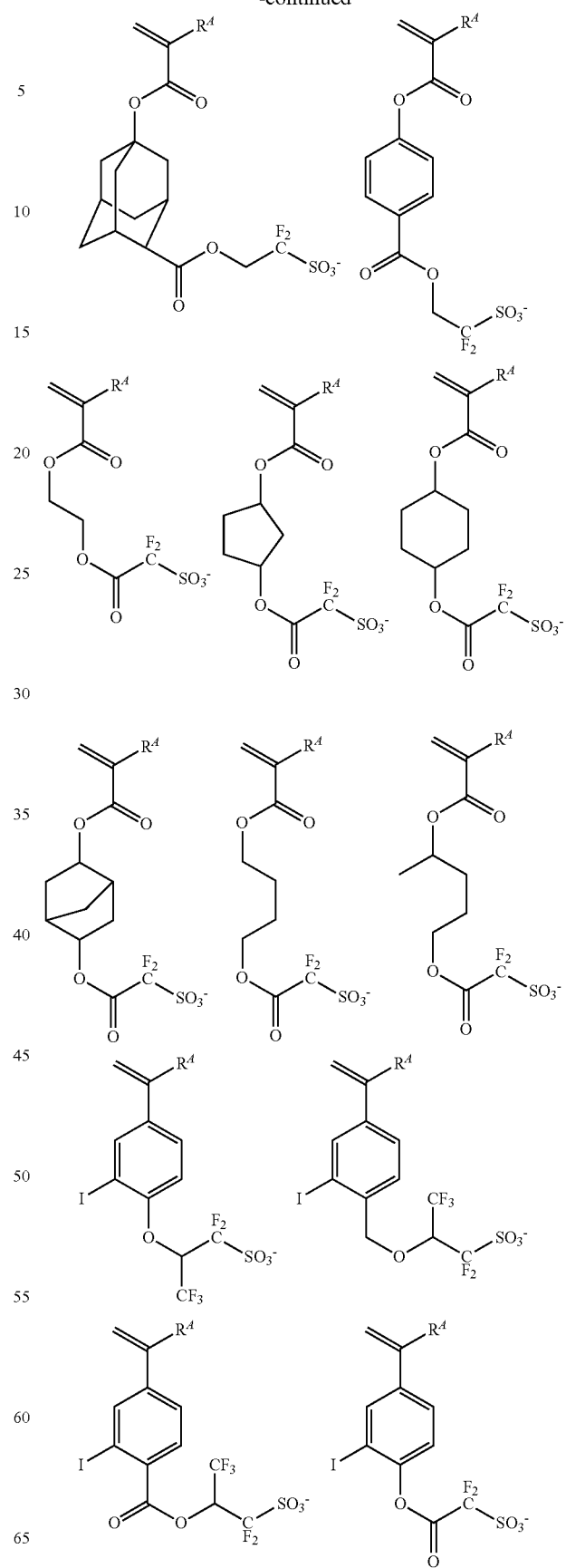

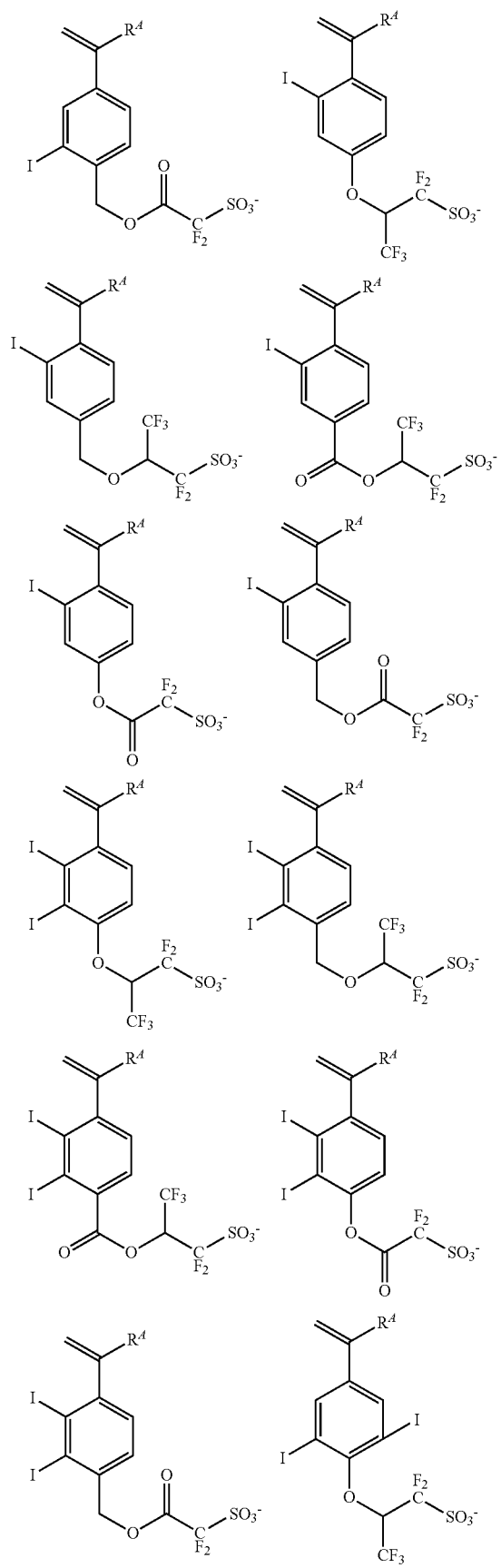
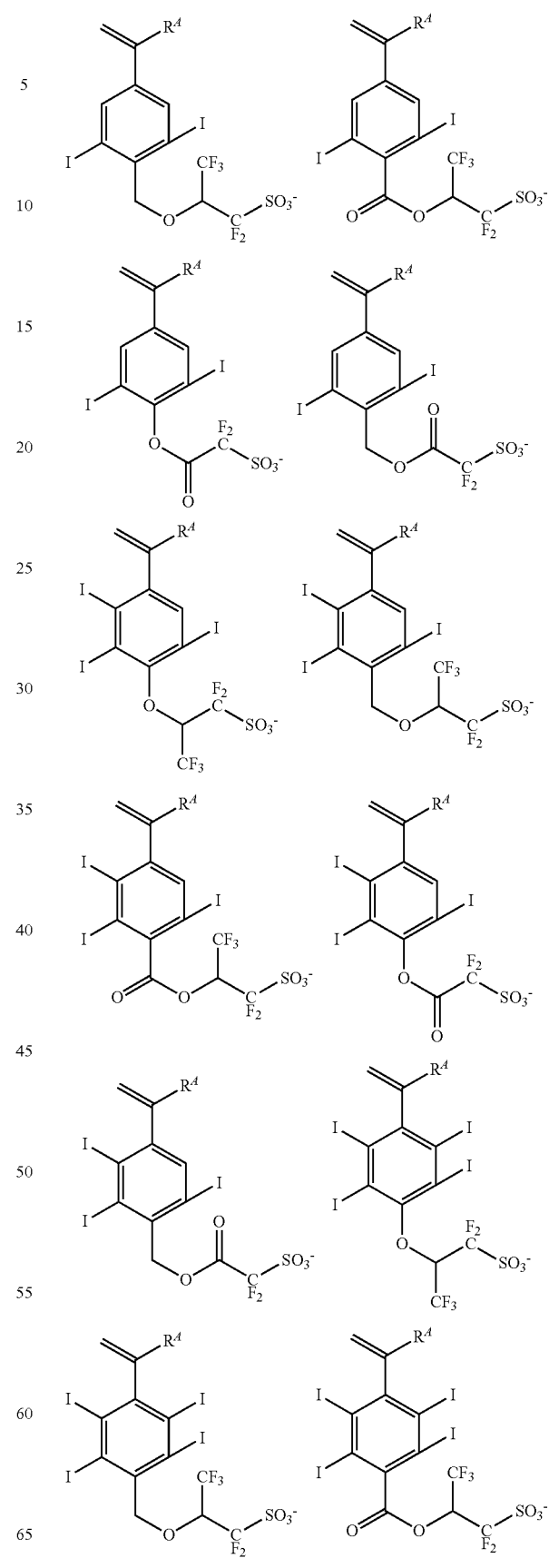

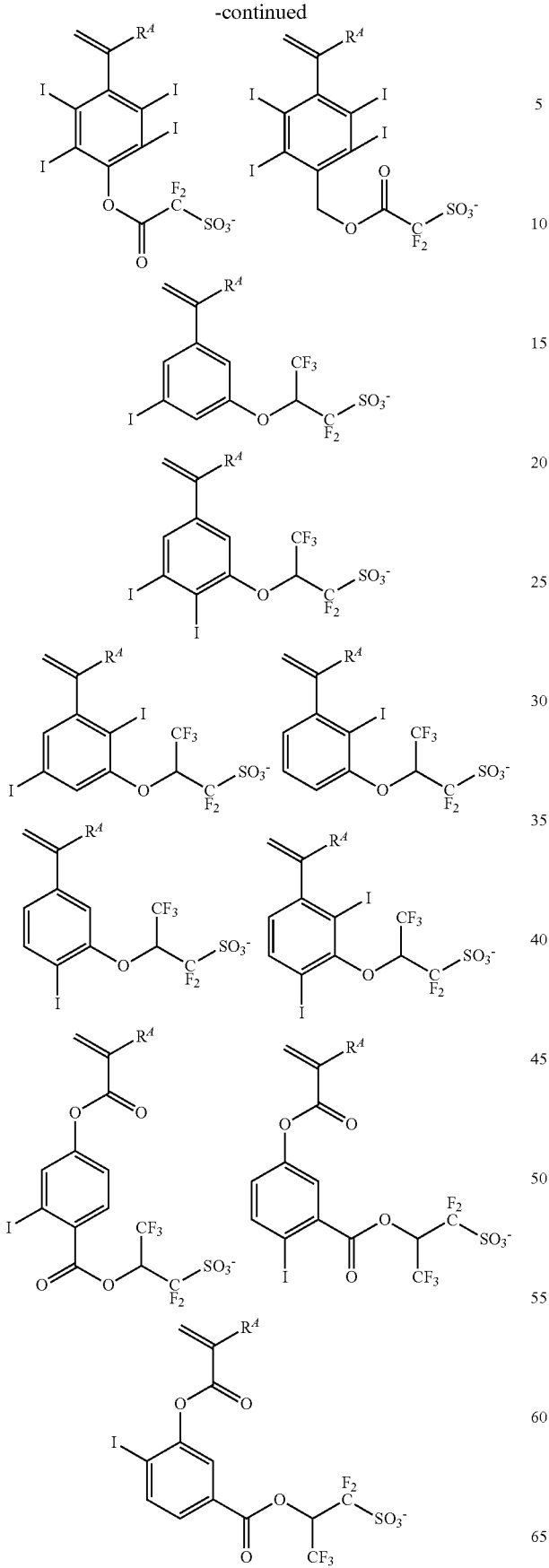

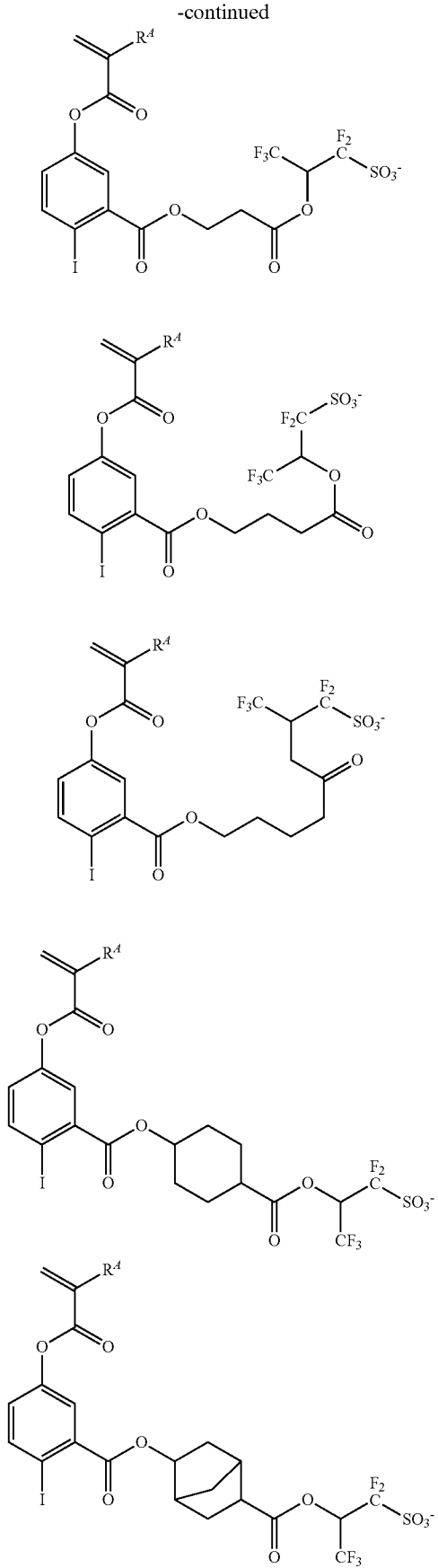
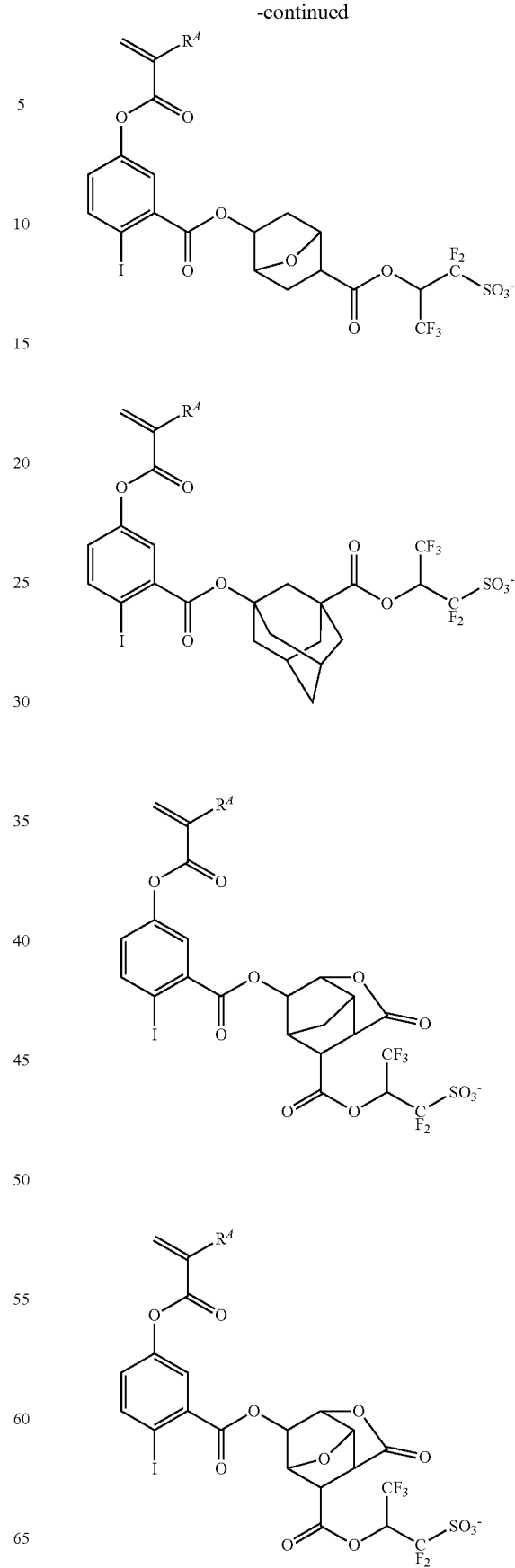

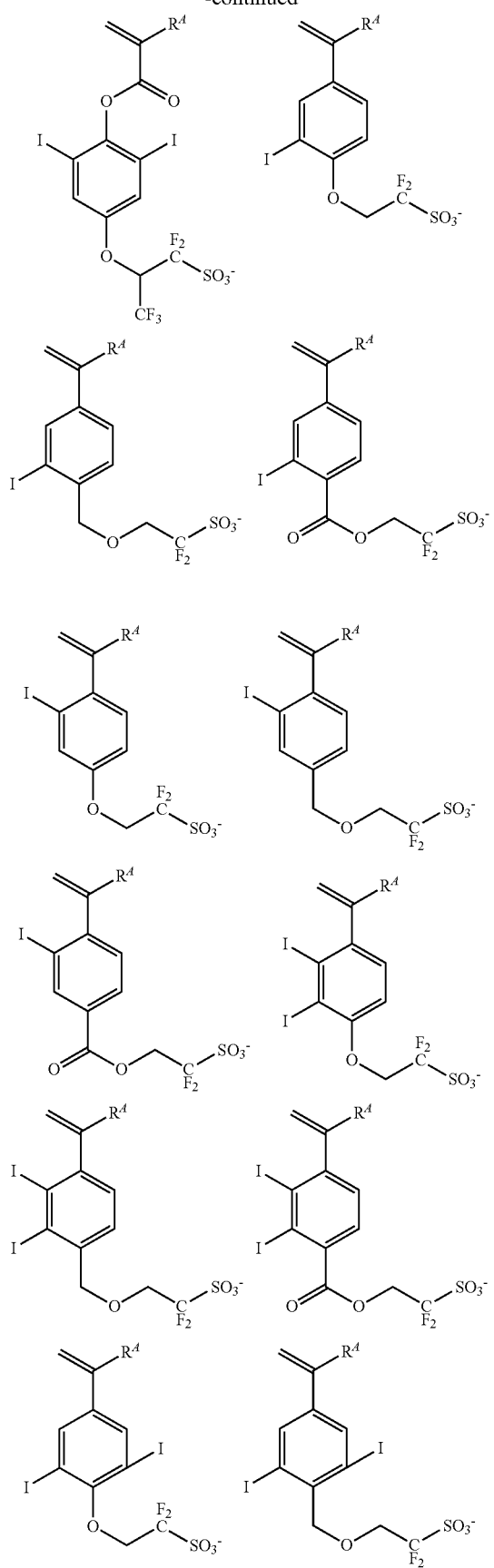
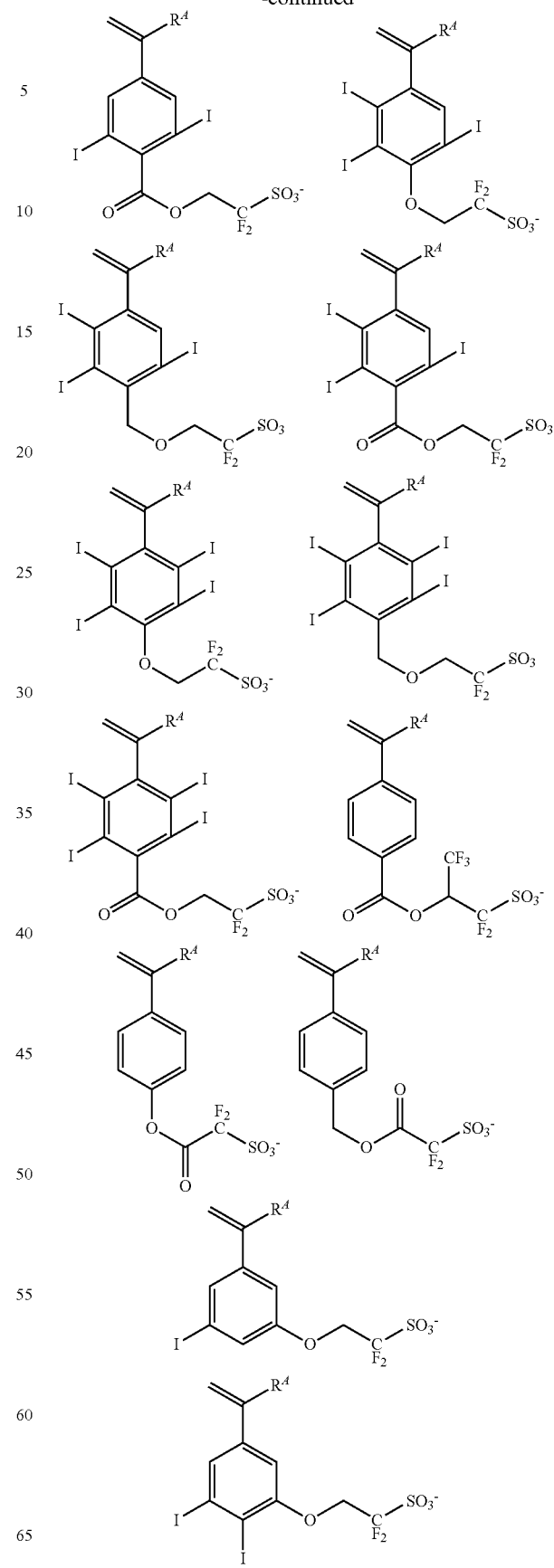

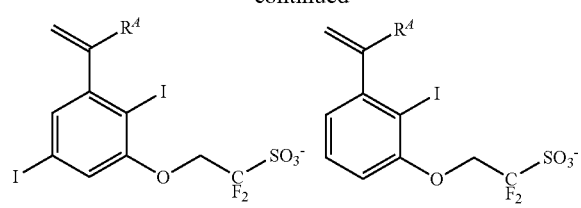
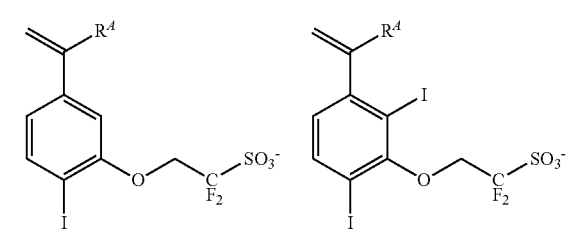
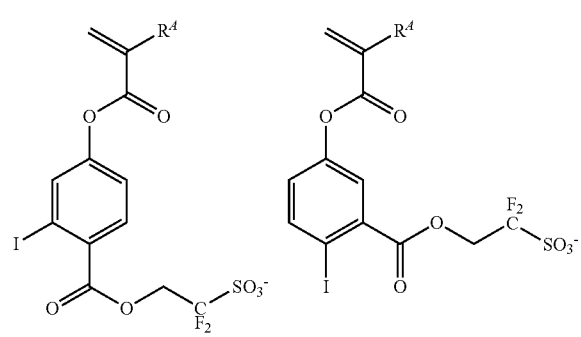
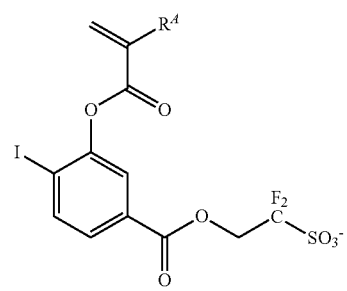
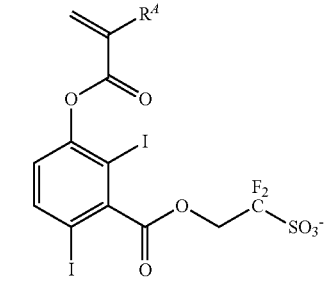
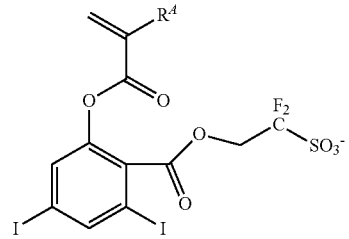
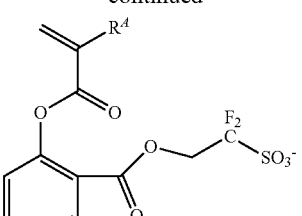
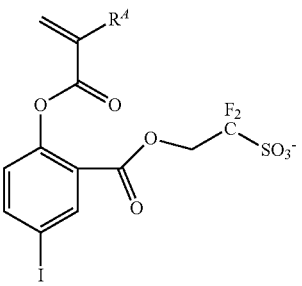
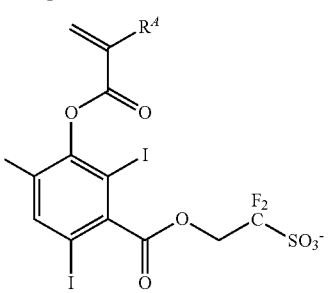
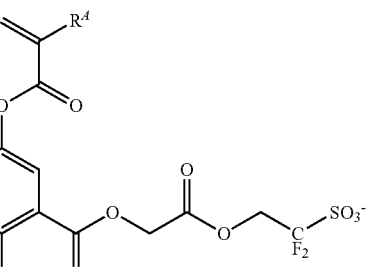
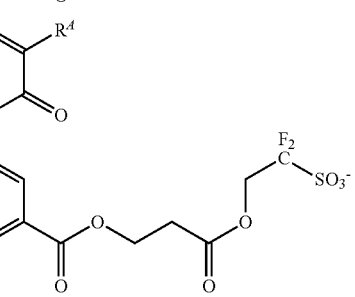
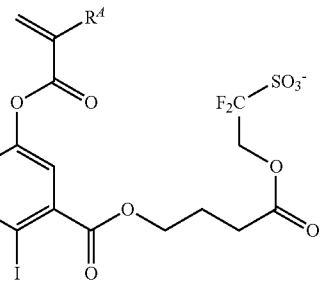

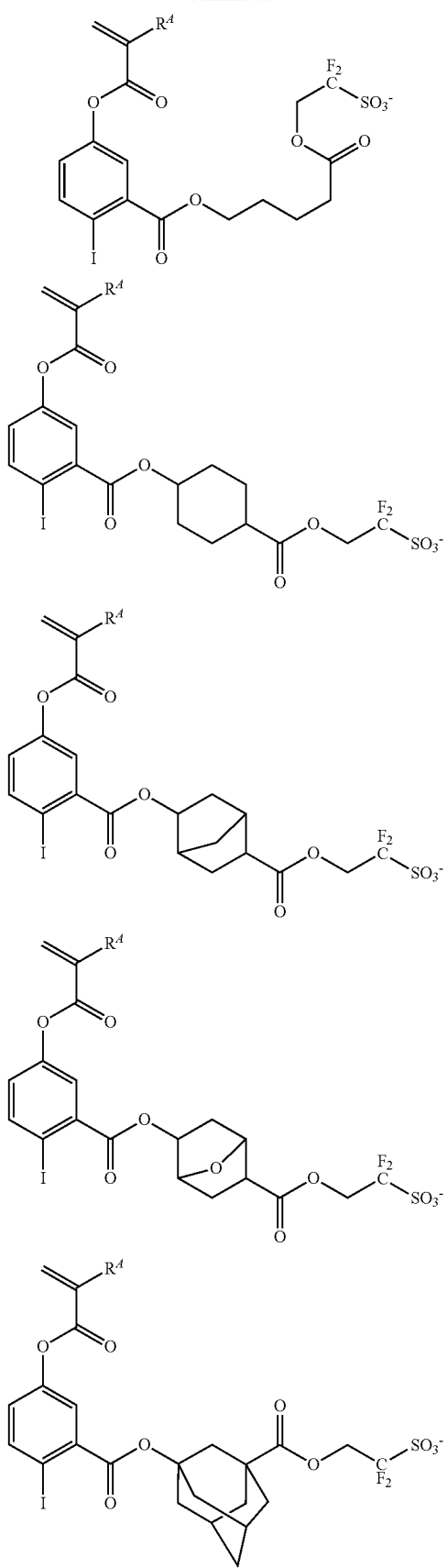
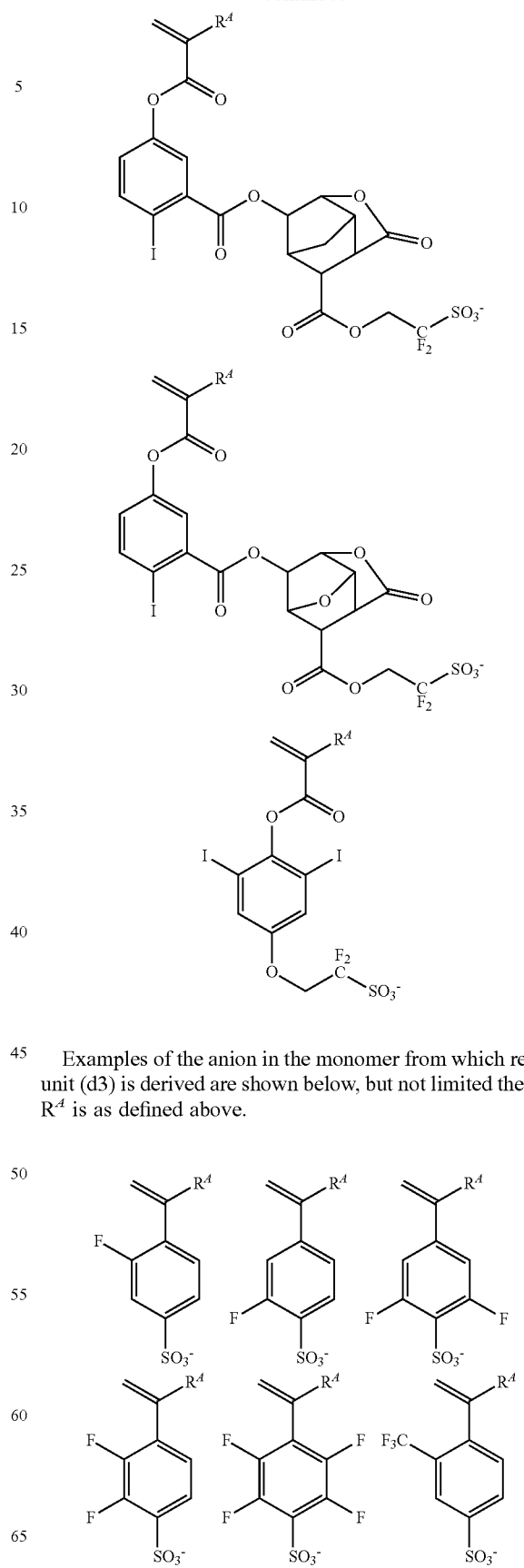
Examples of the anion in the monomer from which repeat unit (d3) is derived are shown below, but not limited thereto. $R^A$ is as defined above.

37
-continued
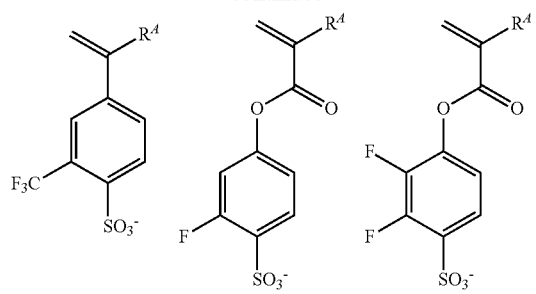
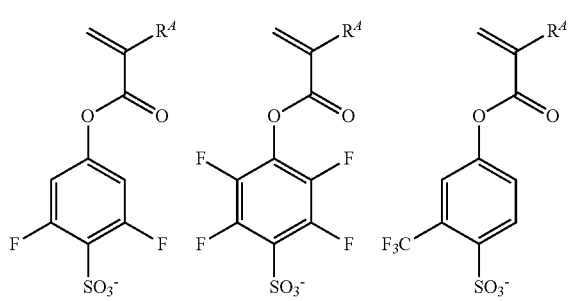
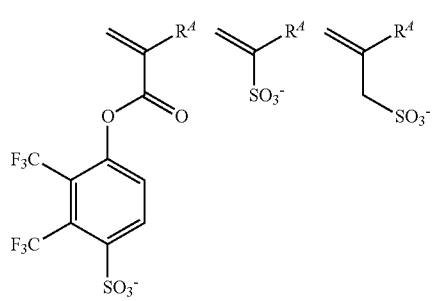
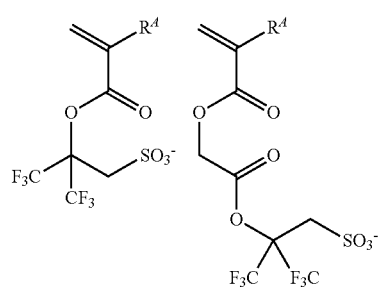
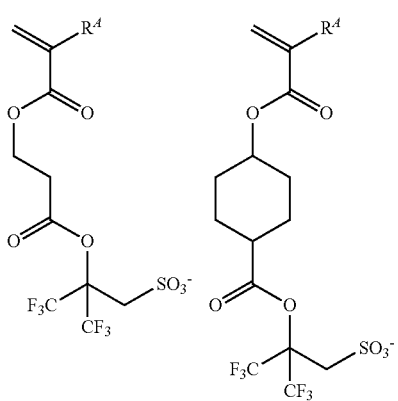
38
-continued
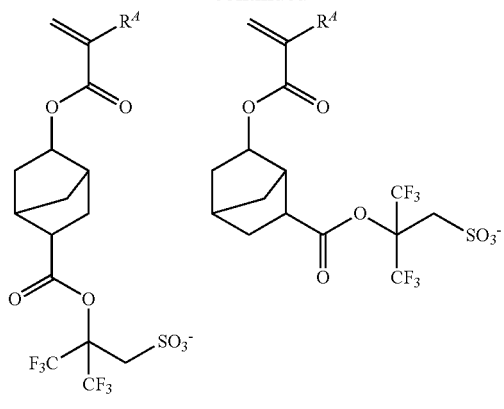
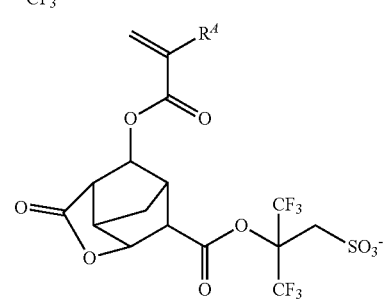
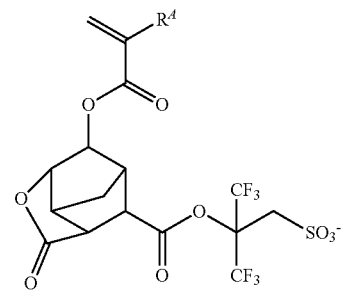
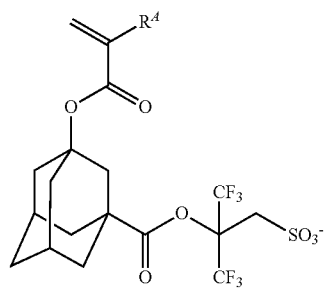
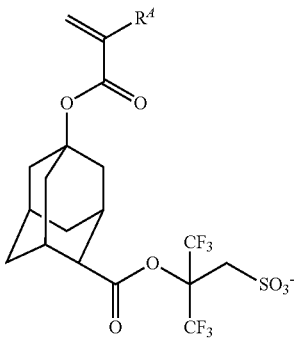

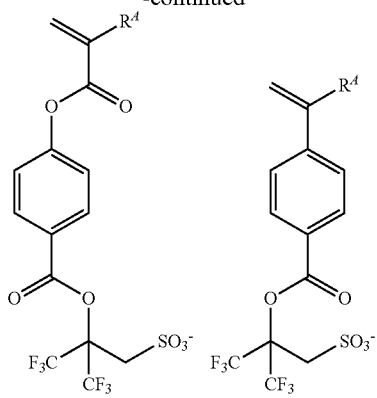

In formulae (d1) to (d3), $R^{21}$ to $R^{28}$ are each independently halogen or a $C_1$-$C_{20}$ hydrocarbyl group which may contain a heteroatom.

Suitable halogen atoms include fluorine, chlorine, bromine and iodine.

The $C_1$-$C_{20}$ hydrocarbyl group represented by $R^{21}$ to $R^{28}$ may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl and adamantyl; $C_2$-$C_{20}$ alkenyl groups such as vinyl, propenyl, butenyl and hexenyl; $C_2$-$C_{29}$ alkynyl groups such as ethynyl, propynyl and butynyl; $C_3$-$C_{20}$ cyclic unsaturated aliphatic hydrocarbyl groups such as cyclohexenyl and norbornenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethyhyaphthyl, n-propylnaphthyl, isopropylnaphthyl, n-butylnaphthyl, isobutylnaphthyl, sec-butylnaphthyl and tert-butylnaphthyl, $C_7$-$C_{20}$ aralkyl groups such as benzyl and phenethyl; and combinations thereof.

Also included are substituted forms of the hydrocarbyl groups in which some or all of the hydrogen atoms are substituted by a moiety containing a heteroatom such as oxygen, sulfur, nitrogen or halogen, or some constituent —$CH_2$— is replaced by a moiety containing a heteroatom such as oxygen, sulfur or nitrogen, so that the group may contain a hydroxy moiety, fluorine, chlorine, bromine, iodine, cyano moiety, nitro moiety, carbonyl moiety, ether bond, ester bond, sulfonic acid ester bond, carbonate bond, lactone ring, sultone ring, carboxylic anhydride or haloalkyl moiety.

A pair of $R^{23}$ and $R^{24}$, or $R^{26}$ and $R^{27}$ may bond together to form a ring with the sulfur atom to which they are attached. Preferred are those rings of the structure shown below.

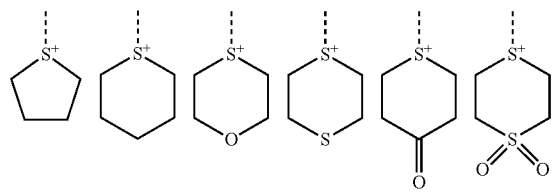

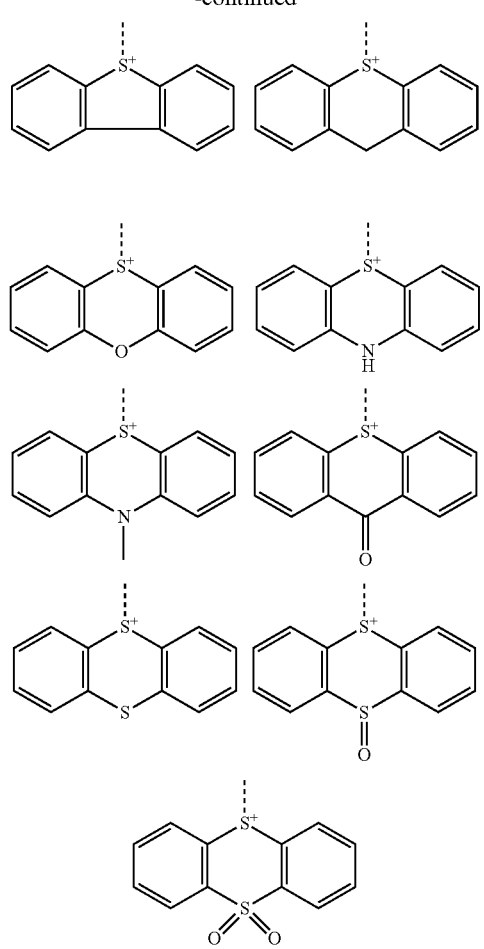

Herein, the broken line denotes a point of attachment to $R^{25}$ or $R^{28}$.

Examples of the cation in the repeat units (d2) and (d3) are shown below, but not limited thereto.

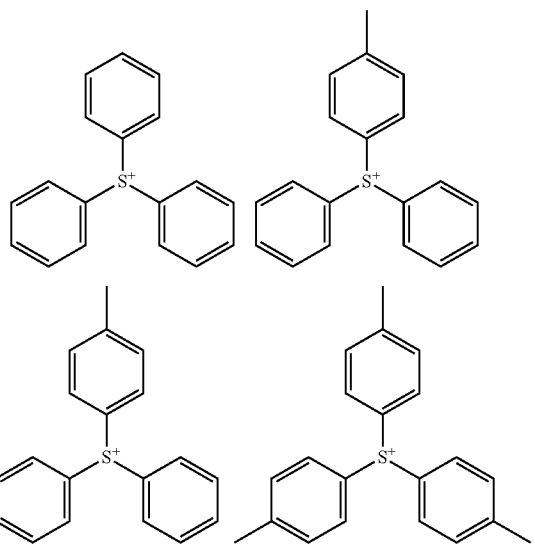

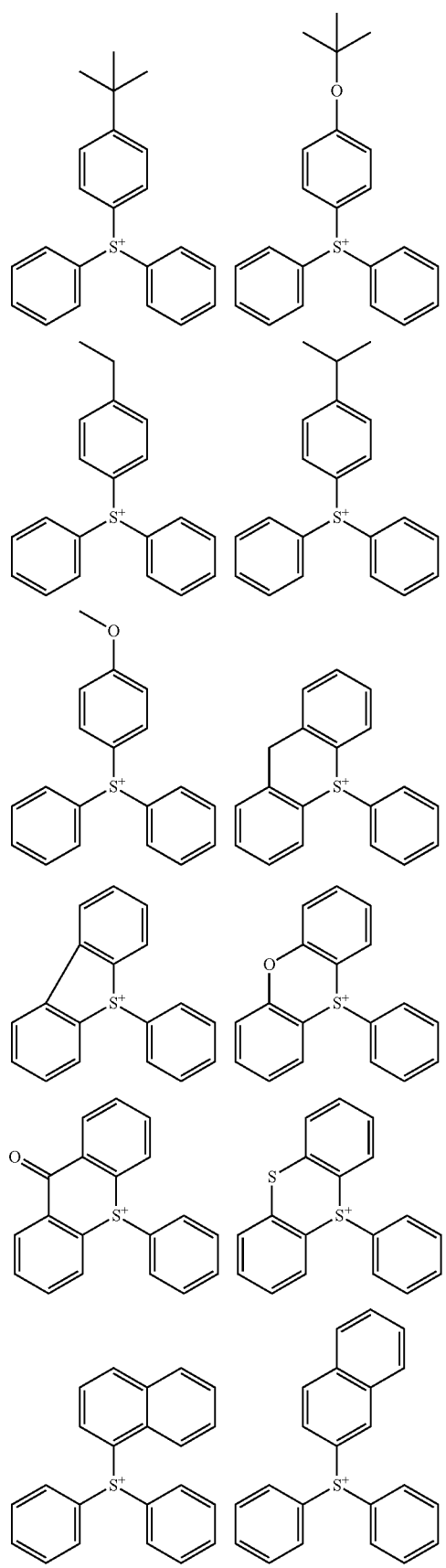
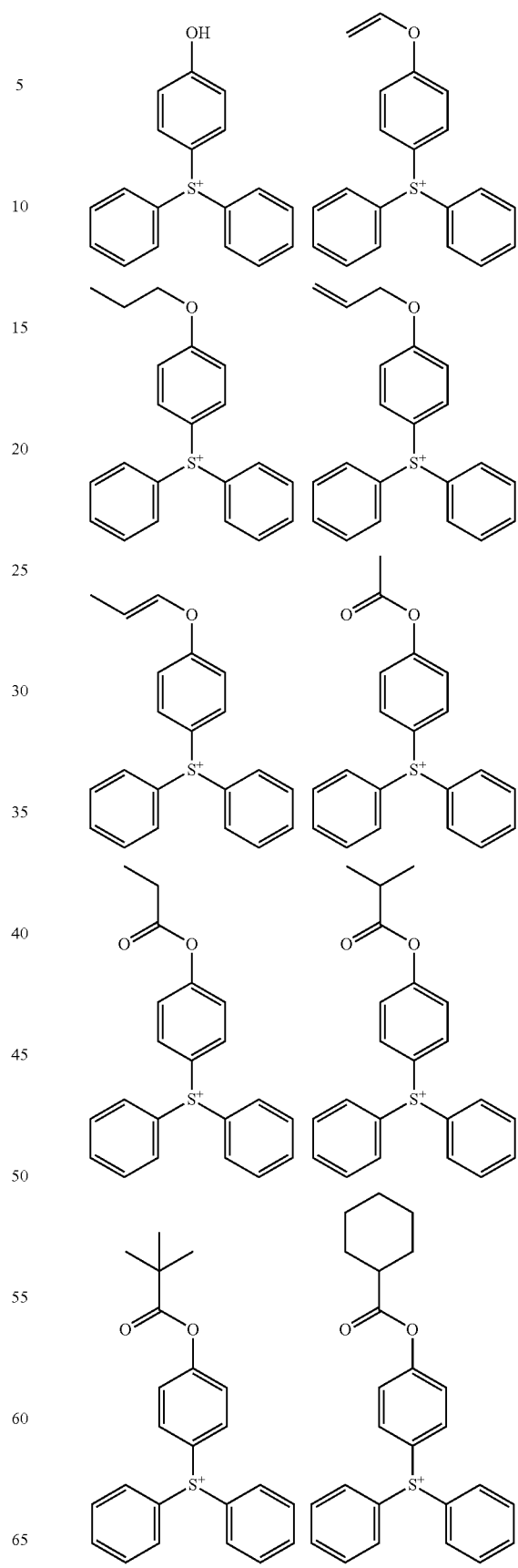

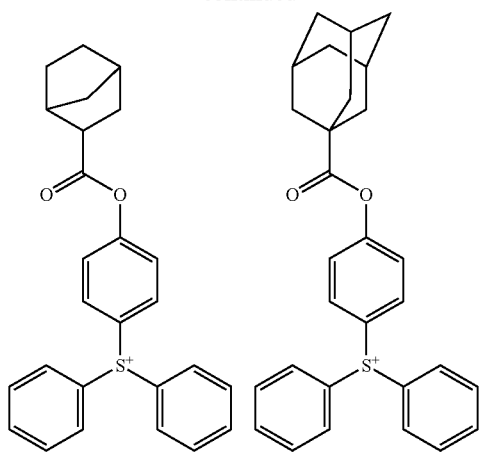
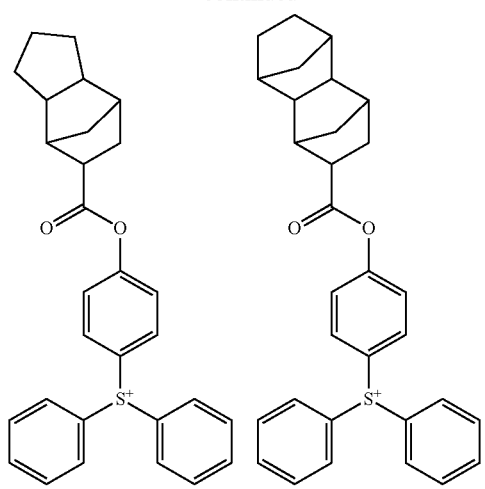
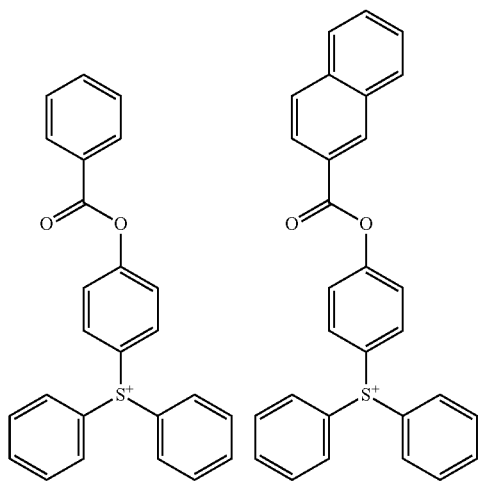
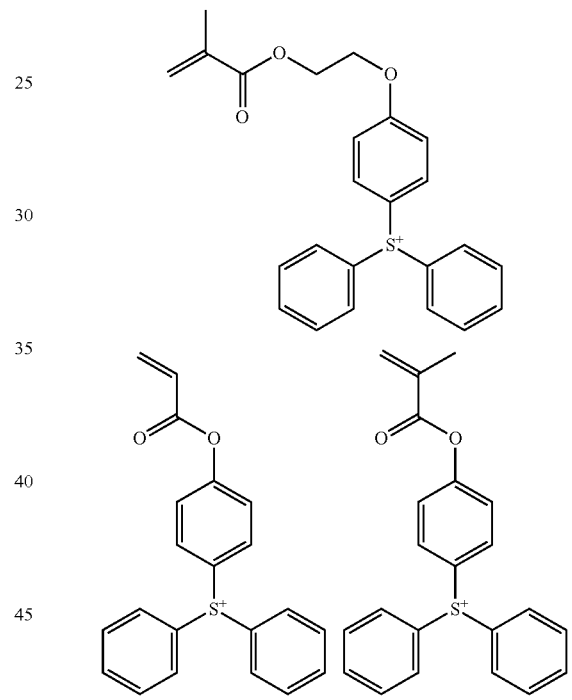
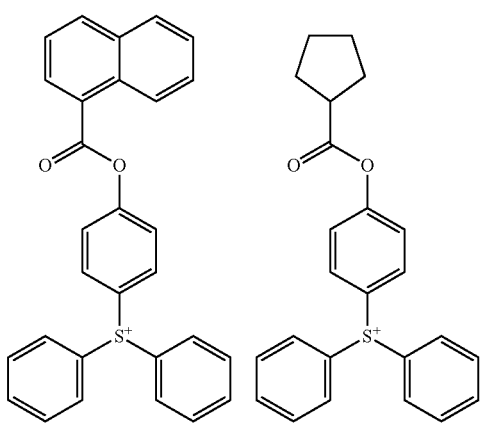
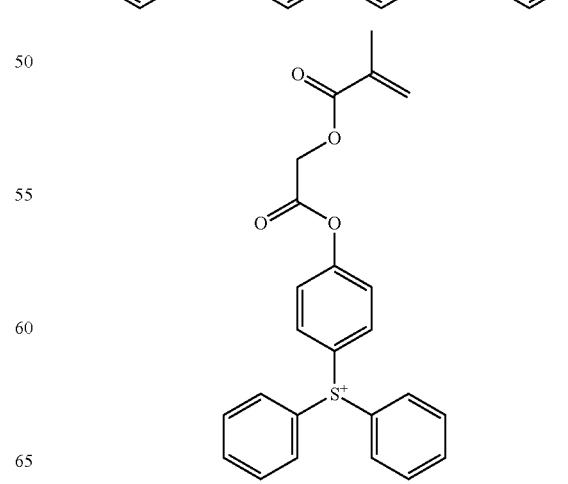

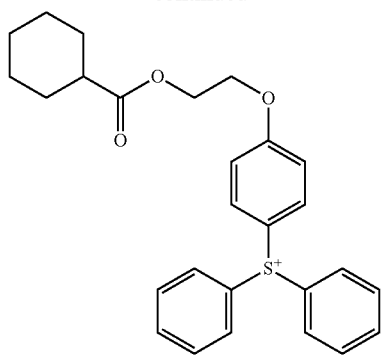
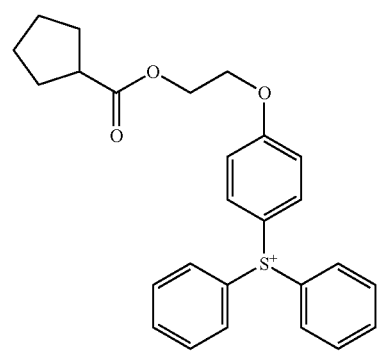
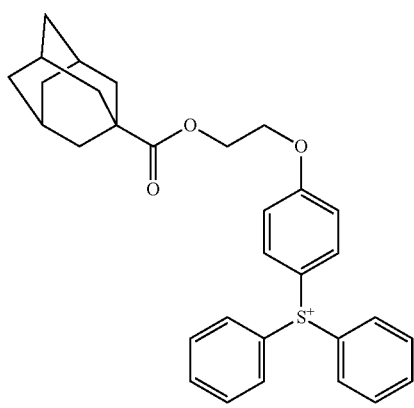
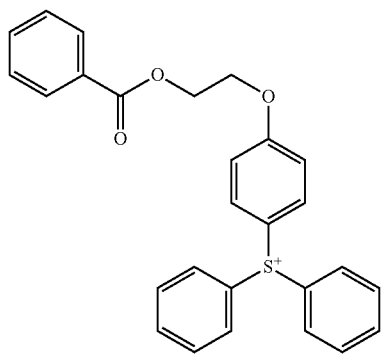
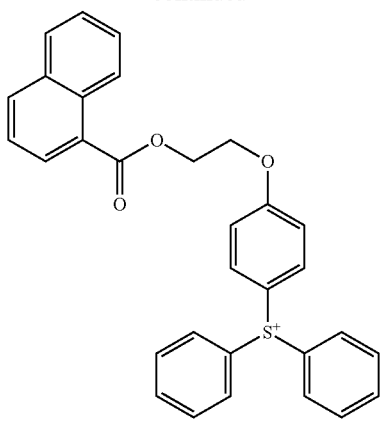
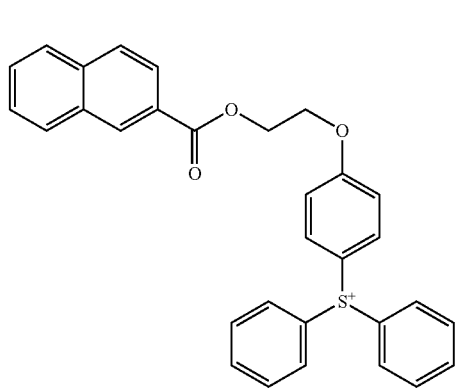
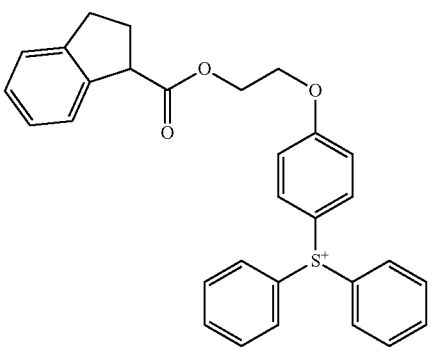
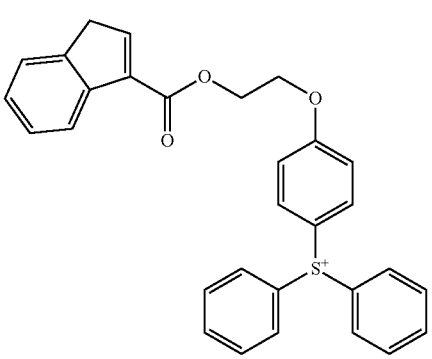

47
-continued
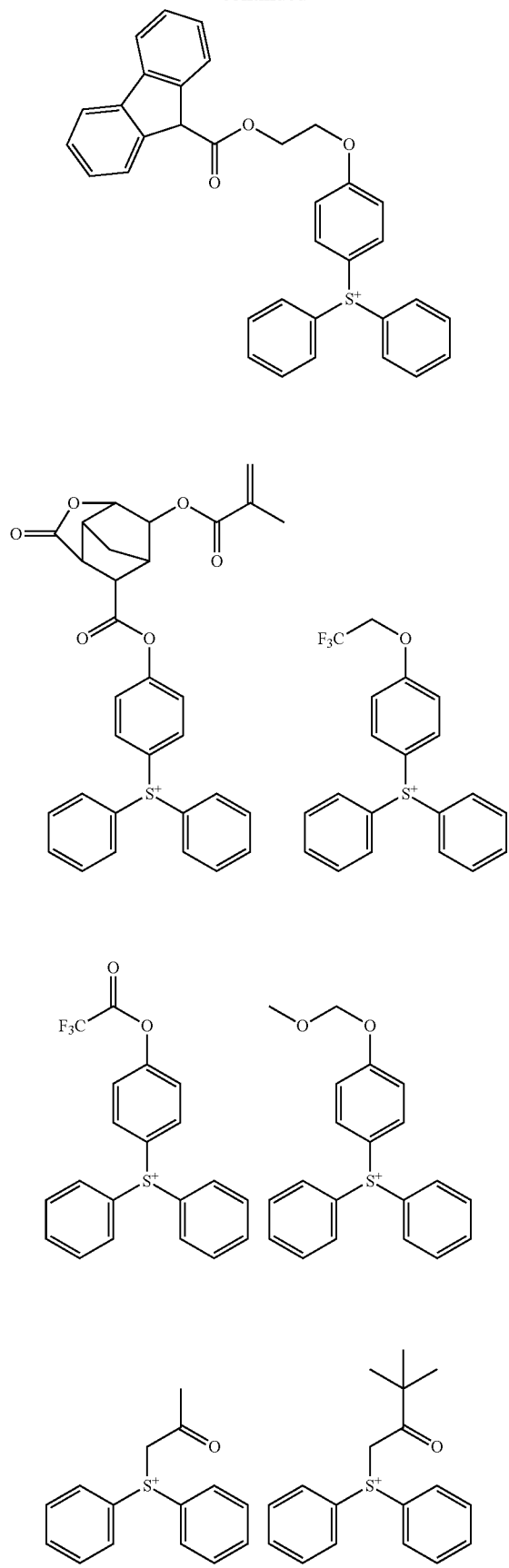
48
-continued
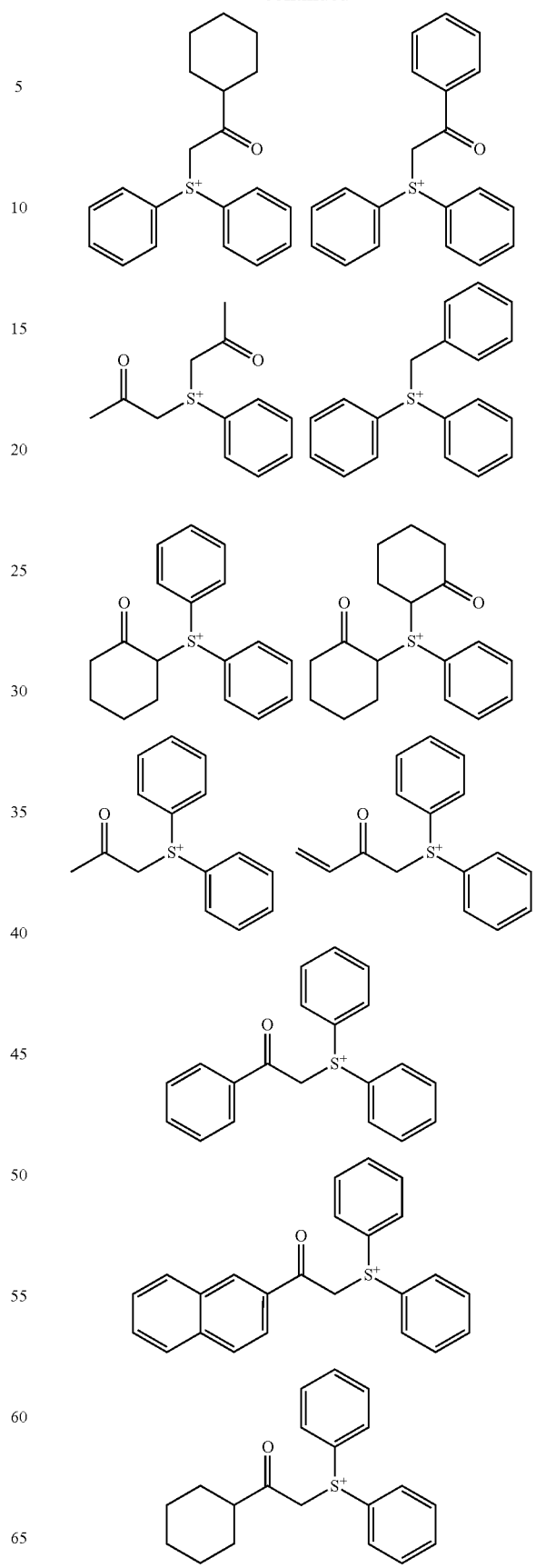

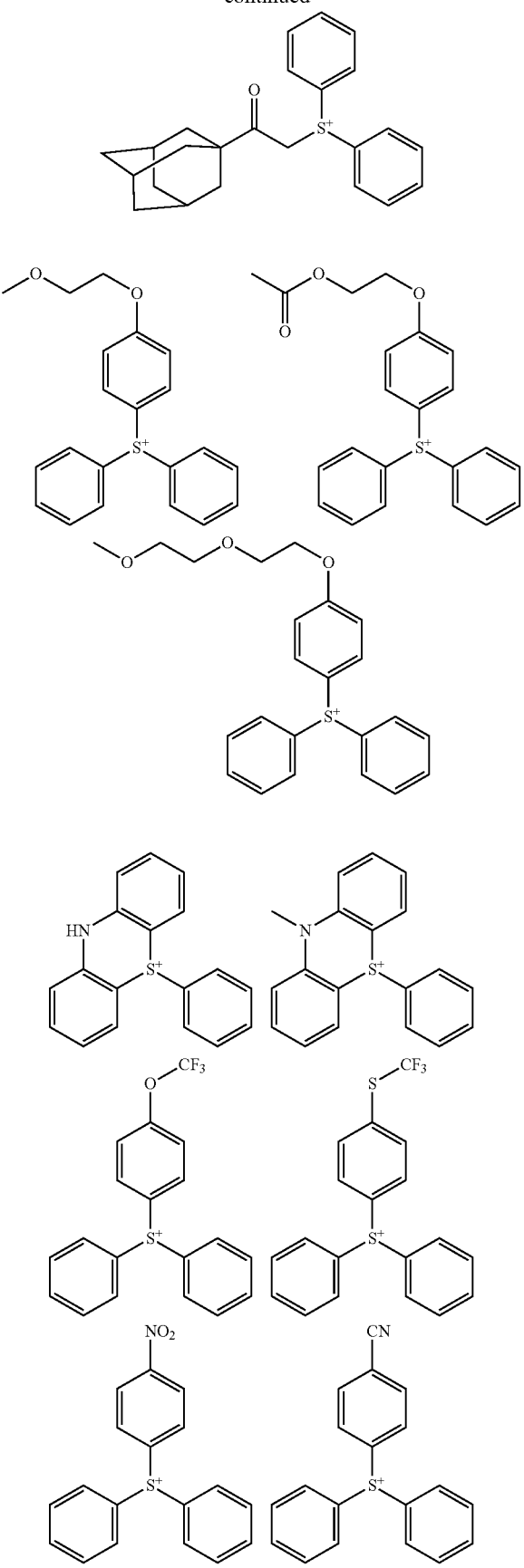
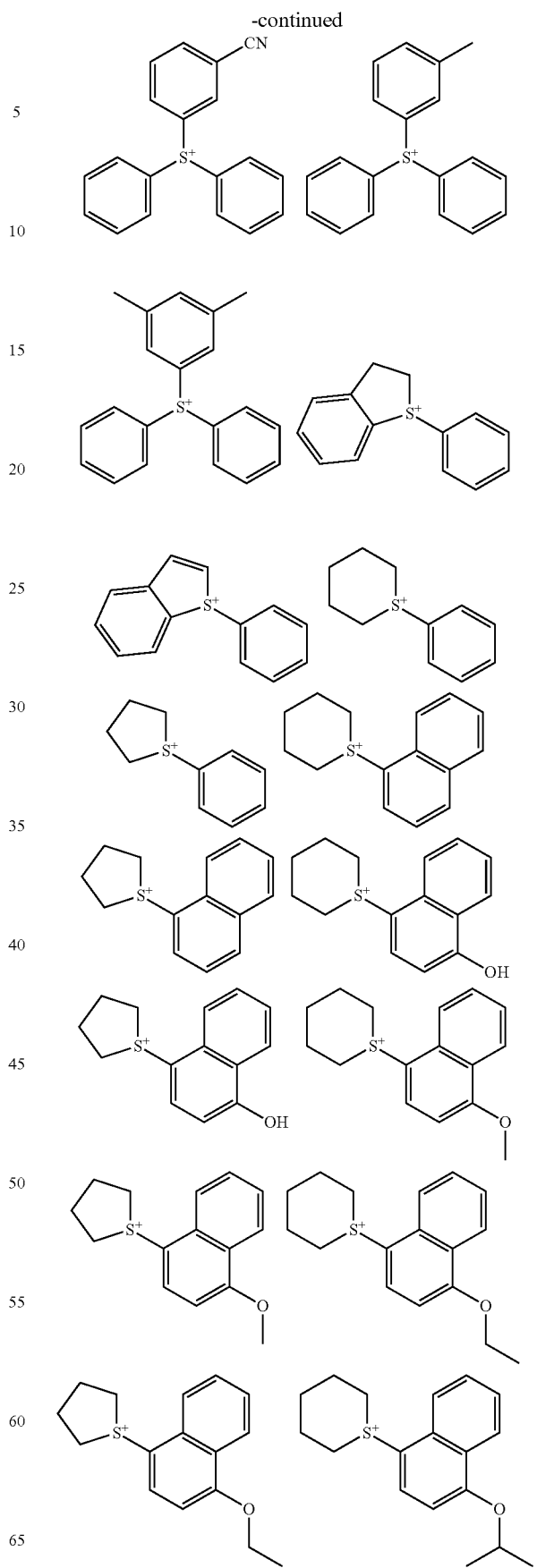

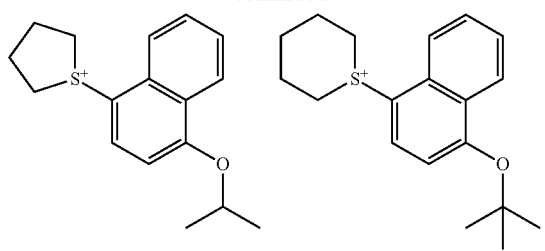
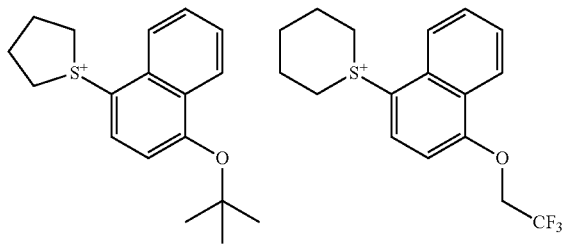
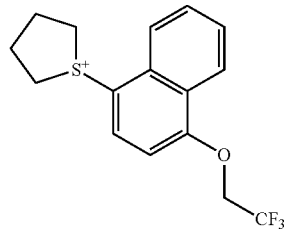
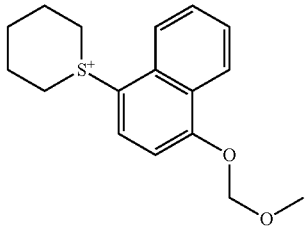
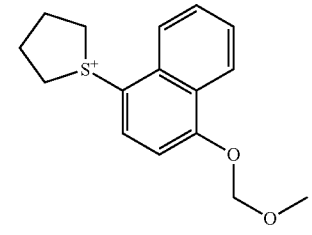
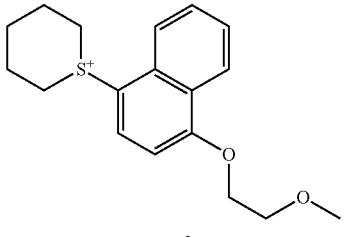
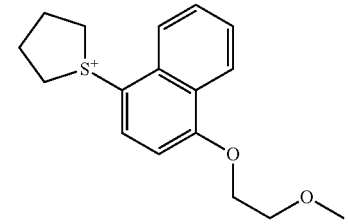
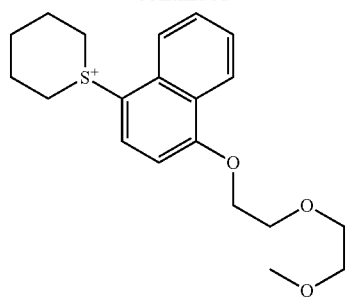
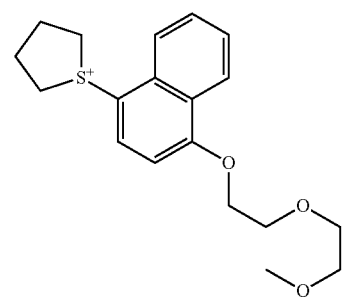
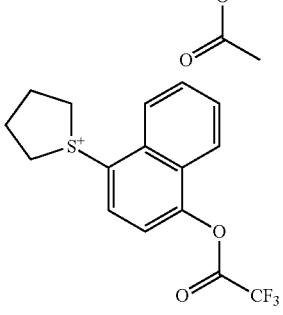
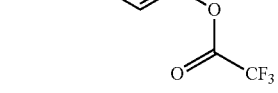
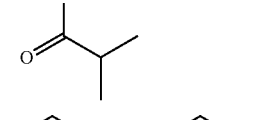
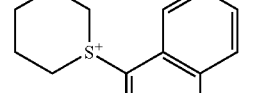
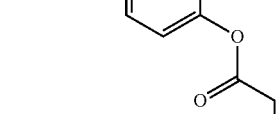

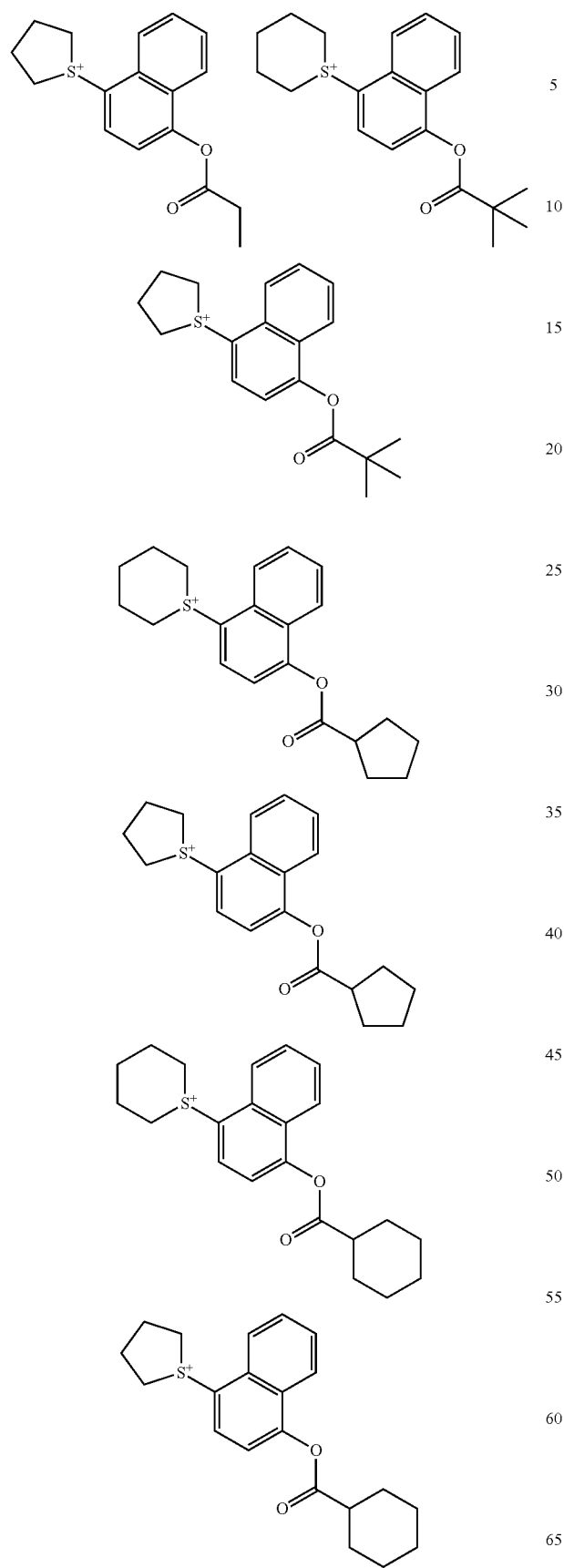
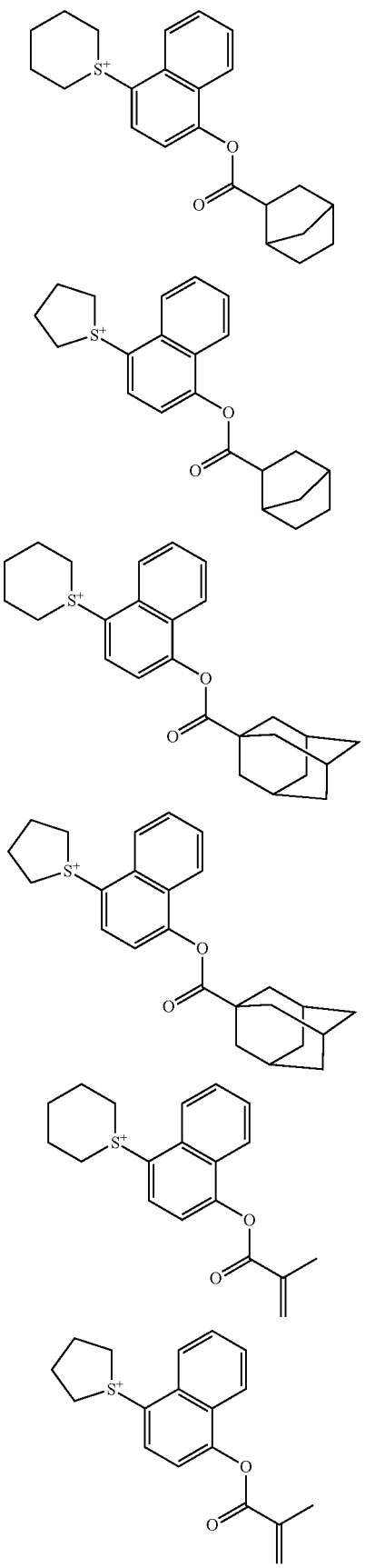

55
-continued
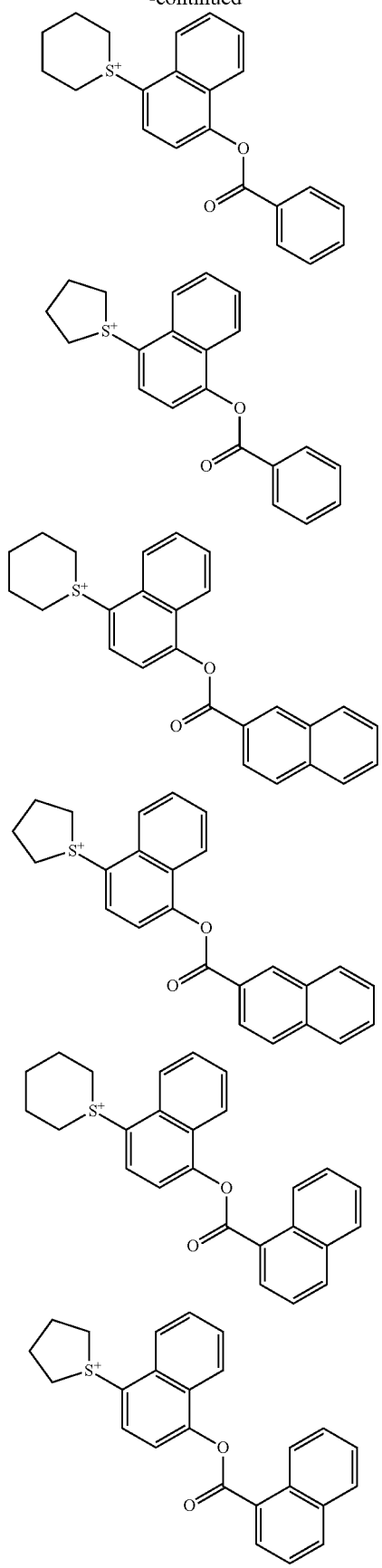
56
-continued
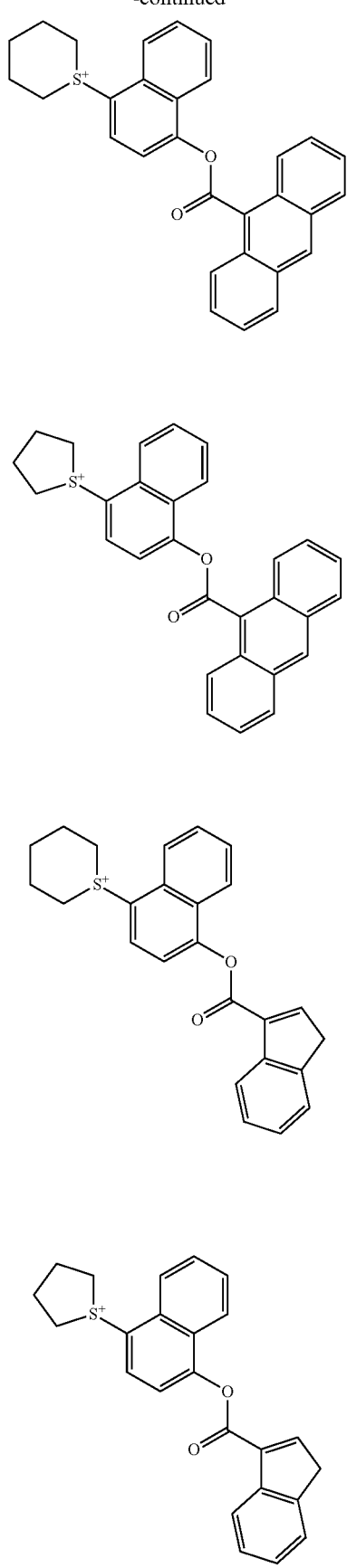

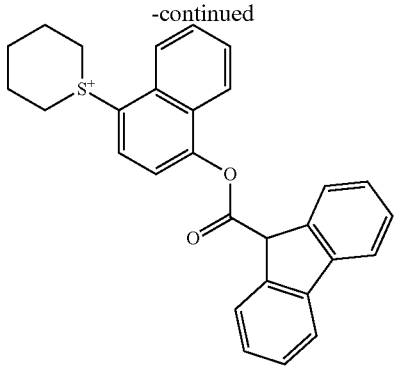
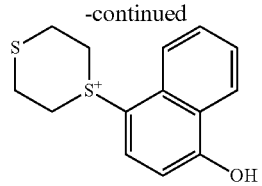
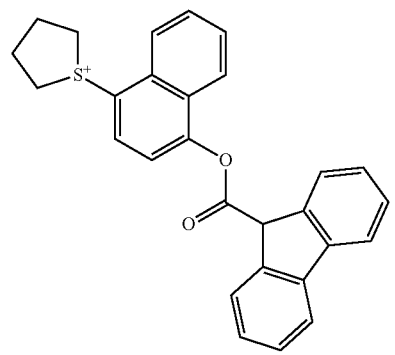
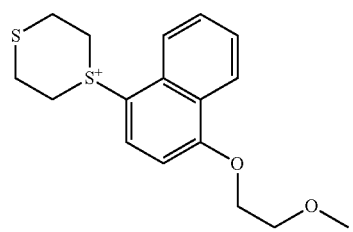
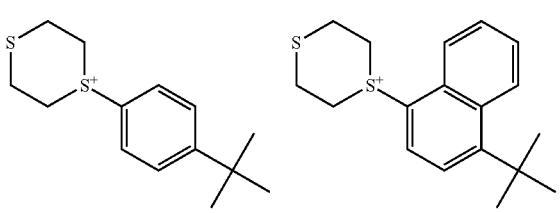
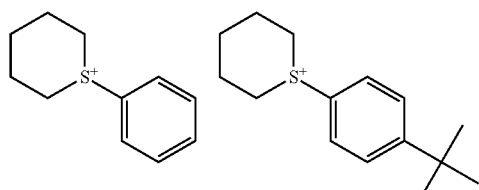
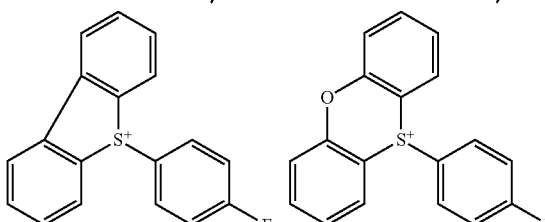
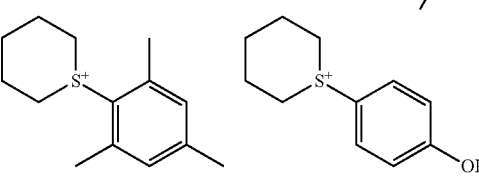
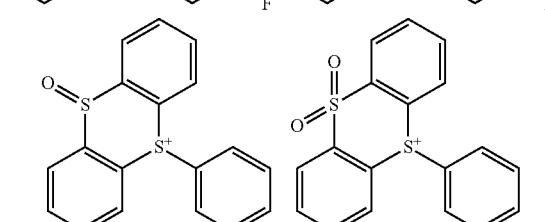
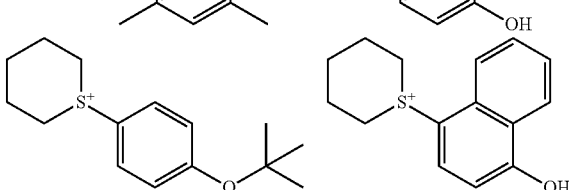
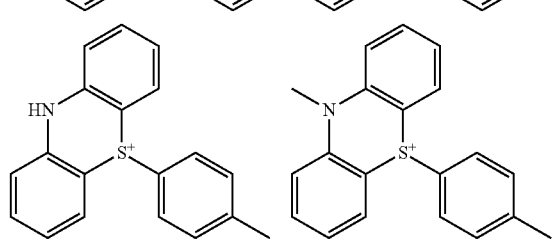
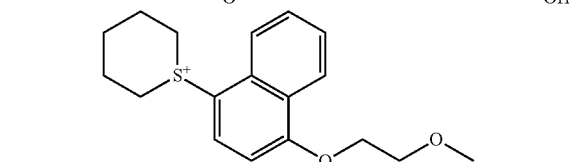
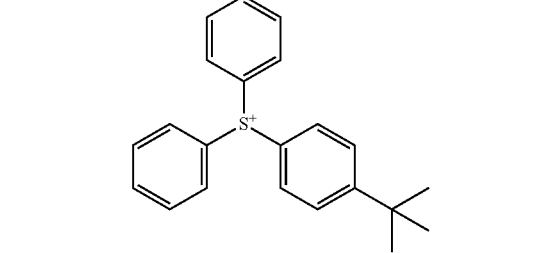

59
-continued
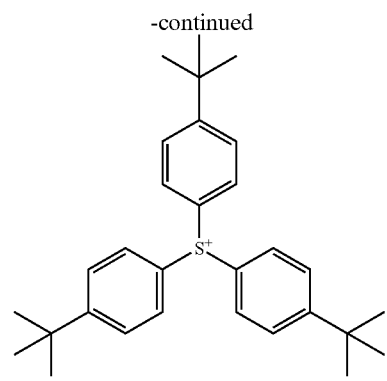
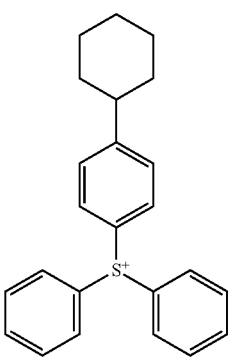
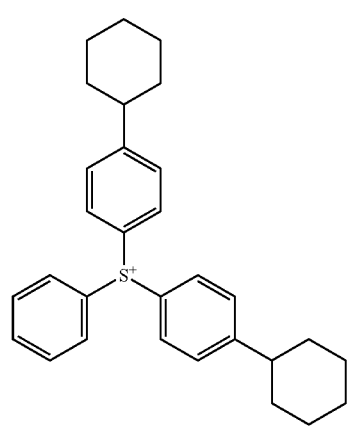
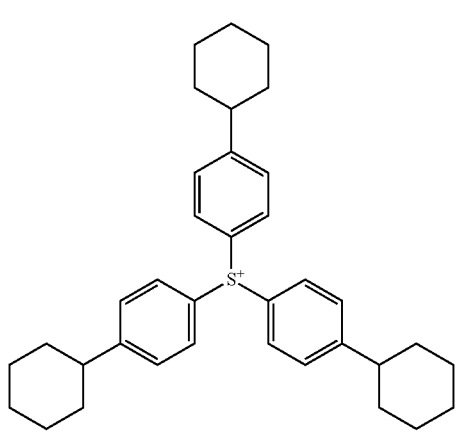
60
-continued
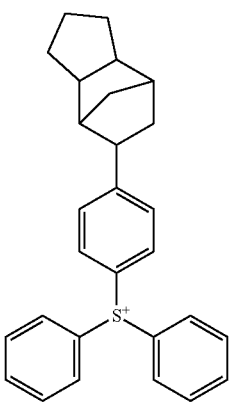
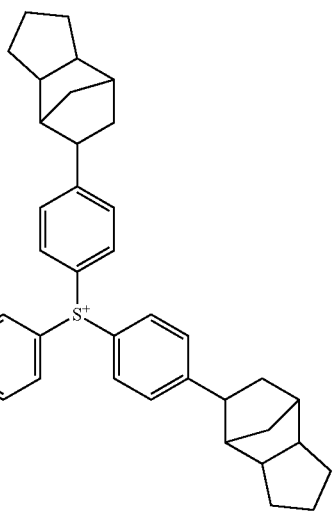

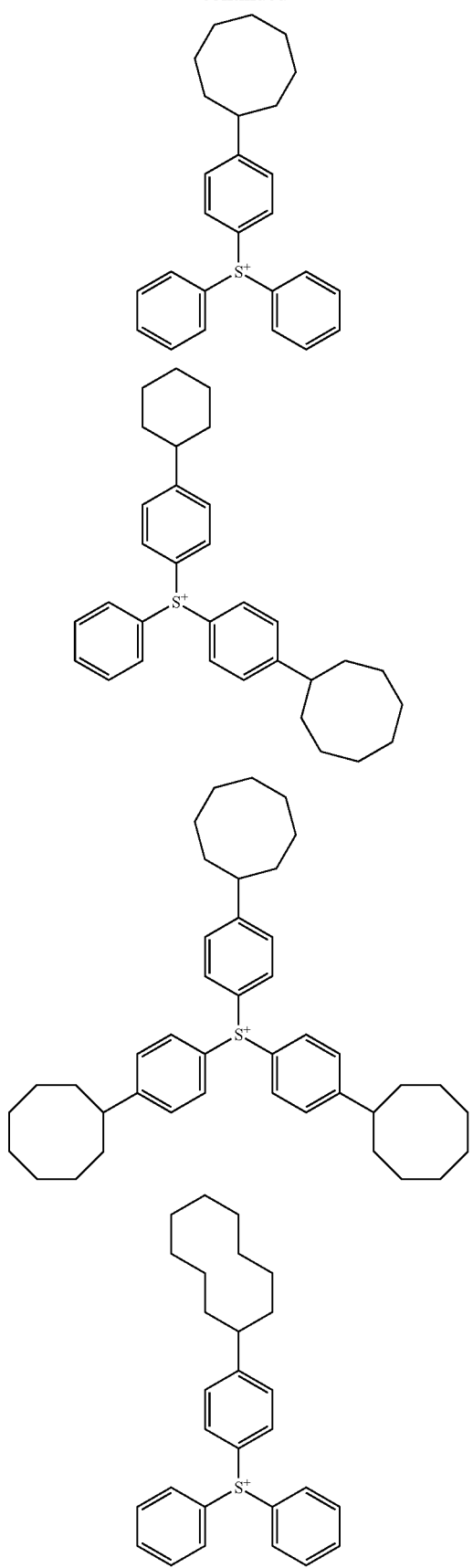
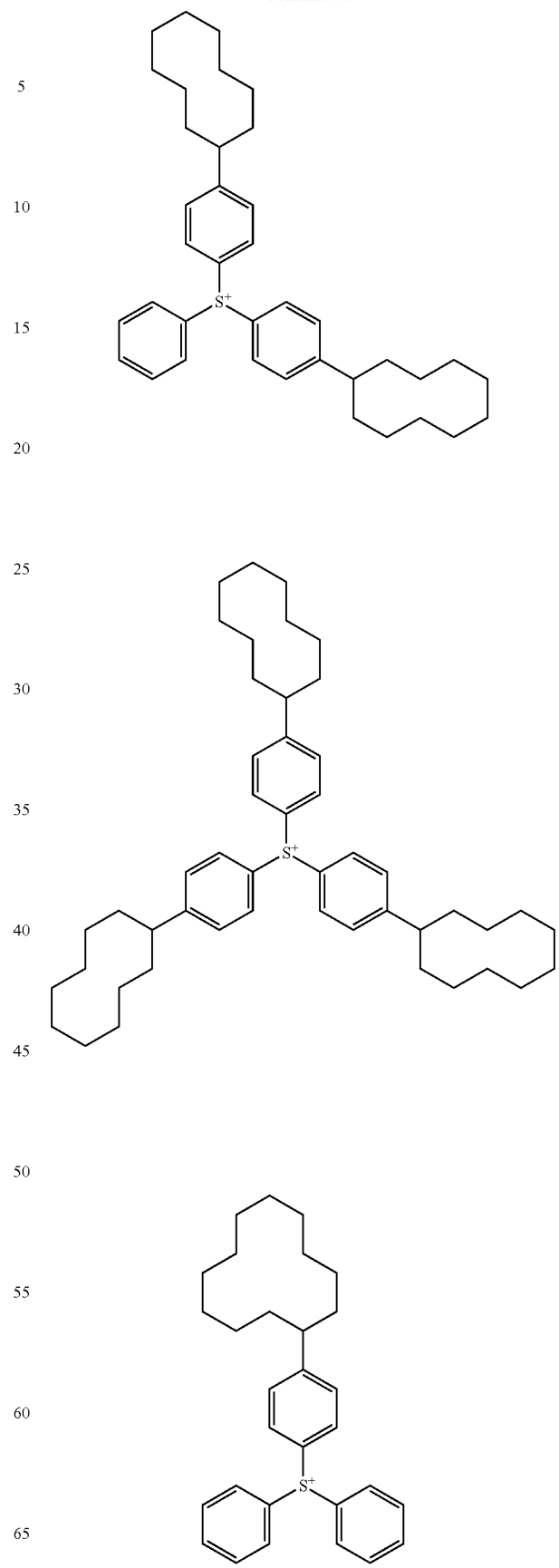

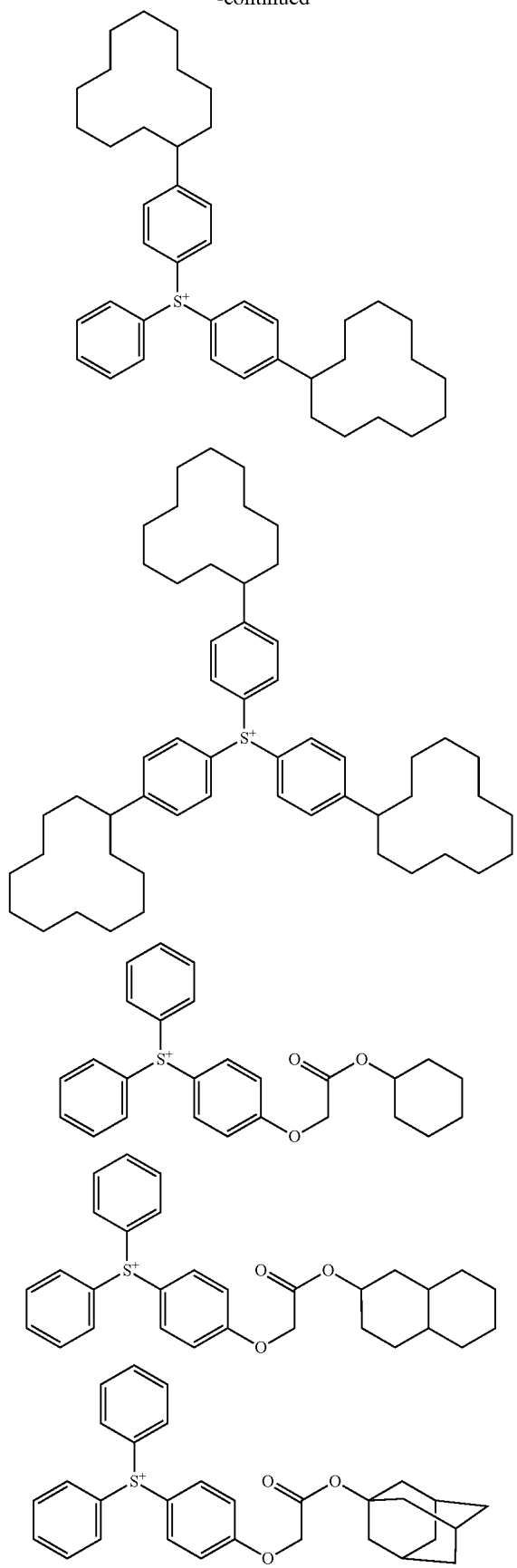
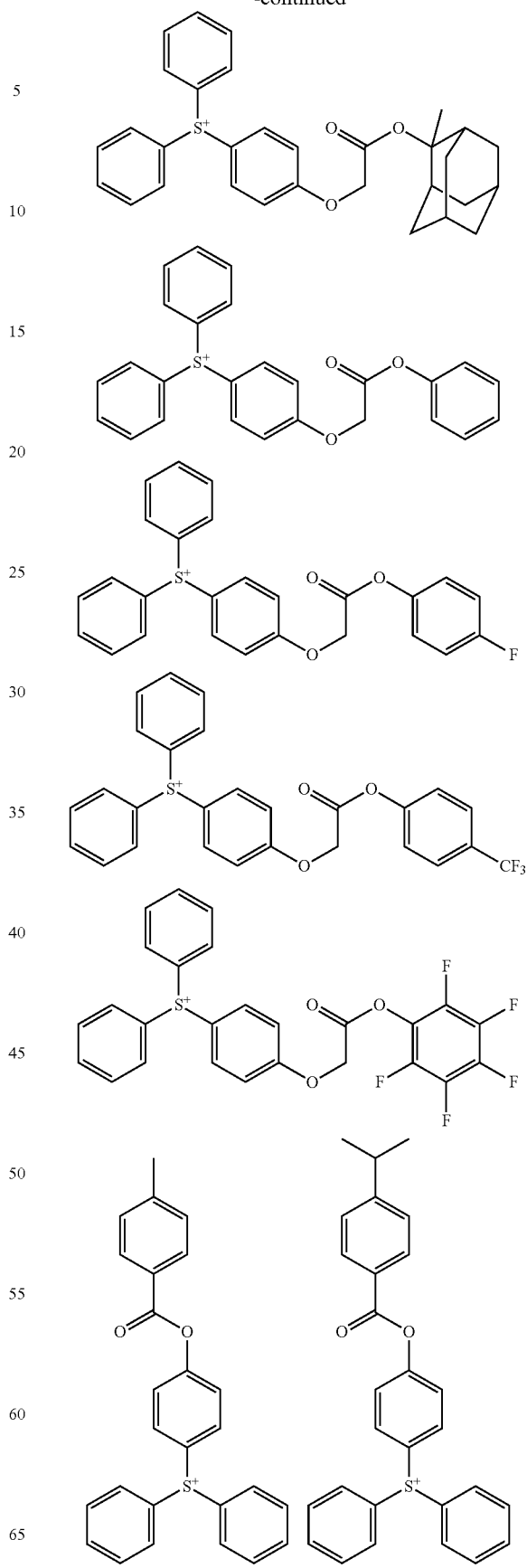

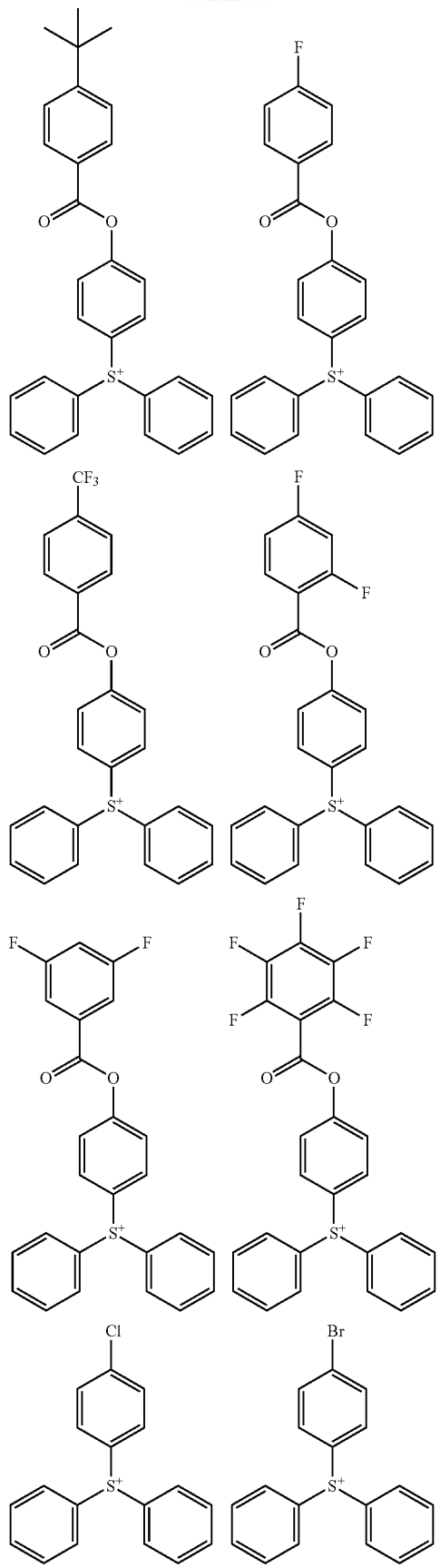
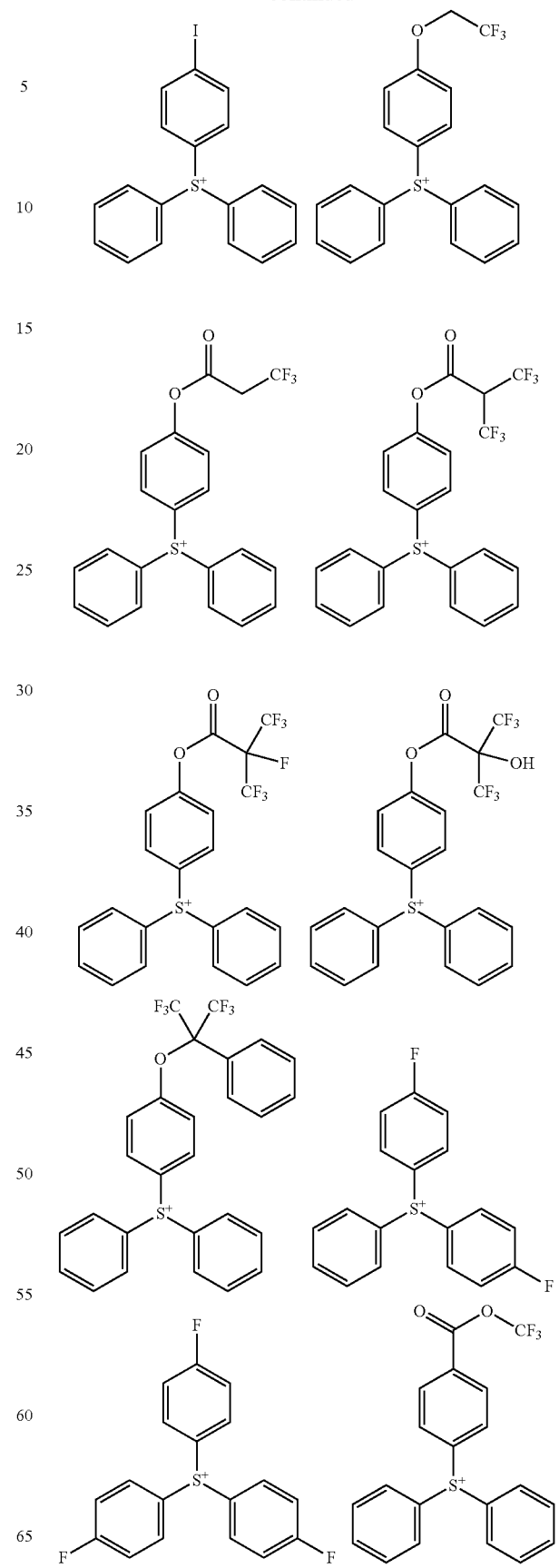

67
-continued
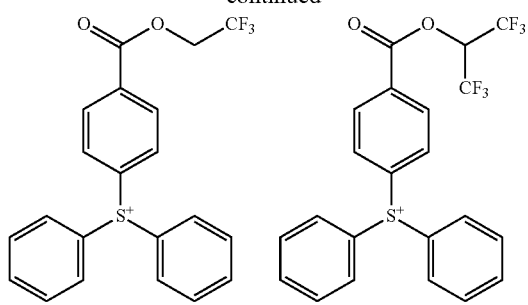
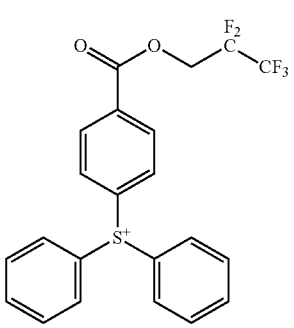
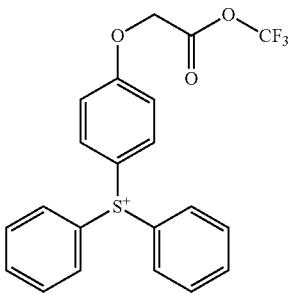
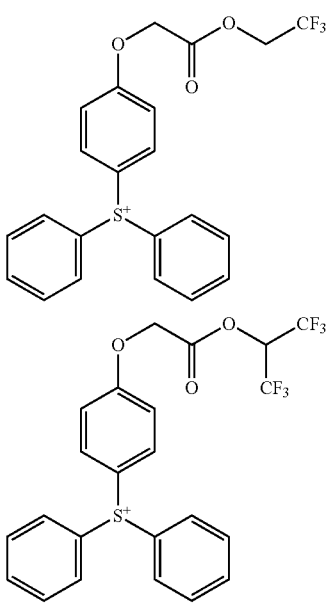
68
-continued
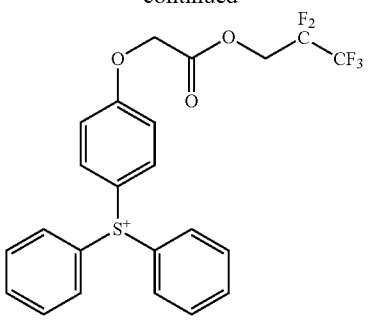
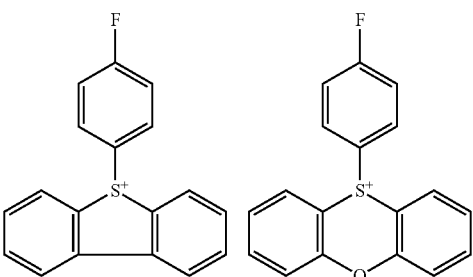
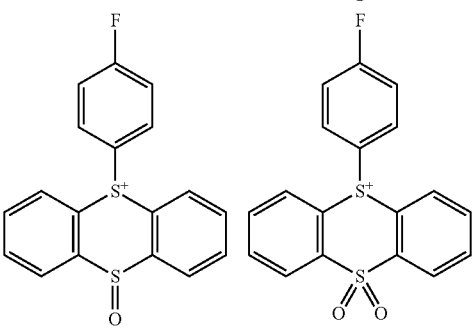
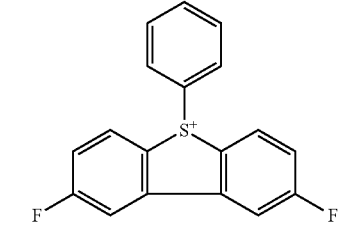
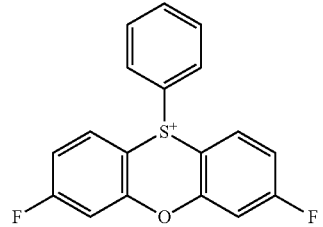
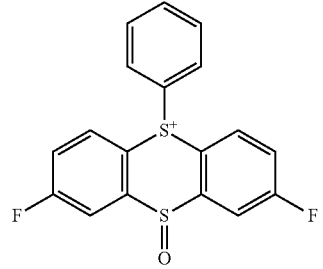

-continued
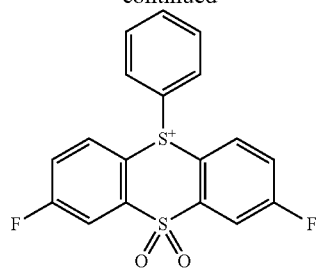
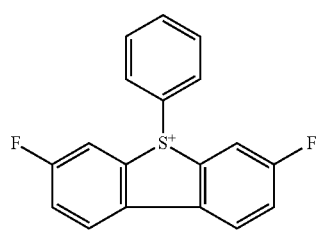
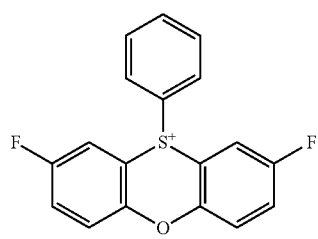
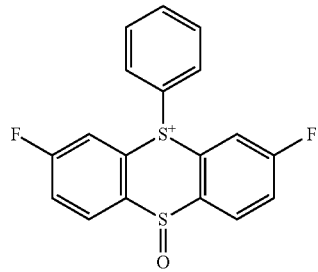
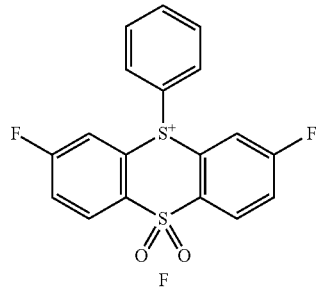
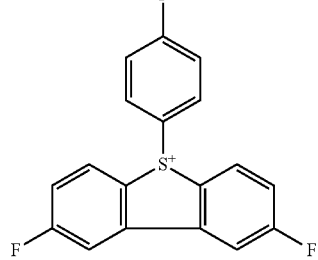
-continued
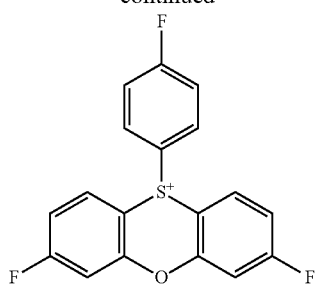
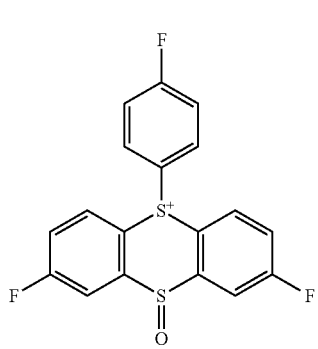
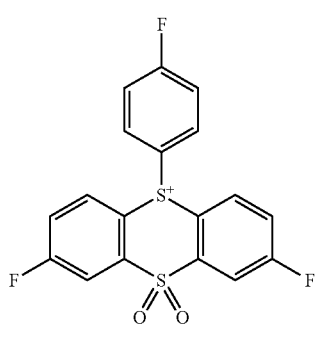
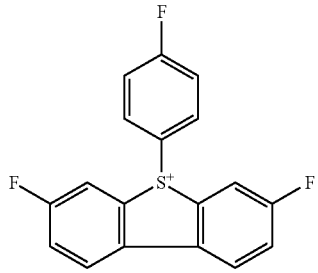
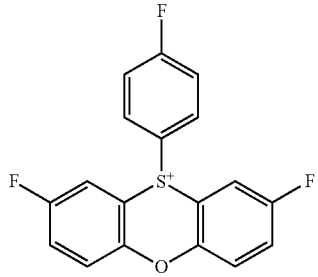

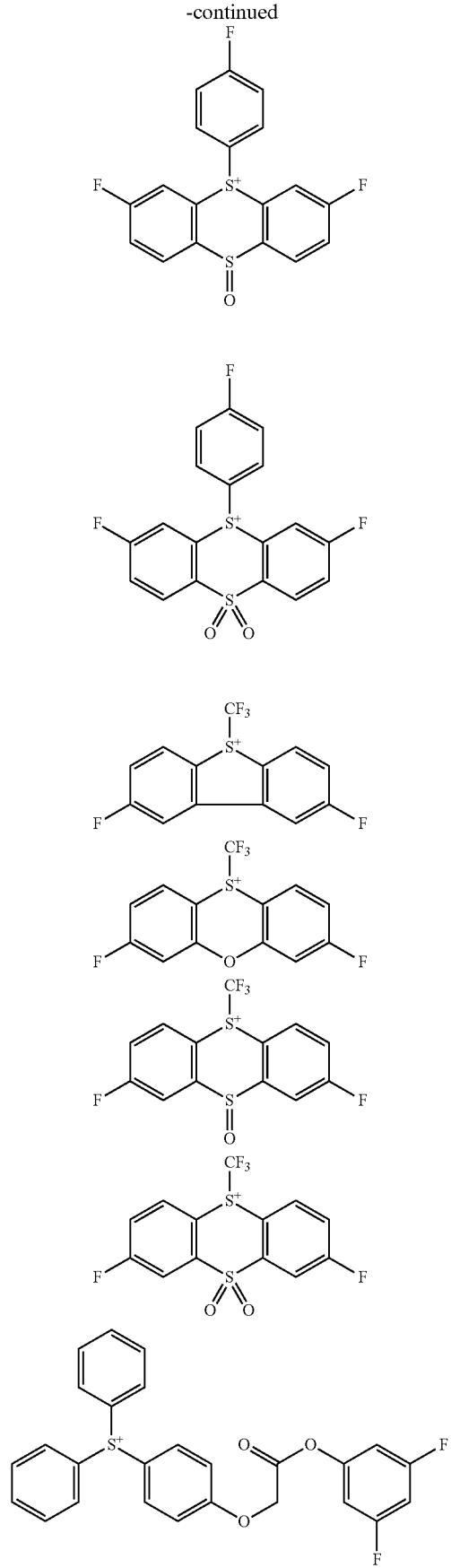
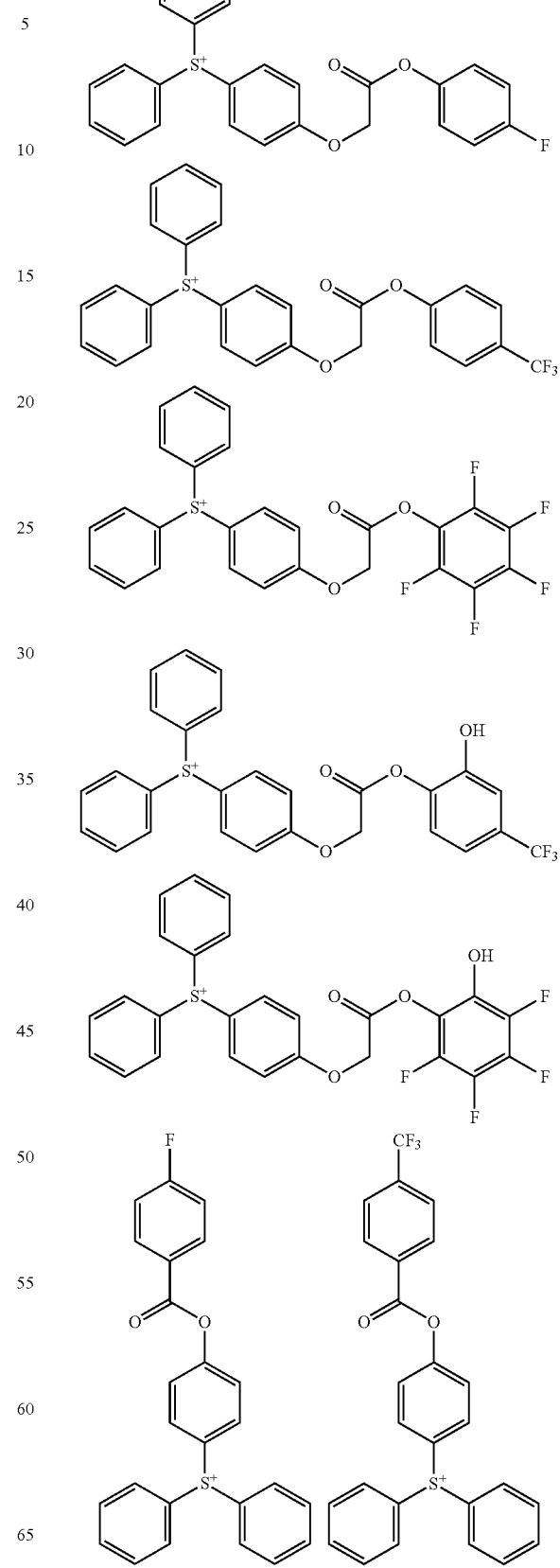

73
-continued
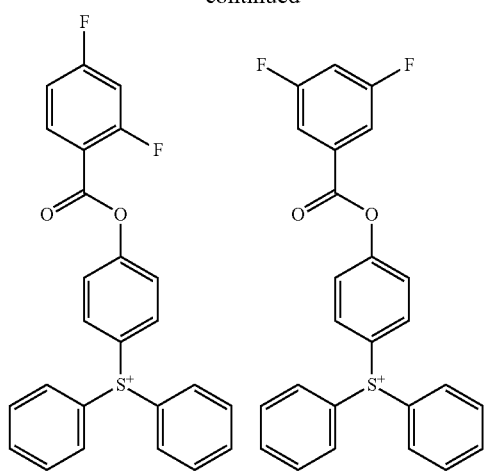
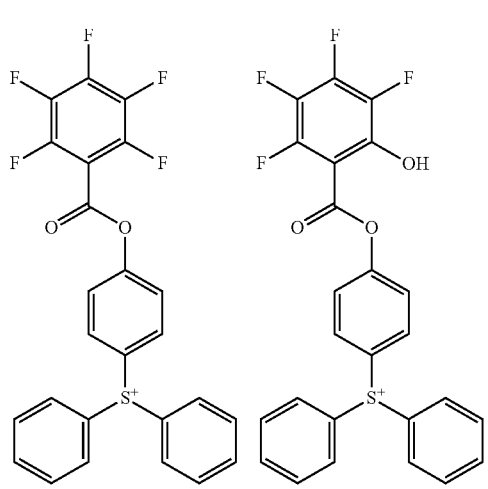
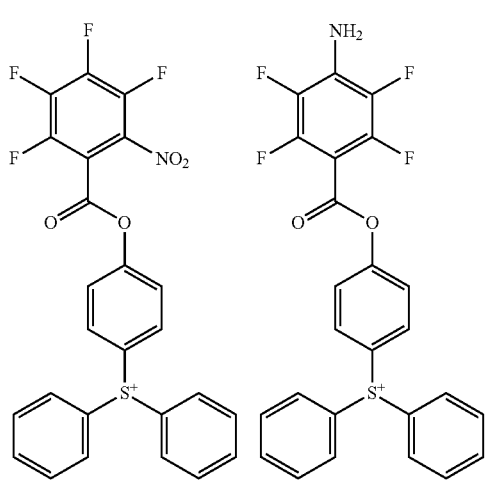
74
-continued
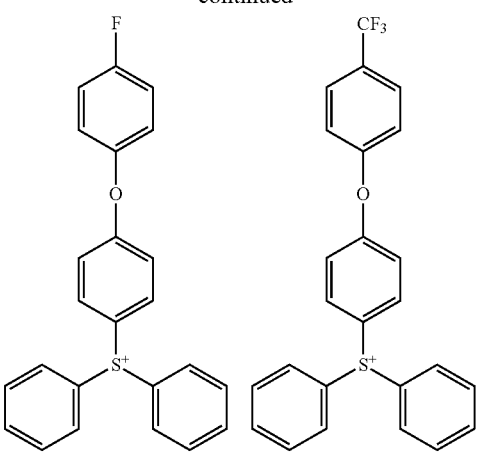
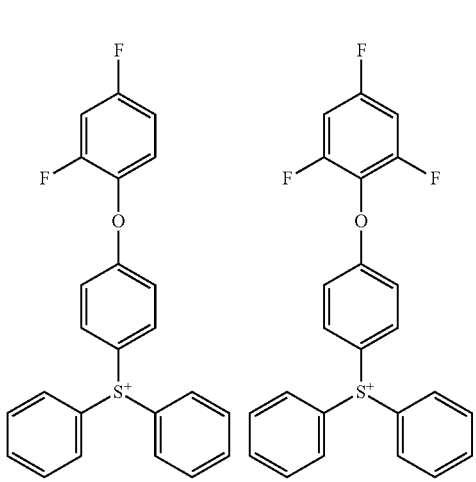
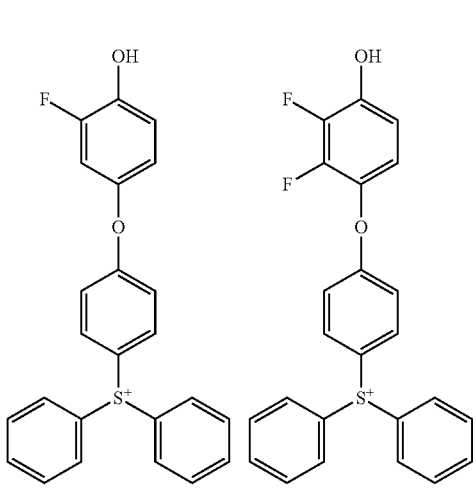

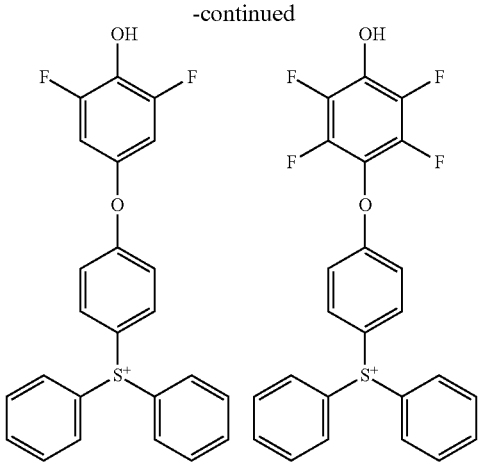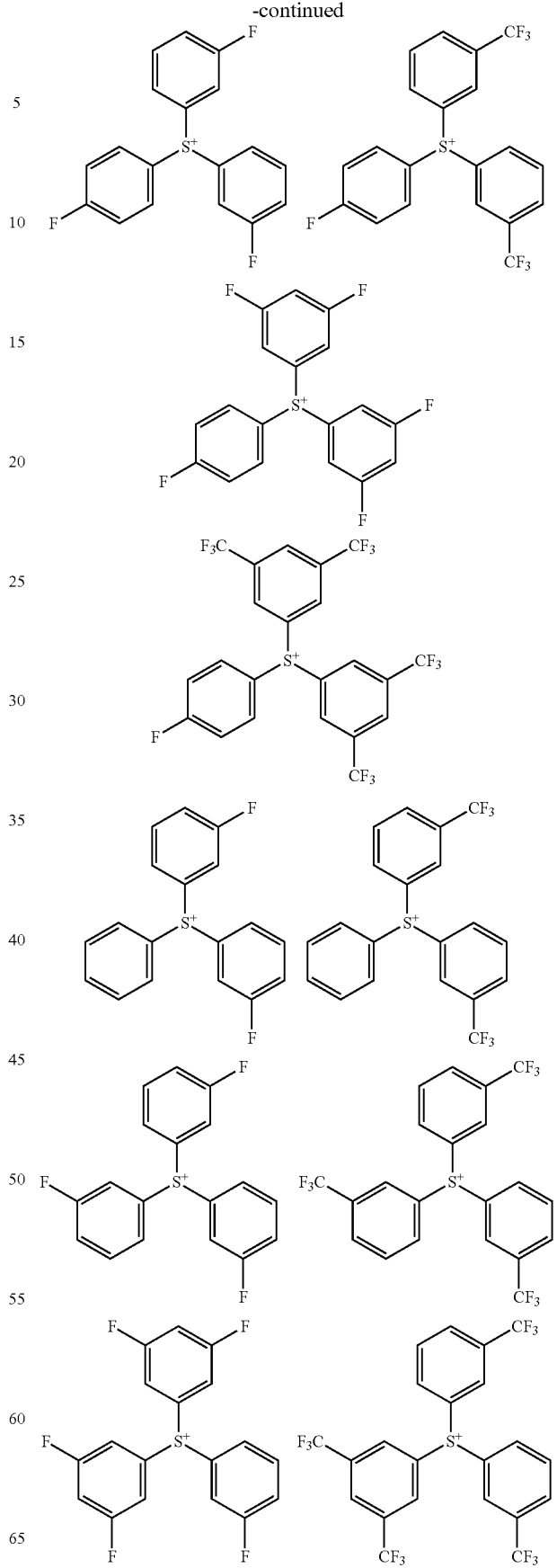

-continued
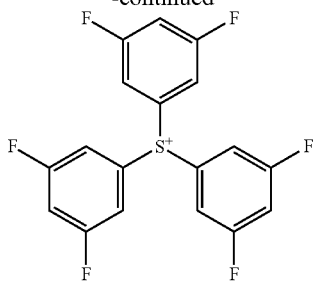
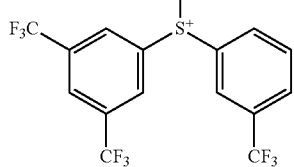
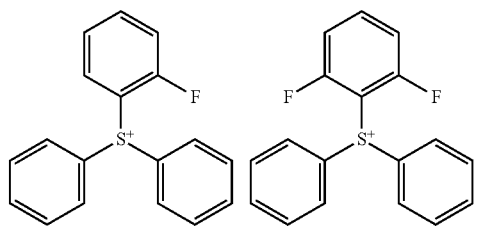
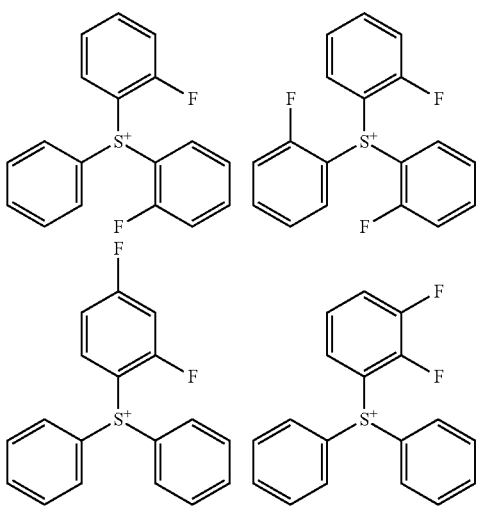
-continued
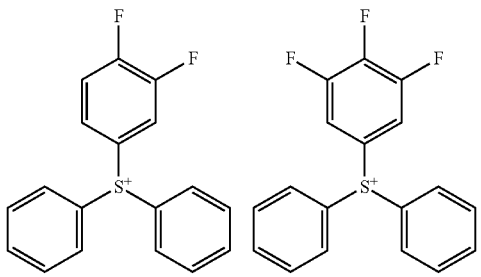
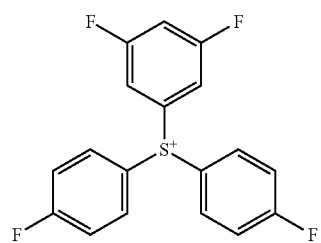
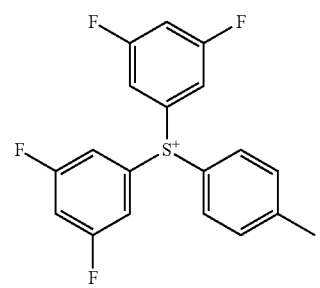
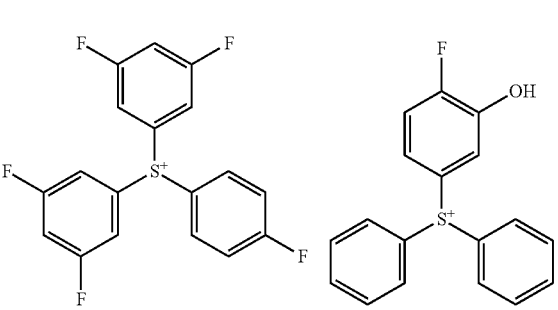

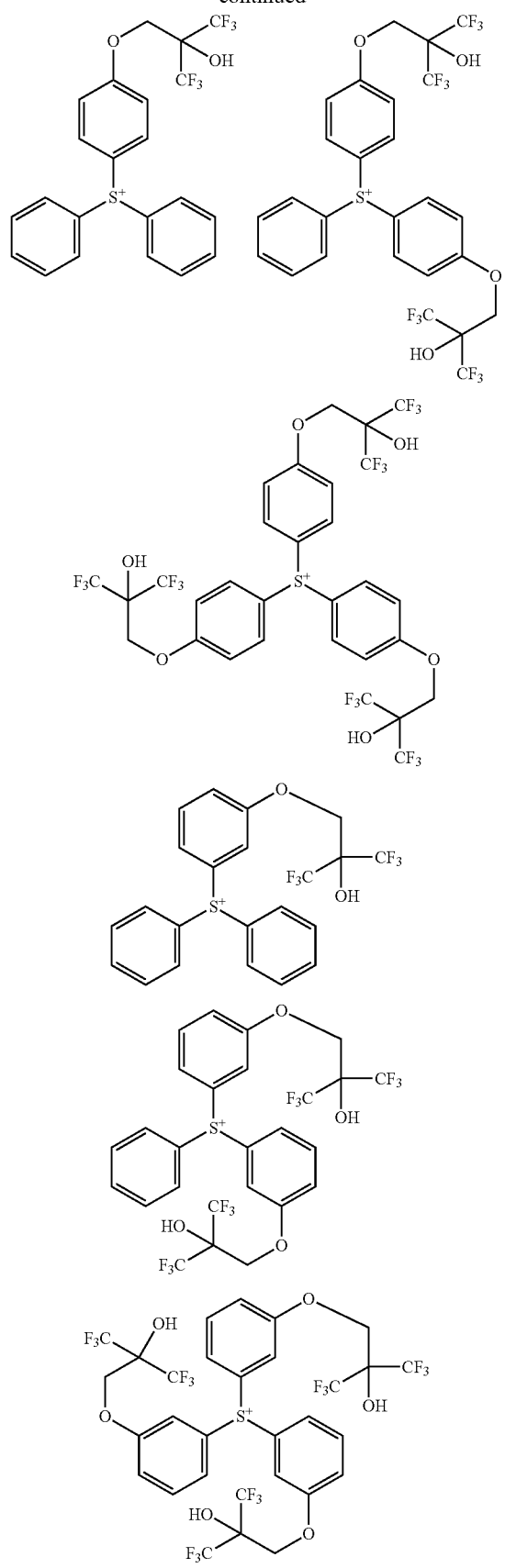
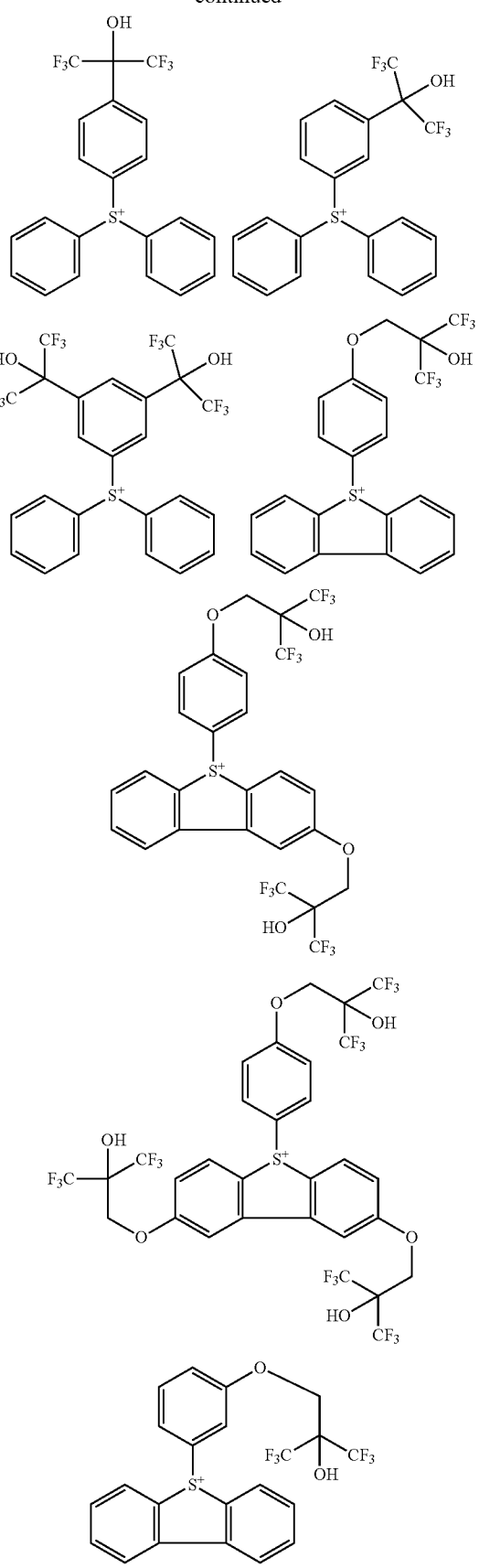

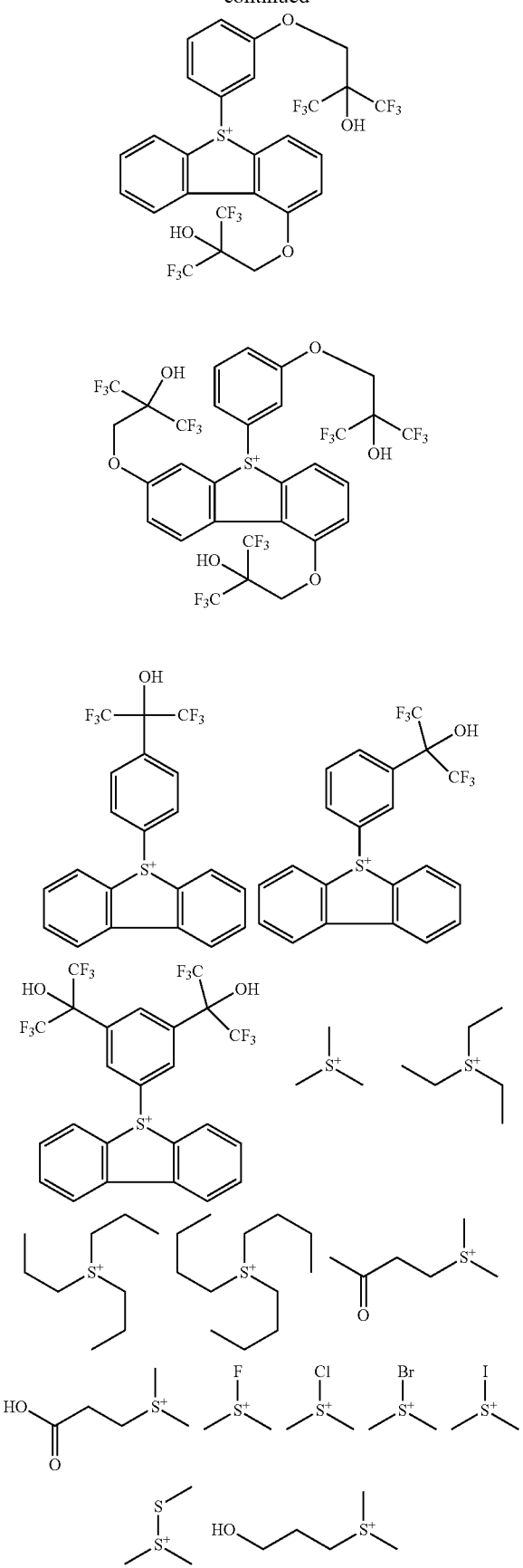
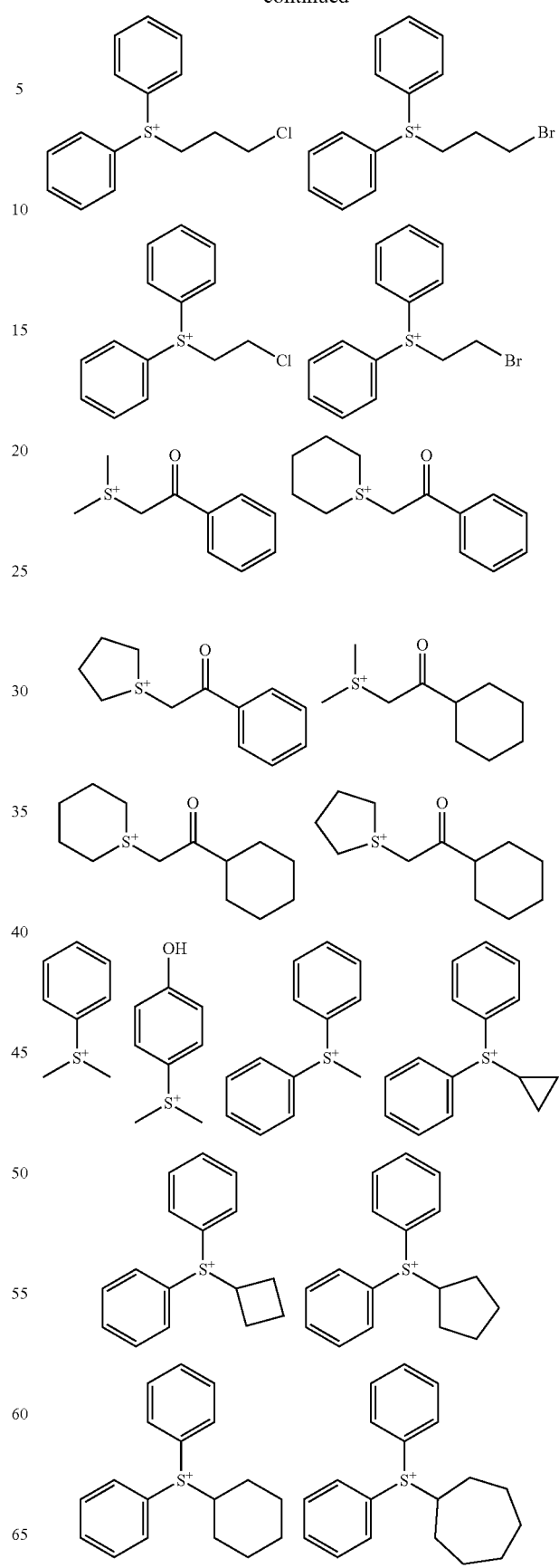

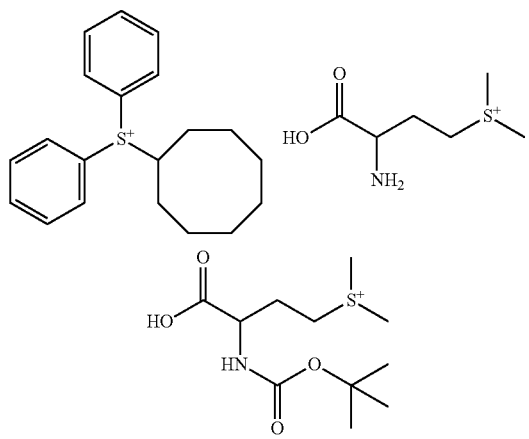

The repeat units (d1) to (d3) function as an acid generator. The attachment of an acid generator to the polymer main chain is effective in restraining acid diffusion, thereby preventing a reduction of resolution due to blur by acid diffusion. Also, LWR or CDU is improved since the acid generator is uniformly distributed. Where a base polymer containing repeat units (d1) to (d3), i.e., polymer-bound acid generator is used, the blending of an acid generator of addition type (to be described later) may be omitted.

The base polymer may further comprise repeat units (e) containing an adhesive group selected from among a hydroxy moiety, lactone ring, ether bond, ester bond, carbonyl moiety, and cyano moiety. Examples of the monomer from which repeat units (e) are derived are shown below, but not limited thereto. $R^A$ is as defined above.

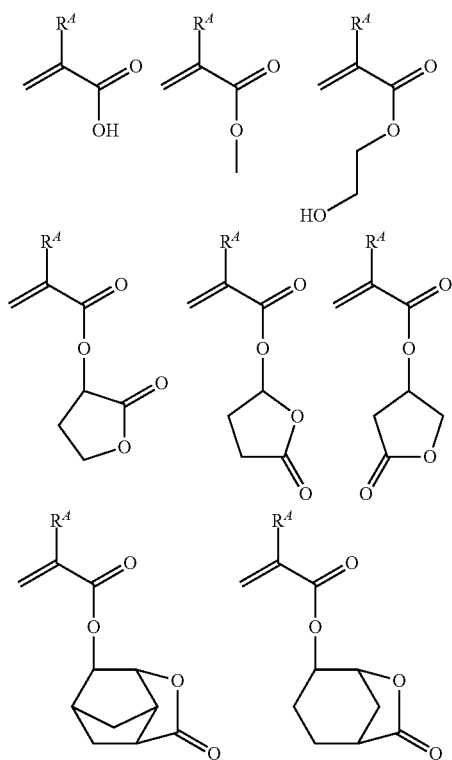

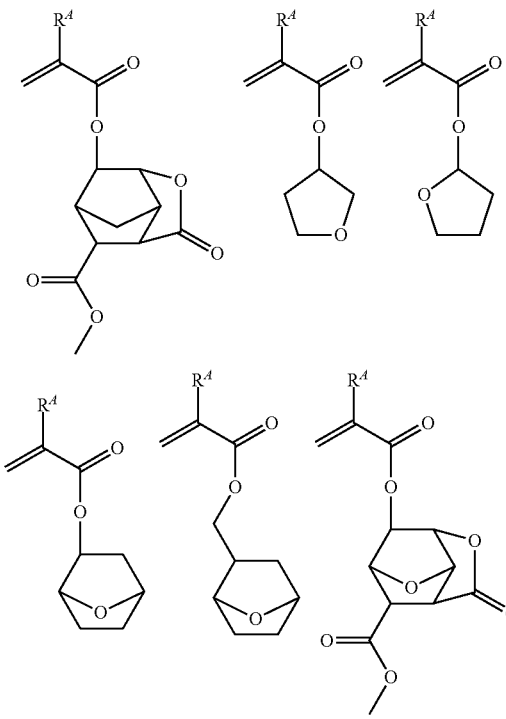

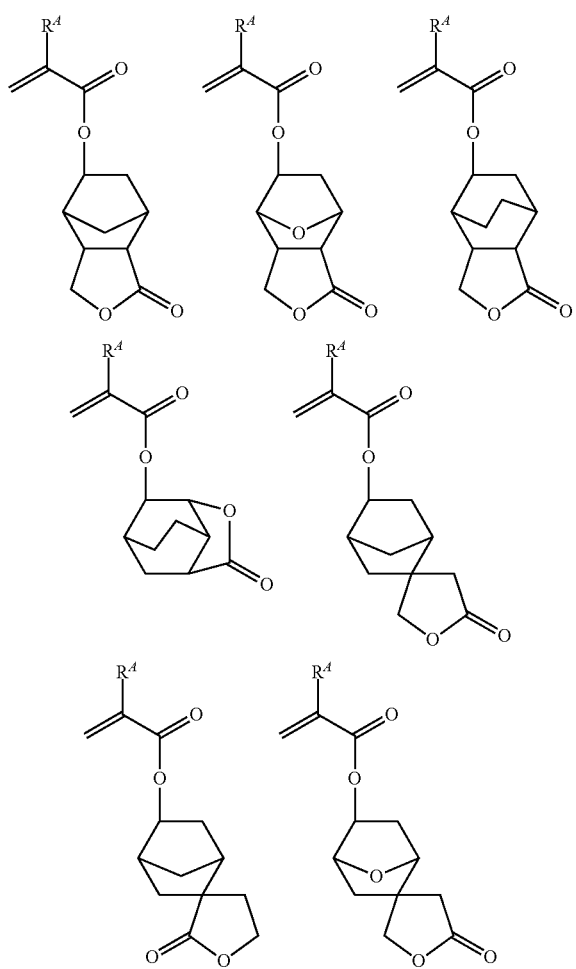

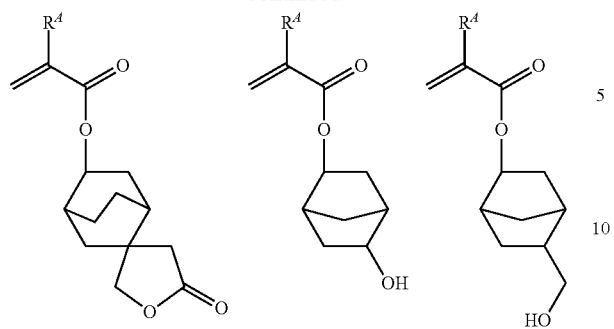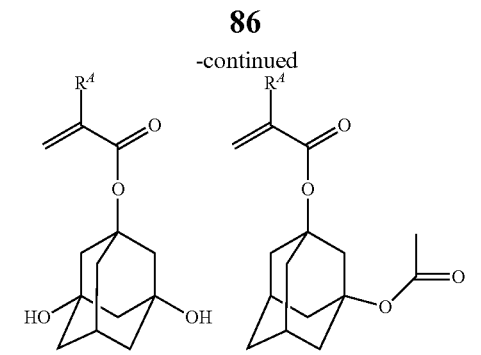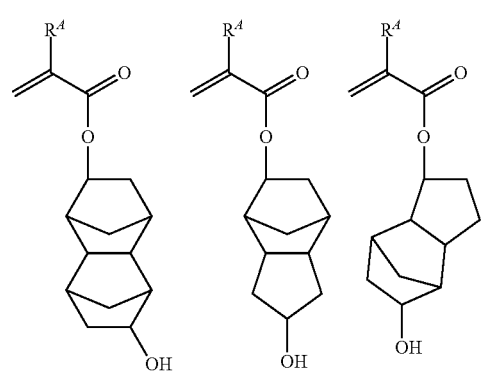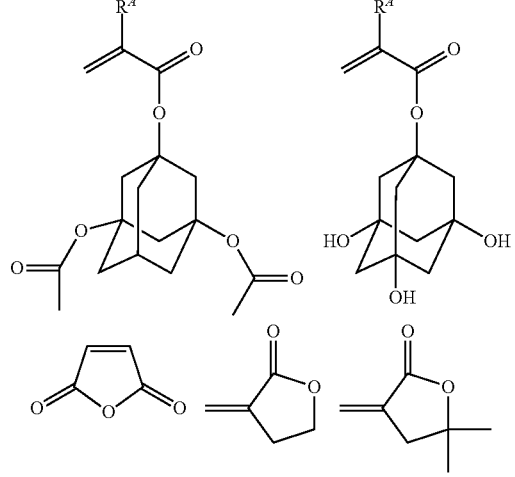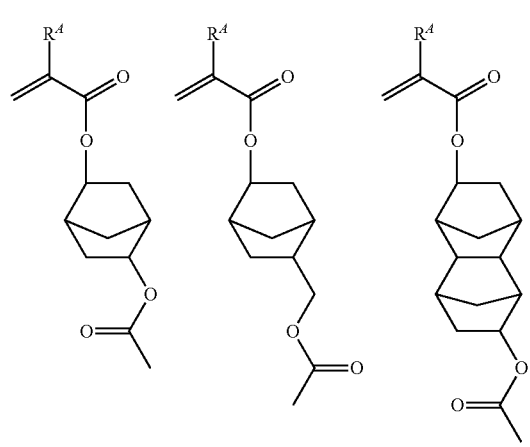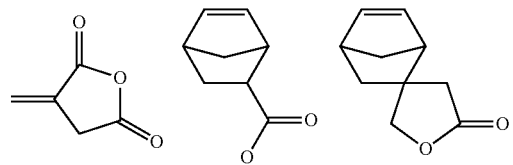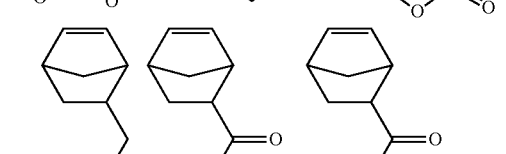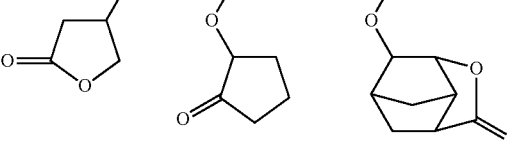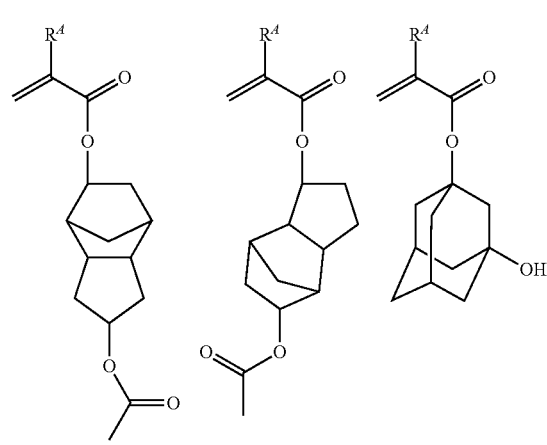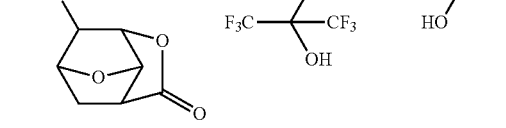

87
-continued
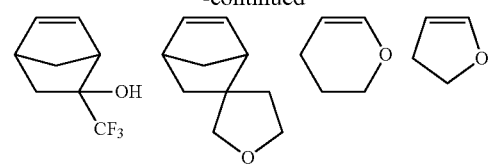
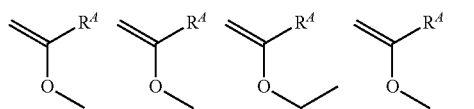
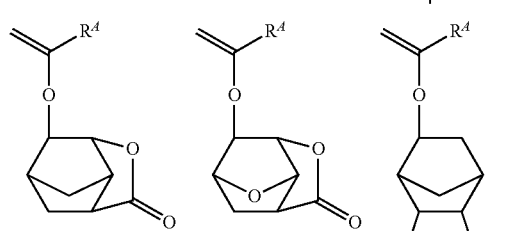
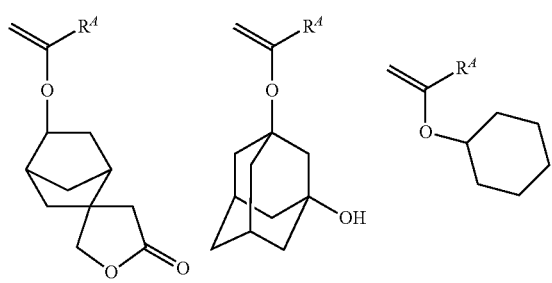
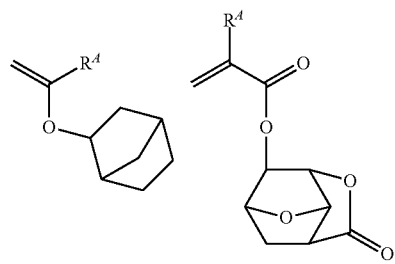
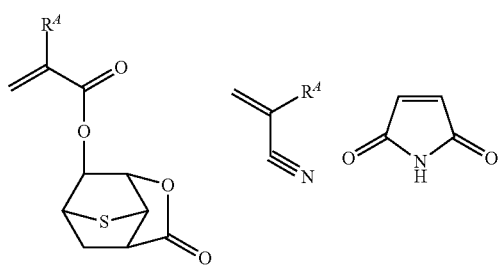
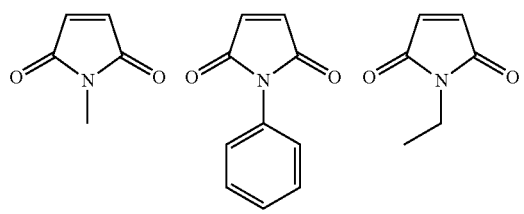
88
-continued
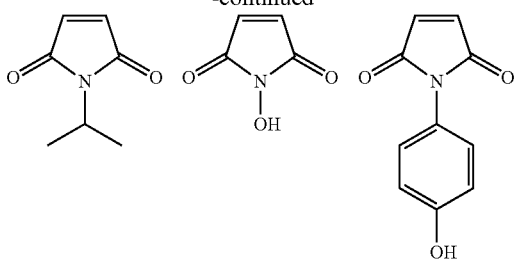
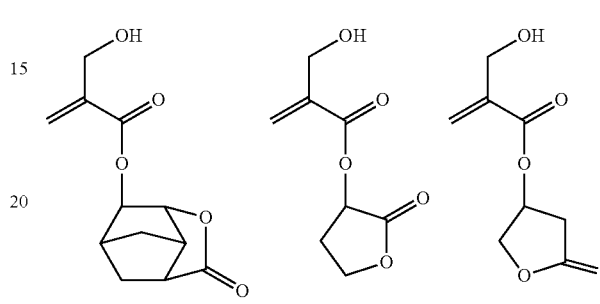
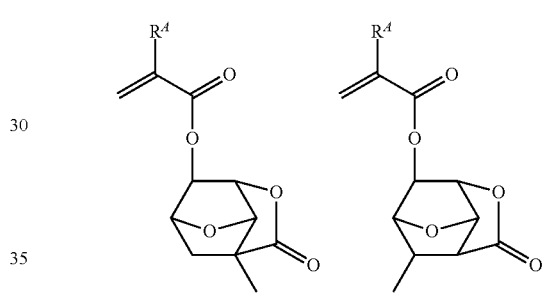
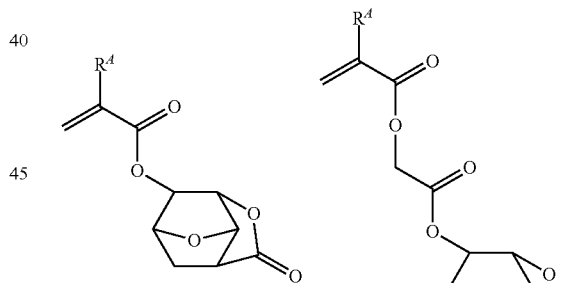
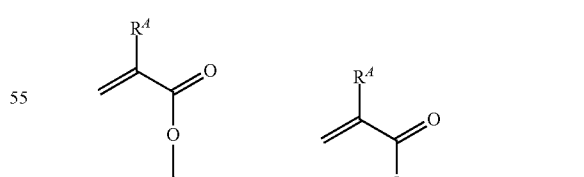
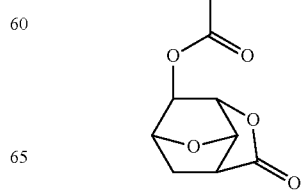

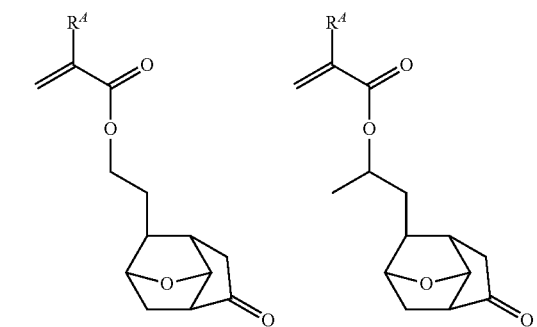
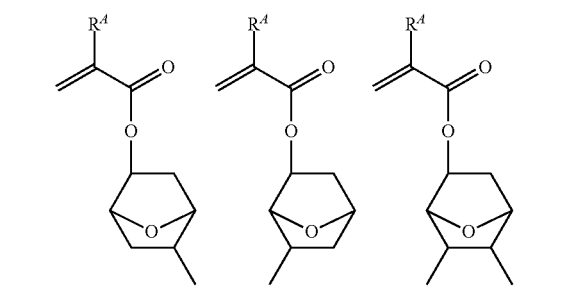
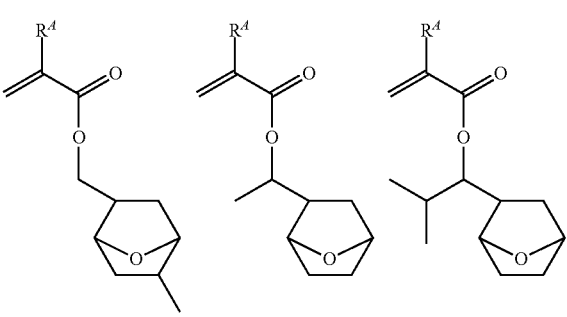
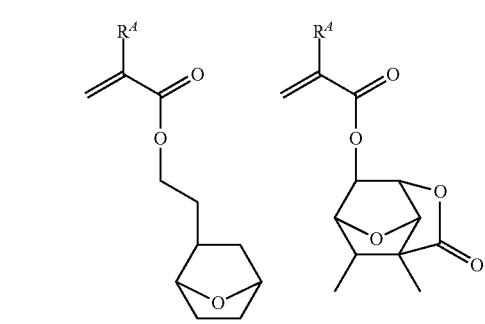
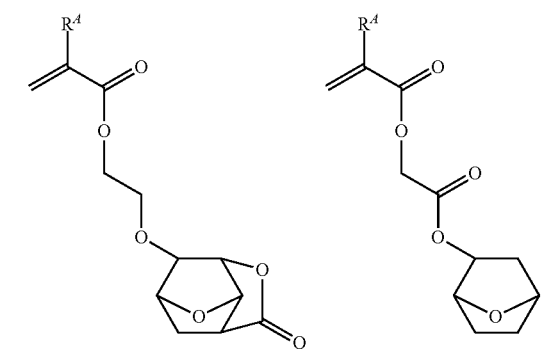
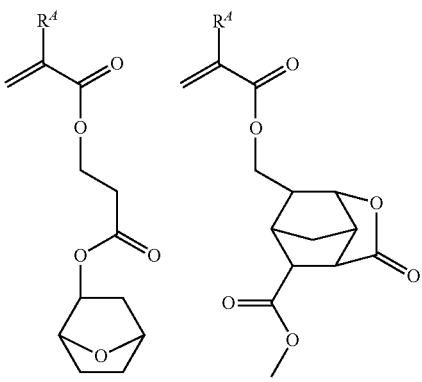

91
-continued
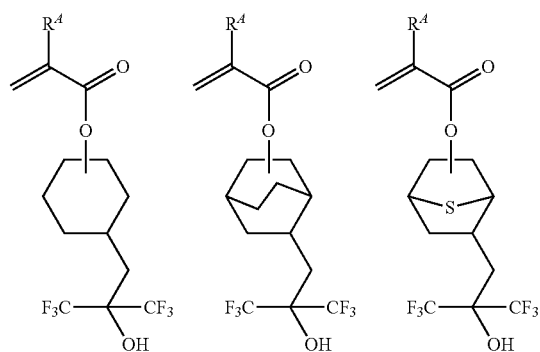
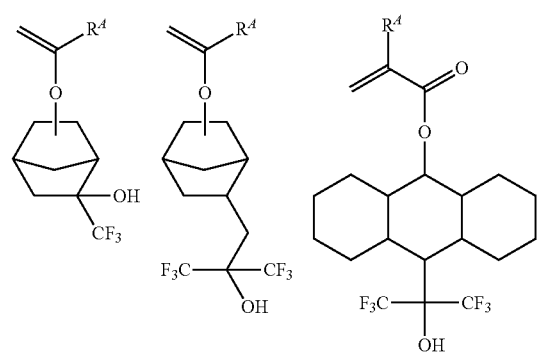
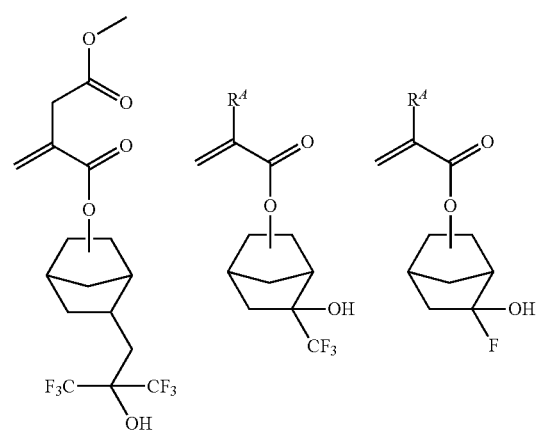
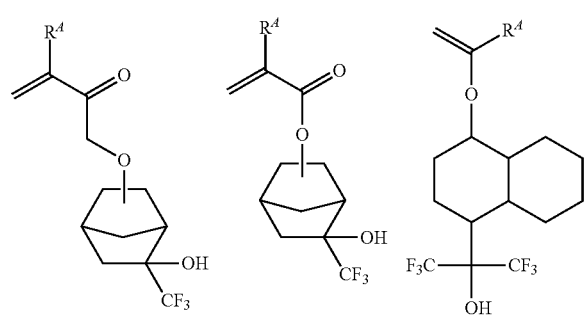
92
-continued
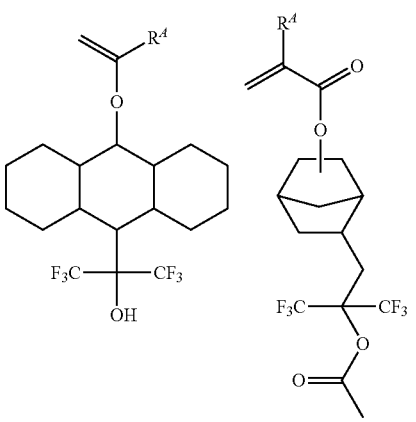
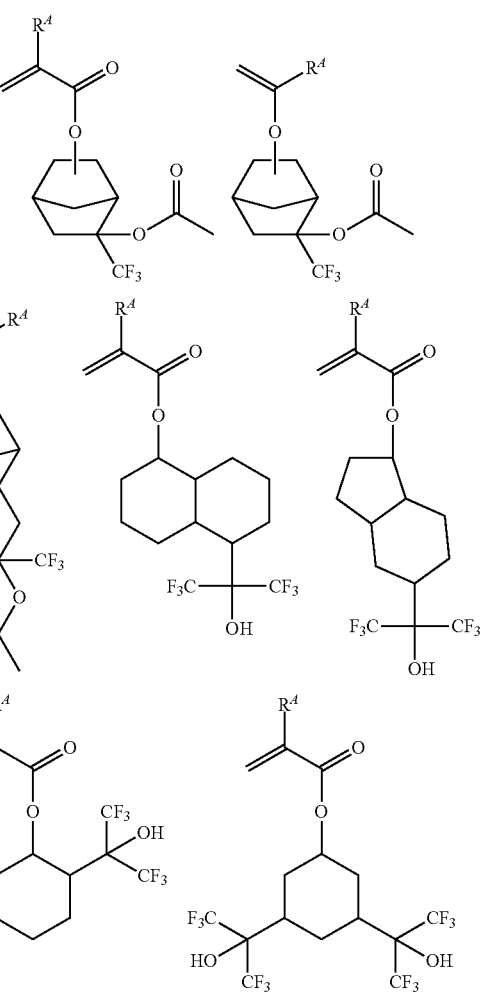

-continued
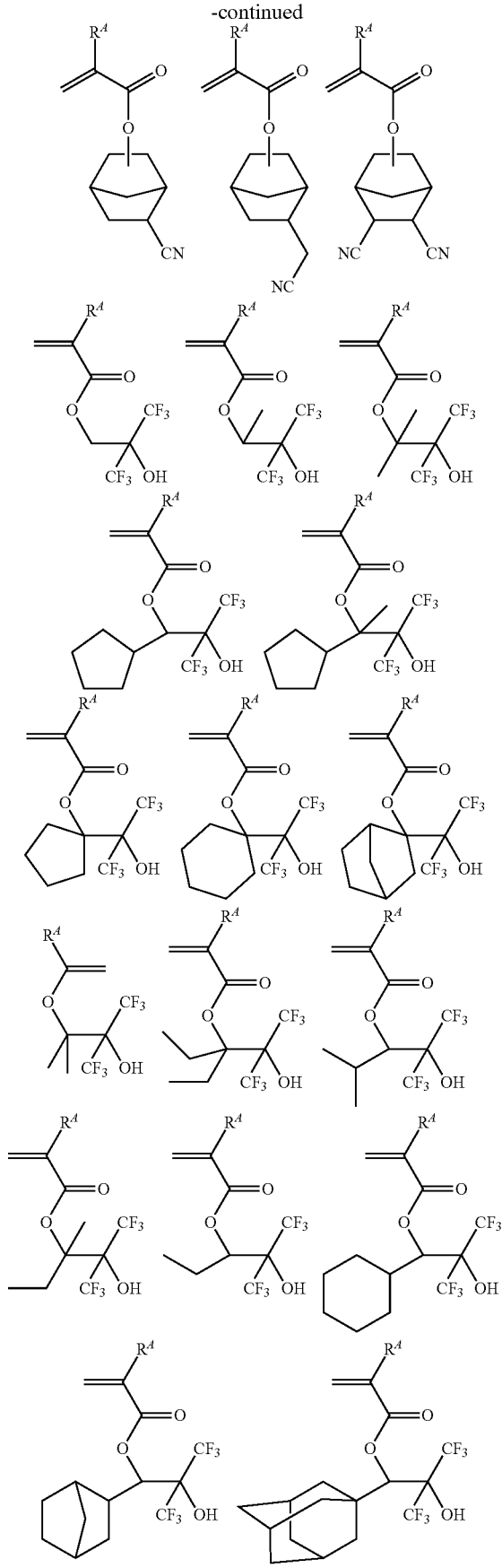
-continued
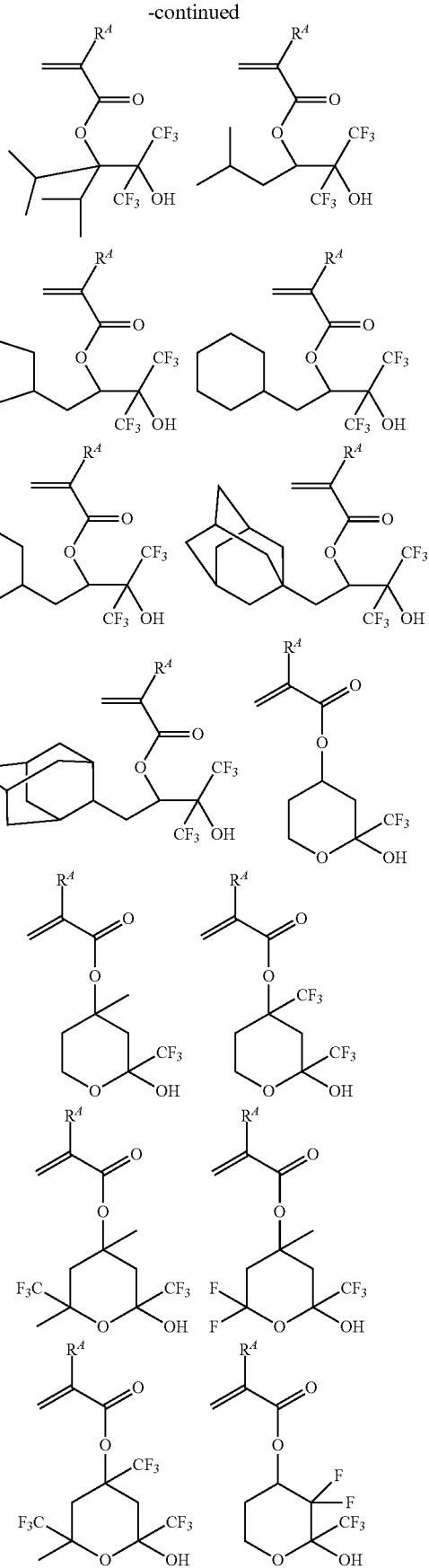

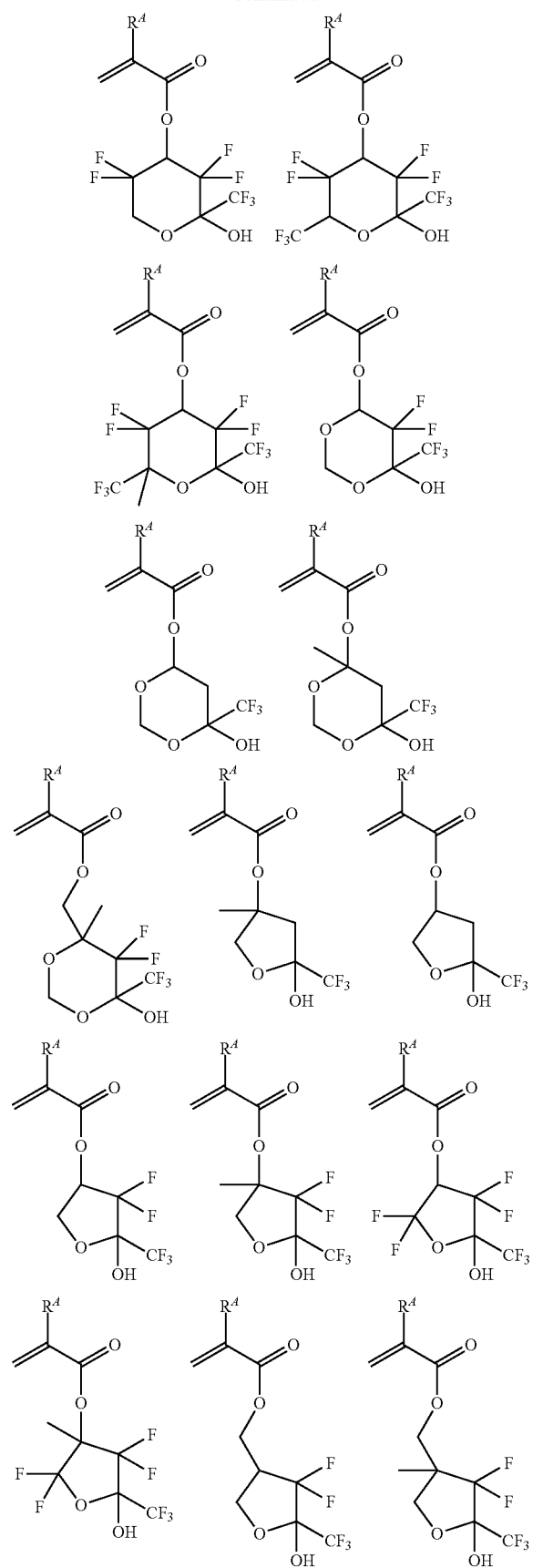
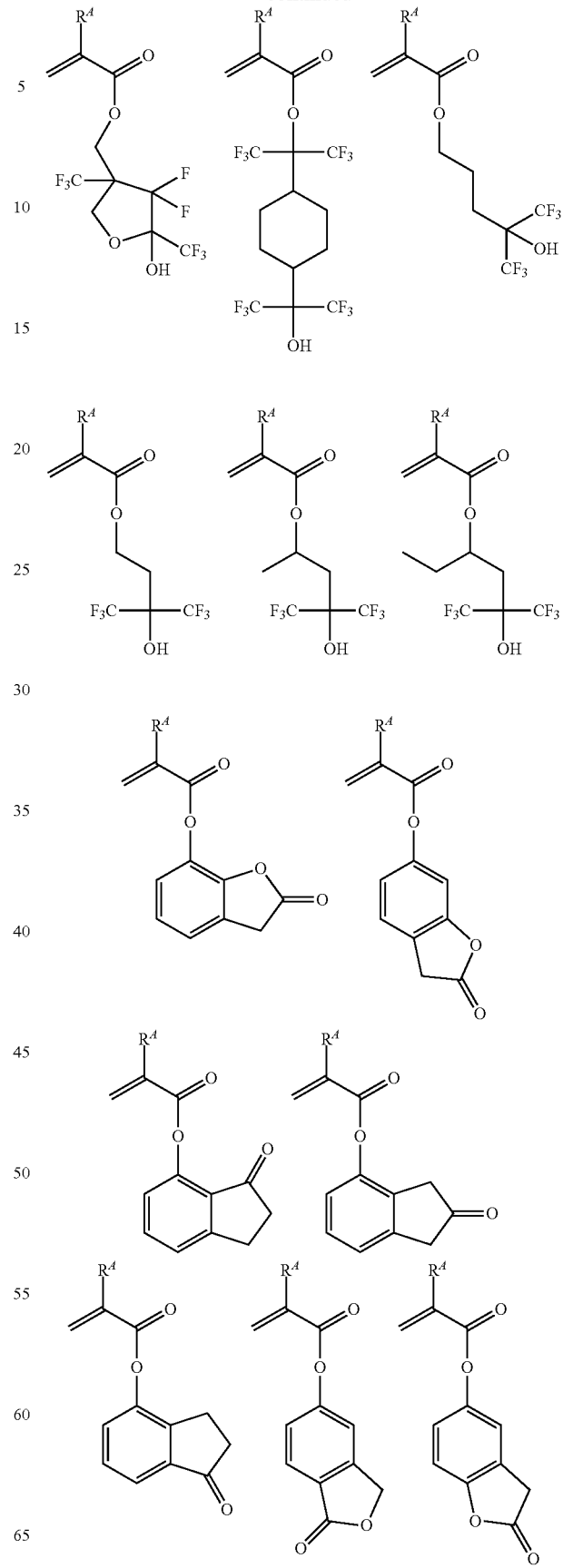

-continued
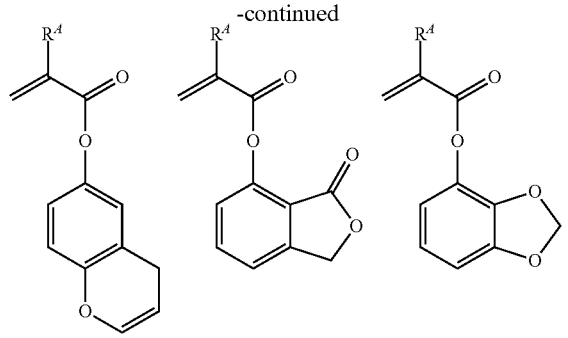
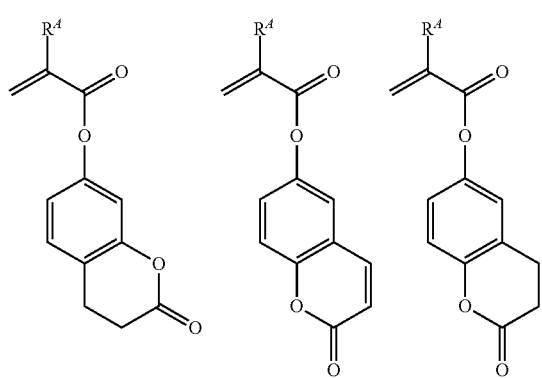
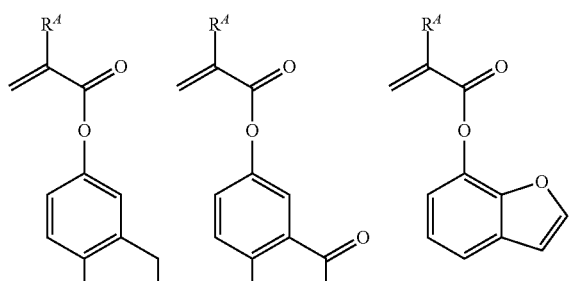
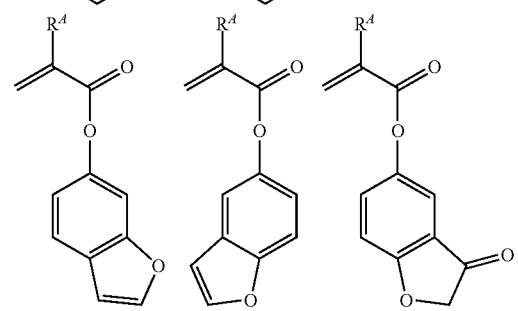
-continued
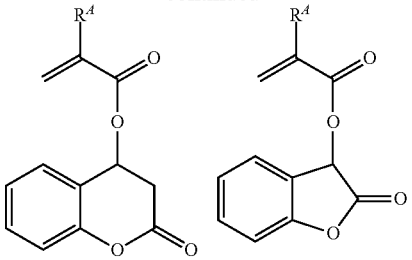
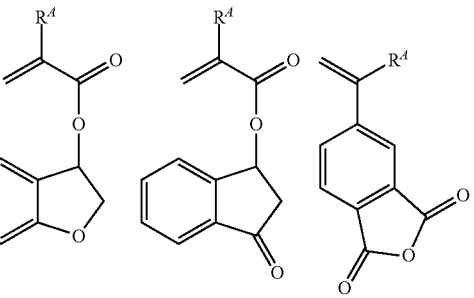
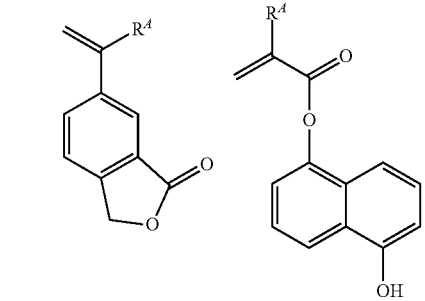
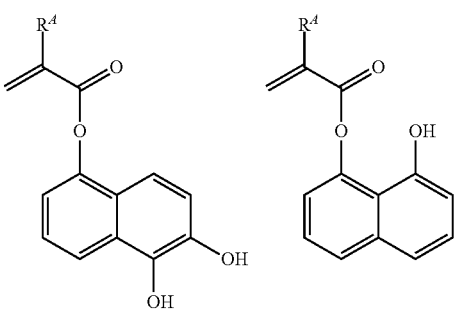
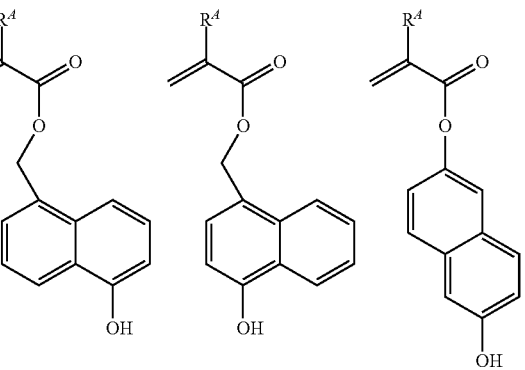

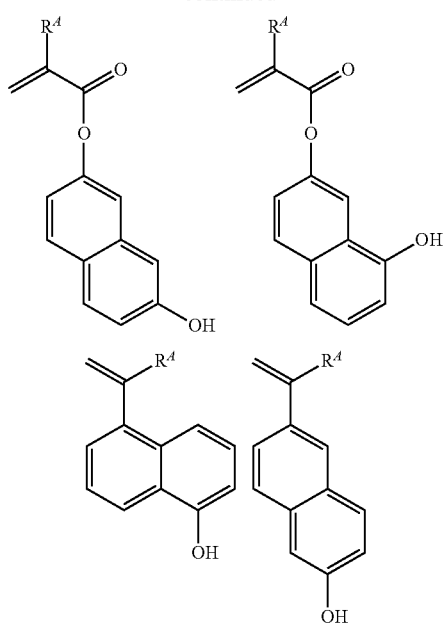
The base polymer may further comprise repeat units (f) containing iodine. Examples of the monomer from which repeat units (f) are derived are shown below, but not limited thereto. $R^A$ is as defined above.
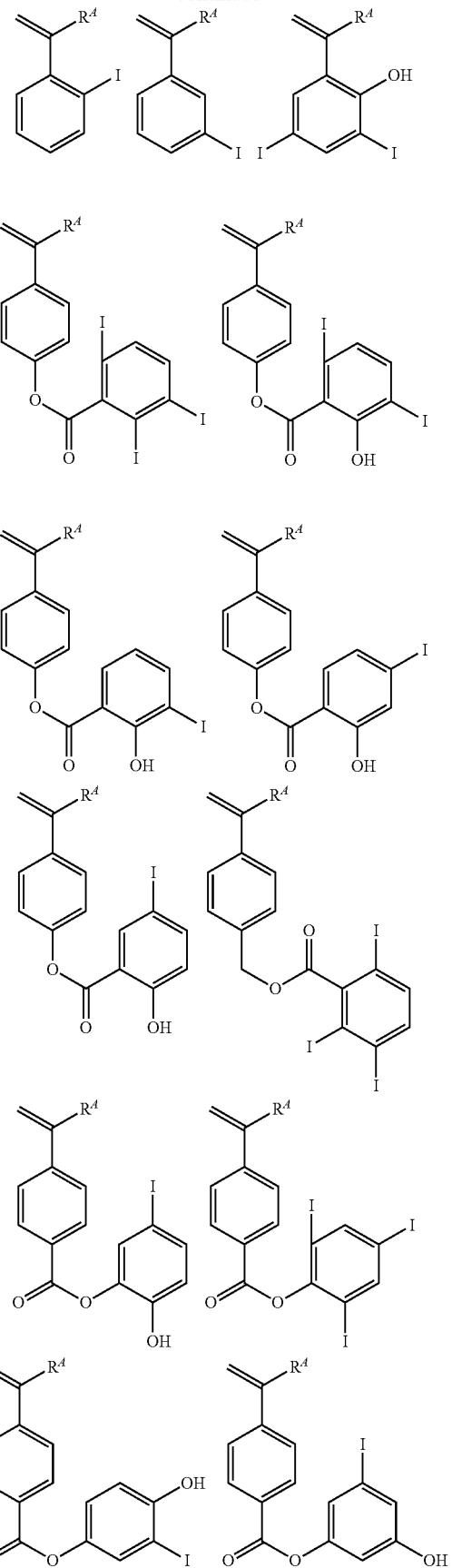

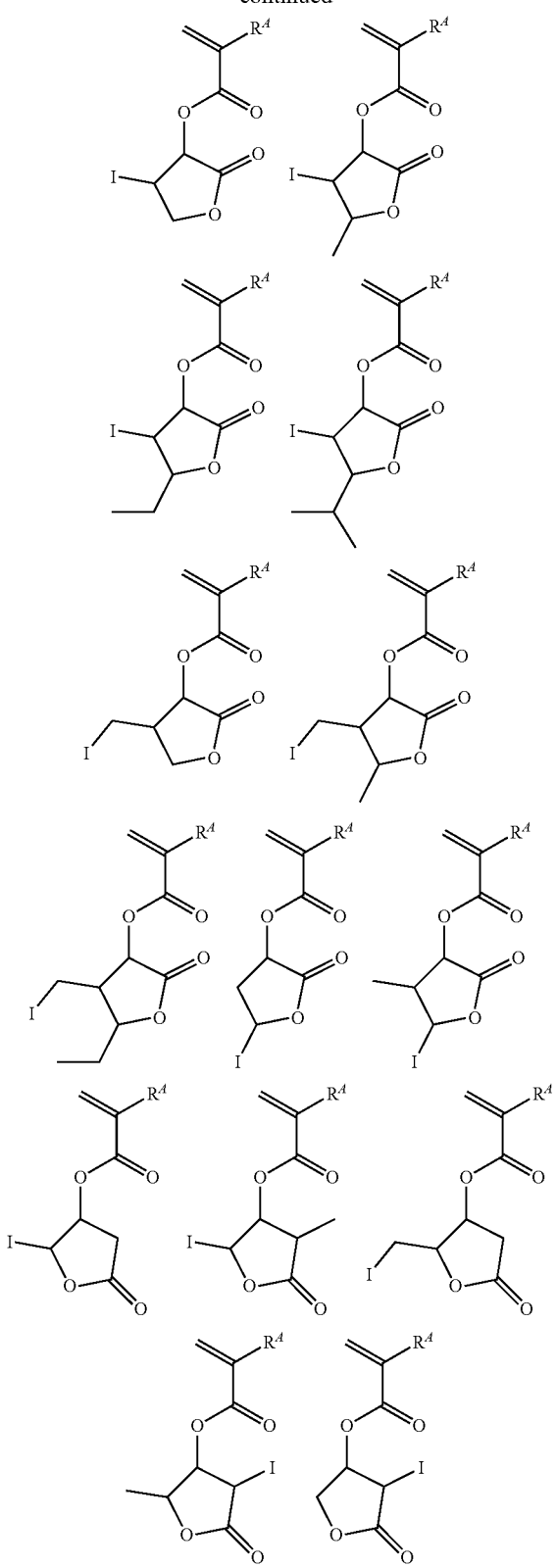

The base polymer may further comprise repeat units (g) other than the foregoing units, which are typically derived from styrene, vinylnaphthalene, indene, acenaphthylene, coumarin, and coumarone compounds.

In the base polymer, a fraction of units (a1), (a2), (b), (c), (d1), (d2), (d3), (e), (f), and (g) is:
preferably $0 \leq a1 < 1.0$, $0 \leq a2 < 1.0$, $0 < a1+a2 < 1.0$, $0 < b < 1.0$, $0 < c < 1.0$, $0 \leq d1 \leq 0.4$, $0 \leq d2 \leq 0.4$, $0 \leq d3 \leq 0.4$, $0 \leq d1+d2+d3 \leq 0.4$, $0 \leq e \leq 0.7$, $0 \leq f \leq 0.5$, and $0 \leq g \leq 0.5$; more preferably $0 \leq a1 \leq 0.8$, $0 \leq a2 \leq 0.8$, $0.01 \leq a1+a2 \leq 0.8$, $0.1 \leq b \leq 0.9$, $0.1 \leq c \leq 0.9$, $0 \leq d1 \leq 0.3$, $0 \leq d2 \leq 0.3$, $0 \leq d3 \leq 0.3$, $0 \leq d1+d2+d3 \leq 0.3$, $0 \leq e \leq 0.5$, $0 \leq f \leq 0.4$, and $0 \leq g \leq 0.4$;
even more preferably $0 \leq a1 \leq 0.7$, $0 \leq a2 \leq 0.7$, $0.02 \leq a1+a2 \leq 0.7$, $0.2 \leq b \leq 0.8$, $0.2 \leq c \leq 0.8$, $0 \leq d1 \leq 0.25$, $0 \leq d2 \leq 0.25$, $0 \leq d3 \leq 0.25$, $0 \leq d1+d2+d3 \leq 0.25$, $0 \leq e \leq 0.4$, $0 \leq f \leq 0.3$, and $0 \leq g \leq 0.3$. It is noted that $a1+a2+b+c+d1+d2+d3+e+f+g \leq 1$. In a polymer comprising repeat units (a), (b) and (c), for example, $a+b+c=1$ means that the total of repeat units (a), (b) and (c) is 100 mol % of the overall repeat units; and $a+b+c<1$ means that the total of repeat units (a), (b) and (c) is less than 100 mol % of the overall repeat units, that is, the polymer contains additional repeat units other than repeat units (a), (b) and (c).

The base polymer may be synthesized by any desired methods, for example, by dissolving one or more monomers selected from the monomers corresponding to repeat units (a) to (g) in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2-azobisisobutonitrile (AIBN), 2,2'-azobis(2,4-dimethylvaleronitrile), dimethyl 2,2-azobis(2-methylpropionate), benzoyl peroxide, and lauroyl peroxide. Preferably, the reaction temperature is 50 to 80° C. and the reaction time is 2 to 100 hours, more preferably 5 to 20 hours.

Where a monomer having a hydroxy group is copolymerized, the hydroxy group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

When hydroxystrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is $-20°$ C. to $100°$ C., more preferably $0°$ C. to $60°$ C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. If Mw is too low, a resist film is less heat resistant. If Mw is too high, a resist film has low alkaline solubility and is liable to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that the base polymer may contain two or more polymers which differ in compositional ratio, Mw or Mw/Mn. A blend of a polymer containing repeat units (a1) and a polymer containing repeat units (a2), or a blend of a polymer containing repeat units (a1) and/or (a2) and a polymer free of repeat units (a1) and (a2) is also acceptable. The base polymer is suited as a base component in the negative resist composition.

Organic Solvent

The negative resist composition may contain an organic solvent. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropronate, ethyl 3-ethoxypropionate, tert-butyl acetate, tert-butyl propionate, and propylene glycol mono-tert-butyl ether acetate; and lactones such as γ-butyrolactone.

In the negative resist composition, the organic solvent is preferably added in an amount of 50 to 10,000 parts, and more preferably 100 to 5,000 parts by weight per 100 parts by weight of the base polymer. The organic solvents may be used alone or in admixture.

Acid Generator

An acid generator, which is sometimes referred to as acid generator of addition type, may be added to the negative resist composition so that it may function as a chemically amplified negative resist composition. Typical of the acid generator used herein is a photoacid generator (PAG) capable of generating an acid in response to actinic light or radiation. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators, which may be used alone or in admixture. Exemplary PAGs are described in U.S. Pat. No. 7,537,880 (JP-A 2008-111103, paragraphs [0122]-[0142]).

Among others, arenesulfonate type acid generators are preferred because they generate acids having an appropriate strength to promote crosslinking reaction or dehydrating reaction. Useful such acid generators are sulfonium salts having a sulfonate anion of the structure shown below. Examples of the sulfonium cation pairing with the sulfonate anion are as exemplified above for the cation in repeat units (d2) and (d3).

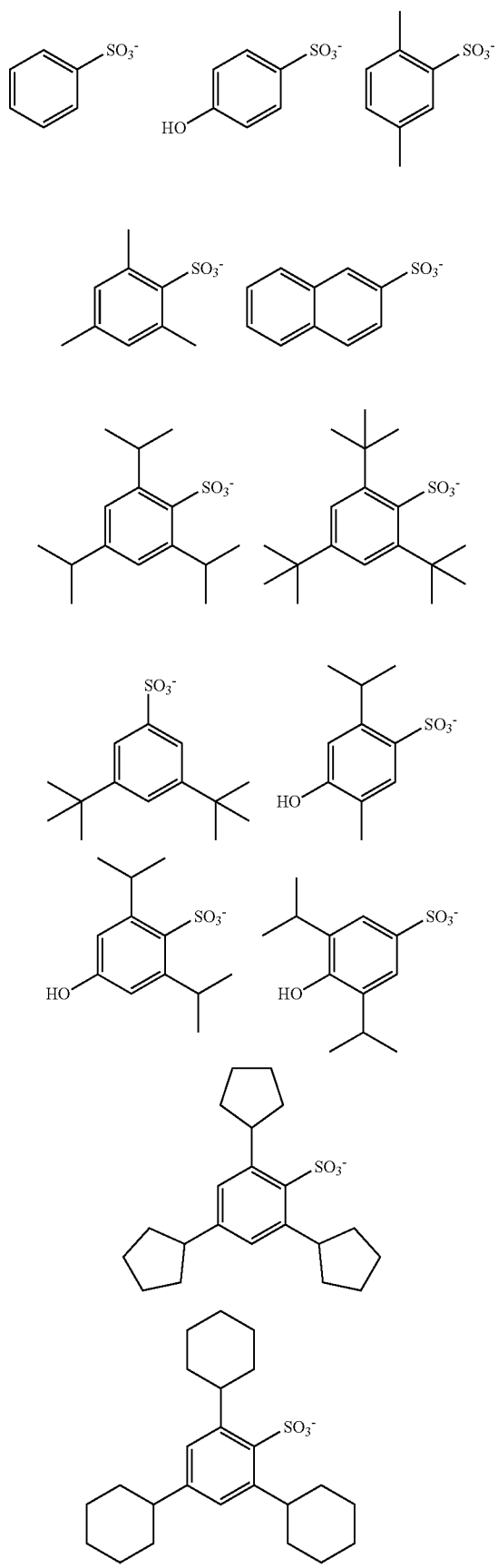

105
-continued
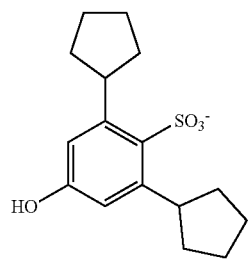 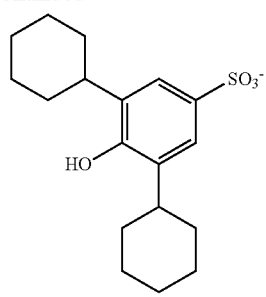
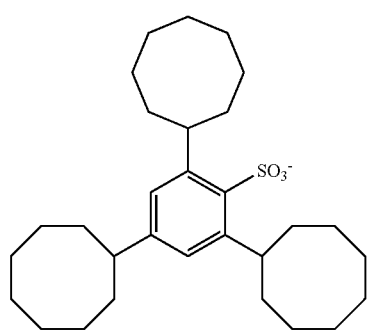
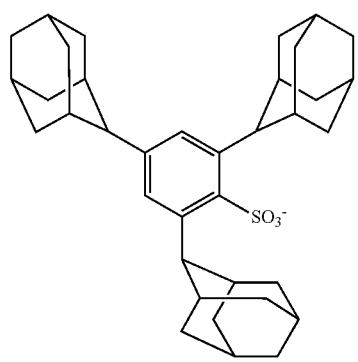
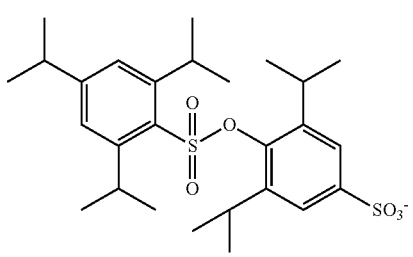
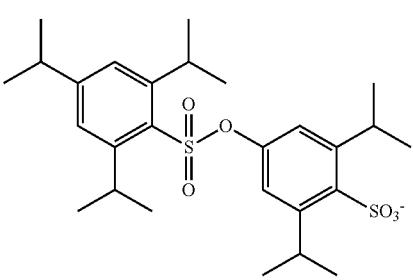
106
-continued
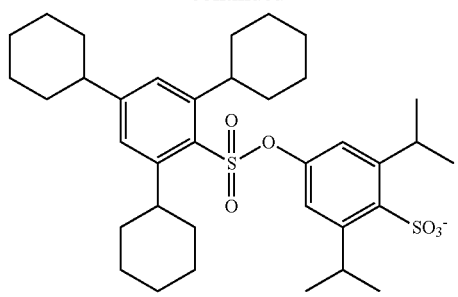
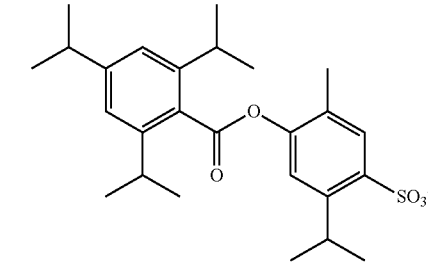
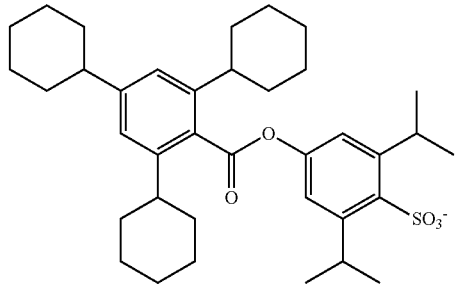
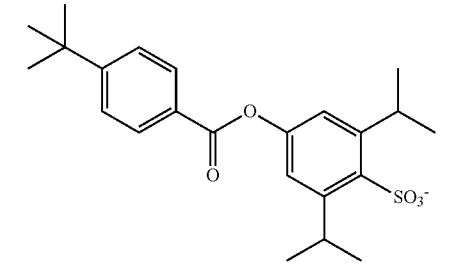
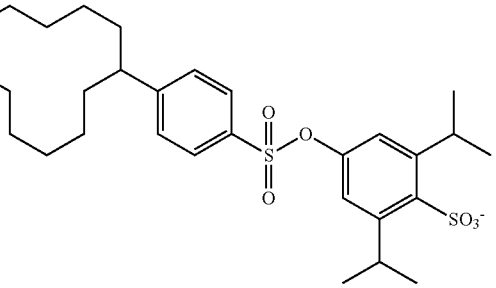
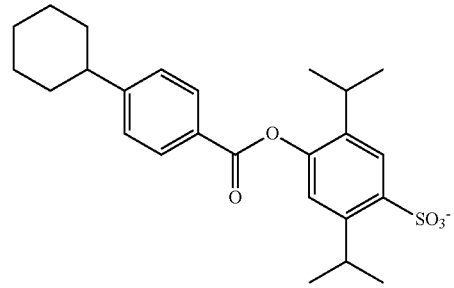

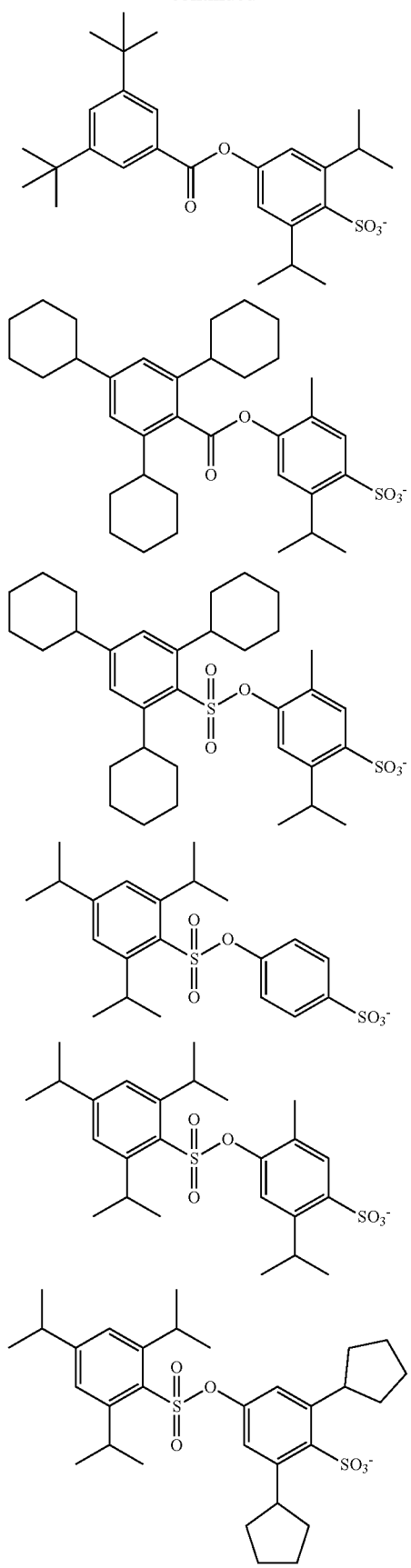
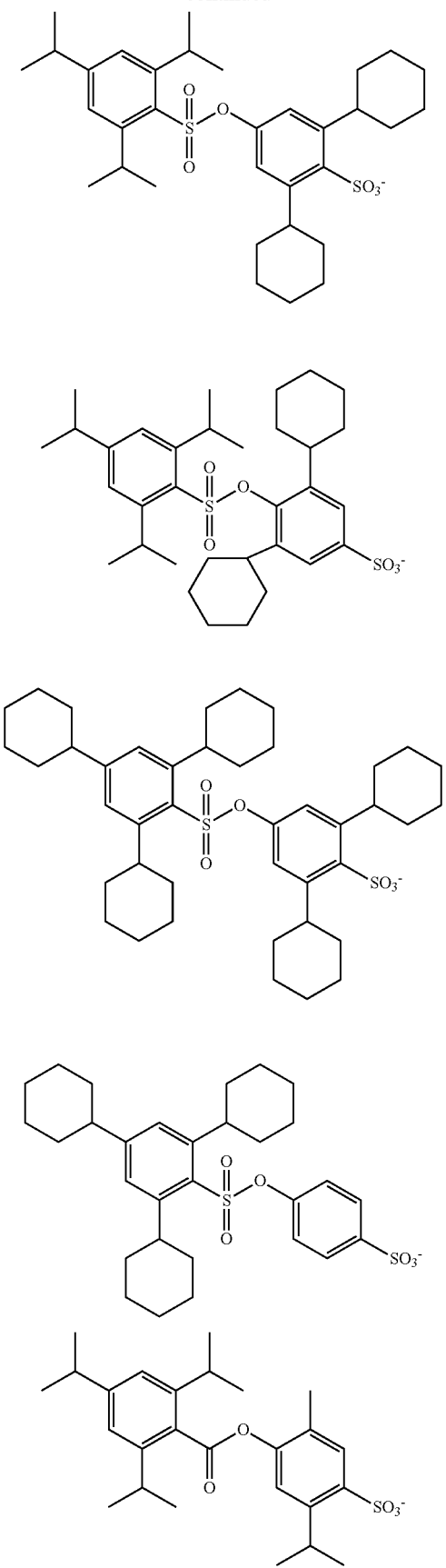

109
-continued
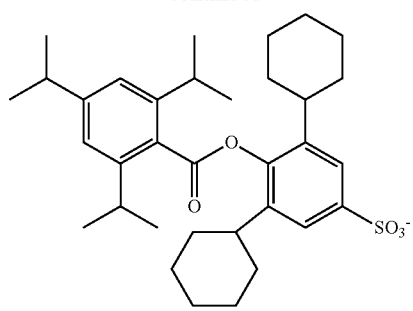
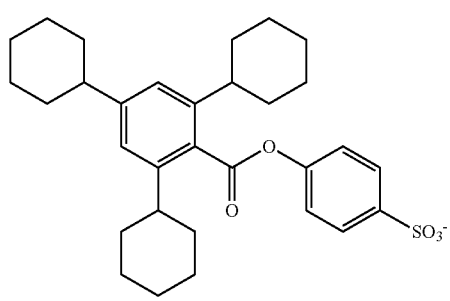
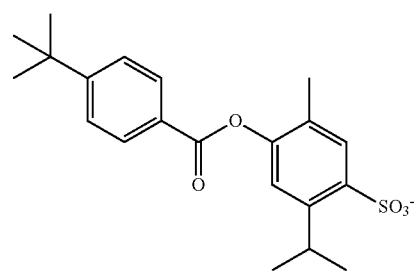
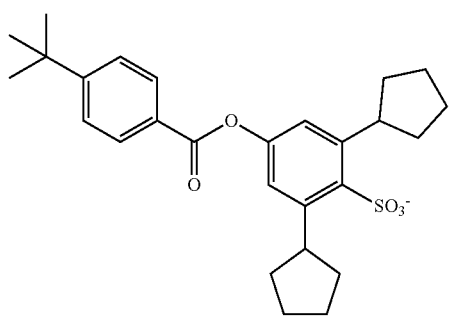
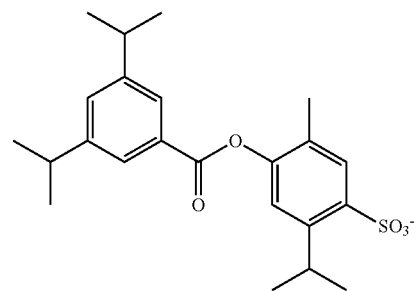
110
-continued
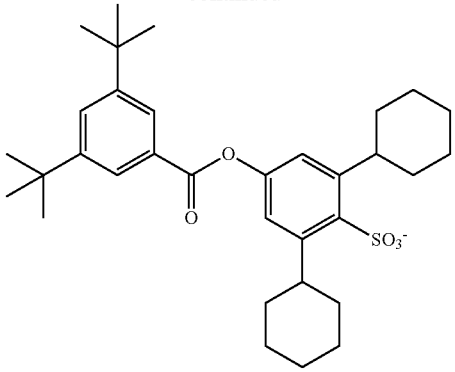
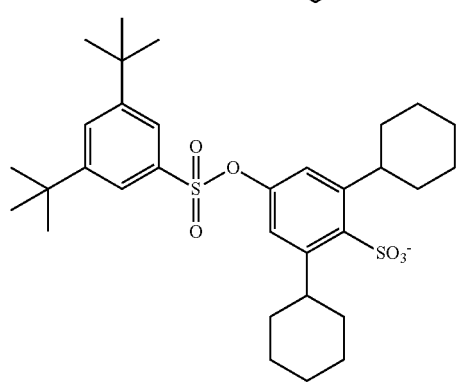
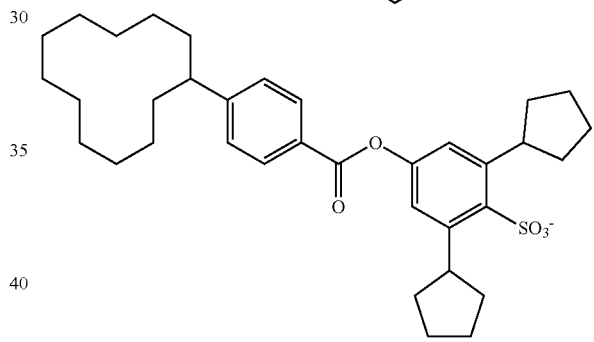
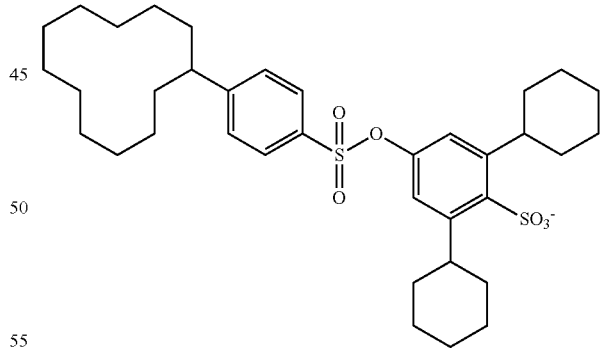
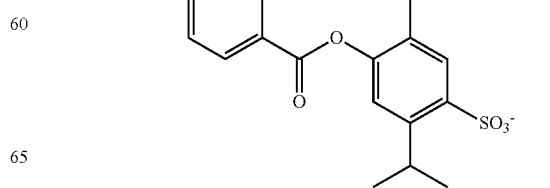

111
-continued
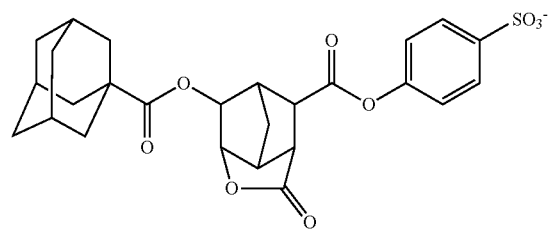
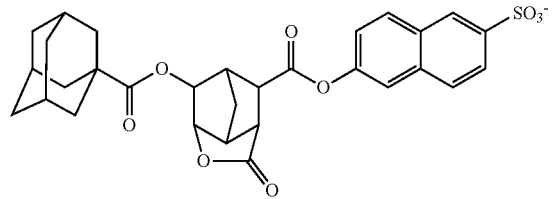
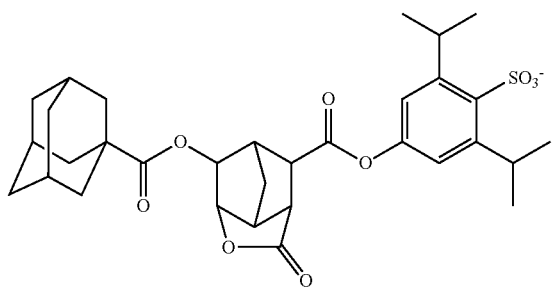
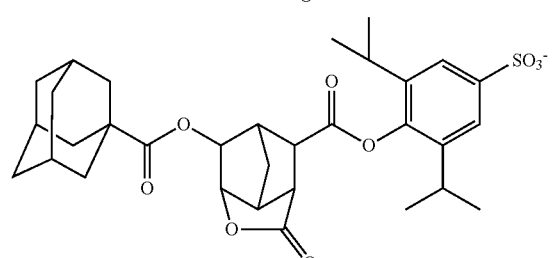
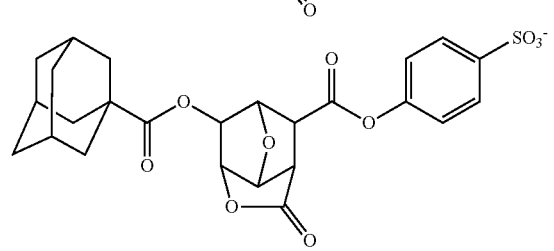
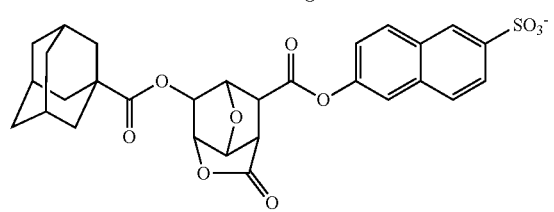
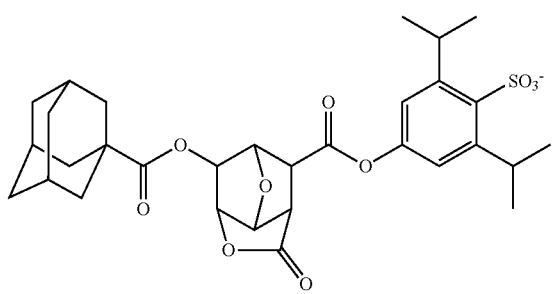
112
-continued
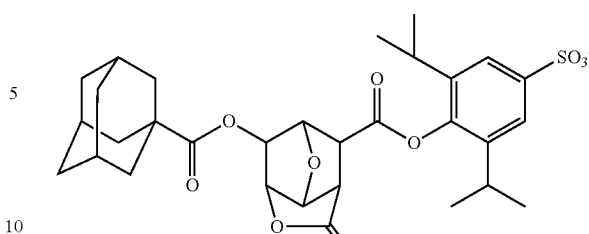
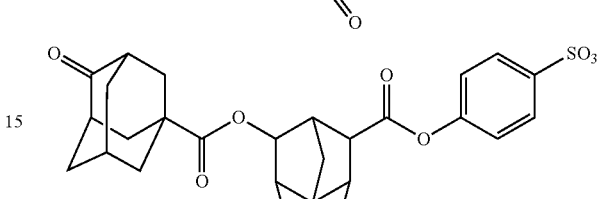
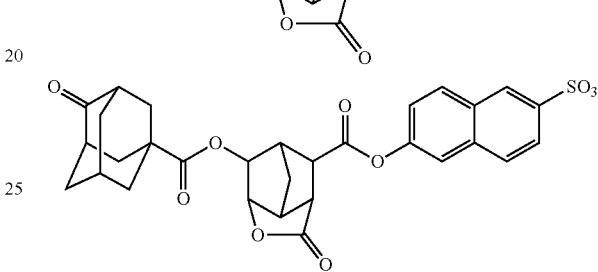
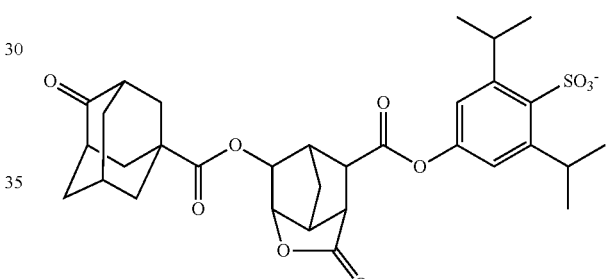
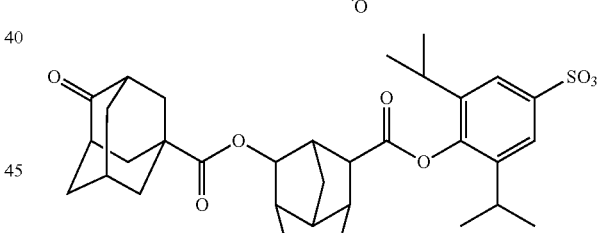
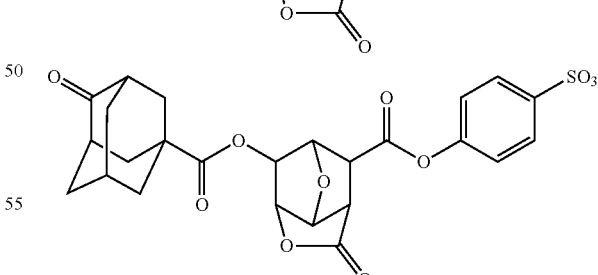
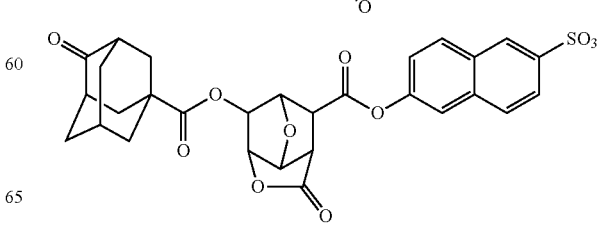

-continued

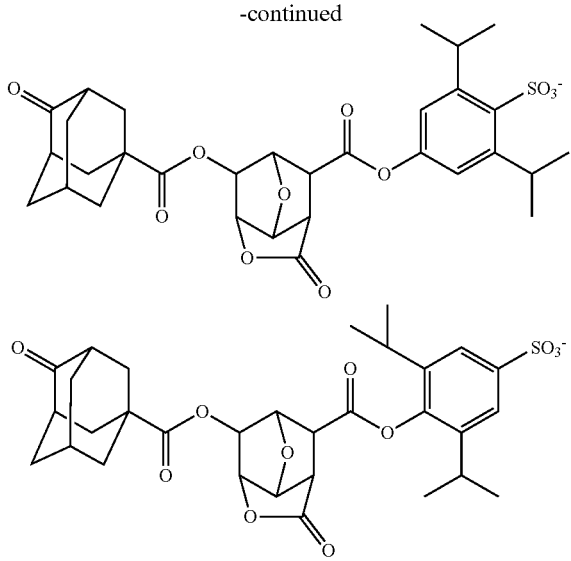

When the negative resist composition contains an acid generator of addition type, its amount is preferably 0.01 to 100 parts, more preferably 0.1 to 80 parts by weight per 100 parts by weight of the base polymer. The acid generator of addition type may be used alone or in admixture. When the base polymer contains repeat units (d1) to (d3) and/or the resist composition contains an acid generator of addition type, the resist composition functions as a chemically amplified negative resist composition.

Quencher

The negative resist composition may contain a quencher. As used herein, the quencher refers to a compound capable of trapping an acid generated from the acid generator to prevent the acid from diffusing to unexposed regions.

The quencher is typically selected from conventional basic compounds. Conventional basic compounds include primary, secondary, and tertiary aliphatic amines mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxy, ether, ester, lactone ring, cyano, or sulfonic acid ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium, iodonium and ammonium salts of sulfonic acids which are not fluorinated at α-position and carboxylic acids as described in U.S. Pat. No. 8,795,942 (JP-A 2008-1583391) may also be used as the quencher. While an α-fluorinated sulfonic acid, imide acid, and methide acid are necessary to deprotect the acid labile group of carboxylic acid ester, an α-non-fluorinated sulfonic acid or carboxylic acid is released by salt exchange with an α-non-fluorinated onium salt. An α-non-fluorinated sulfonic acid or carboxylic acid fractions as a quencher because it does not induce deprotection reaction.

A carboxylic acid onium salt having the formula (1) is also useful as the quencher.

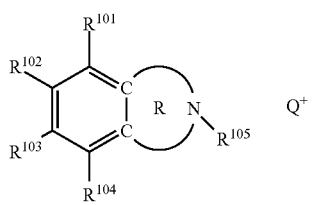

In formula (1), $R^{101}$ to $R^{104}$ are each independently hydrogen, —L—$CO_2^-$, or a $C_1$-$C_{20}$ hydrocarbyl group which may contain a heteroatom. A pair of $R^{101}$ and $R^{102}$, $R^{102}$ and $R^{103}$, or $R^{103}$ and $R^{104}$ may bond together to form a ring with the carbon atom to which they are attached. L is a single bond or a $C_1$-$C_{20}$ hydrocarbylene group which may contain a heteroatom. $R^{105}$ is a single bond or a $C_1$-$C_{20}$ hydrocarbyl group which may contain a heteroatom.

In formula (1), the ring R is a $C_2$-$C_6$ ring containing the carbon and nitrogen atoms in the formula. Some or all of the hydrogen atoms bonded to a carbon atom or atoms in the ring may be substituted by $C_1$-$C_{29}$ hydrocarbyl groups or —L—$CO_2^-$, and some carbon atoms in the ring may be replaced by sulfur, oxygen or nitrogen. The ring may be either aliphatic or aromatic and is preferably a 5- or 6-membered ring. Suitable rings include pyridine, pyrrole, pyrrolidine, piperidine, pyrazole, imidazoline, pyridazine, pyrimidine, pyrazine, imidazoline, oxazole, thiazole, morpholine, thiazine, and triazole rings.

The carboxylic acid opium salt of formula (1) has at least one —L—$CO_2^-$ group. That is, at least one of $R^{101}$ to $R^{104}$ is —L—$CO_2^-$ and/or at least one hydrogen atom bonded to a carbon atom in the ring R is substituted by —L—$CO_2^-$.

In formula (1), $Q^+$ is a sulfonium, iodonium or ammonium cation, with the sulfonium cation being preferred. Suitable sulfonium cations are as exemplified above as the cation in the repeat units (d2) and (d3).

Also useful are quenchers of polymer type as described in U.S. Pat. No. 7,598,016 (JP-A 2008-239918). The polymeric quencher segregates at the resist film surface and thus enhances the rectangularity of resist pattern. When a protective film is applied as is often the case in the immersion lithography, the polymeric quencher is also effective for preventing a film thickness loss of resist pattern or rounding of pattern top.

When the negative resist composition contains the quencher, its amount is preferably 0 to 5 parts, more preferably 0 to 4 parts by weight per 100 parts by weight of the base polymer. The quencher may be used alone or in admixture.

Other Components

In addition to the foregoing components, the negative resist composition may Contain additives such as surfactants, crosslinkers, water repellency improvers, and acetylene alcohols.

Exemplary surfactants are described in JP-A 2008-111103, paragraphs [0165]-[0166]. The addition of a surfactant may improve or control the coating characteristics of the resist composition. When the negative resist composition contains the surfactant, its amount is preferably 0 to 10 parts by weight, more preferably 00001 to 5 parts by weight per 100 parts by weight of the base polymer. The surfactant may be used alone or in admixture.

Suitable crosslinkers are described in JP-A 2020-027297, paragraphs [0170]-[0177]. The addition of a crosslinker exaggerates the difference in dissolution rate between exposed and unexposed regions, but can increase swell in the developer. When the negative resist composition contains the crosslinker, its amount is preferably 0 to 30 parts by weight, more preferably 0 to 20 parts by weight per 100 parts by weight of the base polymer.

The water repellency improver is effective for improving the water repellency on the resist film surface, and may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the alkaline developer and organic solvent developer. The water repellency improver of specific structure with a 1,1,1,3,3,3-hexafluoro-2-propanol residue is well soluble in the developer. A polymer having an amino group or amine salt copolymerized as repeat units may serve as the water repellent additive and is effective for preventing evaporation of acid during PEB, thus preventing any hole pattern opening failure after development. When the negative resist composition contains the water repellency improver, its amount is preferably 0 to 20 parts, more preferably 0.5 to 10 parts by weight per 100 parts by weight of the base polymer. The water repellency improver may be used alone or in admixture.

Suitable acetylene alcohols are described in JP-A 2008-122932, paragraphs [0179]-[0182]. When the negative resist composition contains the acetylene alcohol, its amount is preferably 0 to 5 pads by weight per 100 parts by weight of the base polymer. The acetylene alcohol may be used alone or in admixture.

Process

When the negative resist composition is used in the fabrication of various integrated circuits, any well-known lithography processes are applicable. The process generally involves the steps of applying the negative resist composition defined above onto a substrate to form a resist film thereon, exposing the resist film to high-energy radiation, and developing the exposed resist film in a developer.

The negative resist composition is first applied onto a substrate for IC fabrication (e.g., Si, $SiO_2$, SiN, SiON, TiN, WSi, BPSG, SOG, organic antireflective coating, etc.) or a substrate for mask circuit fabrication (e.g., Cr, CrO, CrON, $MoSi_2$, $SiO_2$, etc.) by a suitable coating technique such as spin coating, roll coating, dip coating, spray coating or doctor coating. The coating is prebaked on a hotplate preferably at a temperature of 60 to 150° C. for 10 seconds to 30 minutes, more preferably at 80 to 120° C. for 30 seconds to 20 minutes to form a resist film of 0.01 to 2 µm thick.

An anti-charging film or another topcoat film may be formed on the resist film. The anti-charging film is typically formed of polythiophene or polyaniline.

The resist film is then exposed to high-energy radiation such as UV, deep-UV, EUV of wavelength 3 to 15 nm, x-ray, soft x-ray, excimer laser, γ-ray, synchrotron radiation or EB. On use of UV, deep-UV, EUV, x-ray, soft x-ray, excimer laser, γ-ray or synchrotron radiation as the high-energy radiation, the resist film is exposed directly or through a mask having a desired pattern, preferably in a dose of about 1 to 200 $mJ/cm^2$, more preferably about 10 to 100 $mJ/cm^2$. On use of EB, a pattern may be written directly or through a mask having the desired pattern, preferably in a dose of about 0.1 to 100 $\mu C/cm^2$, more preferably about 0.5 to 50 $\mu C/cm^2$. The negative resist composition of the invention is best suited for the micropatterning lithography using EB, EUV, soft x-ray, x-ray, γ-ray or synchrotron radiation among others.

After the exposure, the resist film may be baked (PEB) on a hotplate or in an oven preferably at 00 to 150° C. for 10 seconds to 30 minutes, more preferably at 80 to 120° C. for 30 seconds to 20 minutes.

After the exposure or PEB, the resist film is developed in a developer in the form of an aqueous alkaline solution for 3 seconds to 3 minutes, preferably 5 seconds to 2 minutes by a conventional technique such as dip, puddle or spray technique. Suitable developers include 0.1 to 10 wt %, preferably 2 to 5 wt % aqueous solutions of tetramethylammonium hydroxide (TMAH), tetraethylammonium hydroxide (TEAH), tetrapropylammonium hydroxide (TPAH), and tetrabutylammonium hydroxide (TBAH). The exposed region of resist film is insolubilized whereas the unexposed region of resist film is dissolved in the developer. In this way, the desired negative pattern is formed on the substrate.

Although TMAH aqueous solution is generally used as the developer, TEAH, TPAH and TBAH having a longer alkyl chain are effective in inhibiting the resist film from being swollen during development and thus preventing pattern collapse. The TMAH developer is most often used as 2.38 wt % aqueous solution, which corresponds to 0.26 N. The TEAH, TPAH, and TBAH aqueous solutions should preferably have an equivalent normality. The concentration of TEAH, TPAH, and TBAH that corresponds to 0.26 N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using long-chain alkyl TEAH, TPAH or TBAH is effective for preventing film swell and hence, pattern collapse.

The triple bond is characteristically capable of crosslinking by heat at or above 200° C. When a resist pattern resulting from development is heated (post-baked), crosslinking occurs so that the pattern has a higher hardness. The pattern with a higher hardness has higher dry etching resistance. The crosslinking induced by post-bake is effective for reducing the water permeability and increasing the robustness of the resist film. The resist film has higher durability enough to serve as a permanent film.

EXAMPLES

Examples of the invention are given below by way of illustration and not by way of limitation. The abbreviation "pbw" is parts by weight.

[1] Synthesis of Base Polymers

Monomers M-1 to M-4, AM-1 to AM-4 and PM-1 to PM-4 used in the synthesis of base polymers are identified below. The polymer was analyzed for composition by $^{13}$C-NMR and $^1$H-NMR spectroscopy, and for Mw and Mw/Mn by GPC versus polystyrene standards using THF solvent.
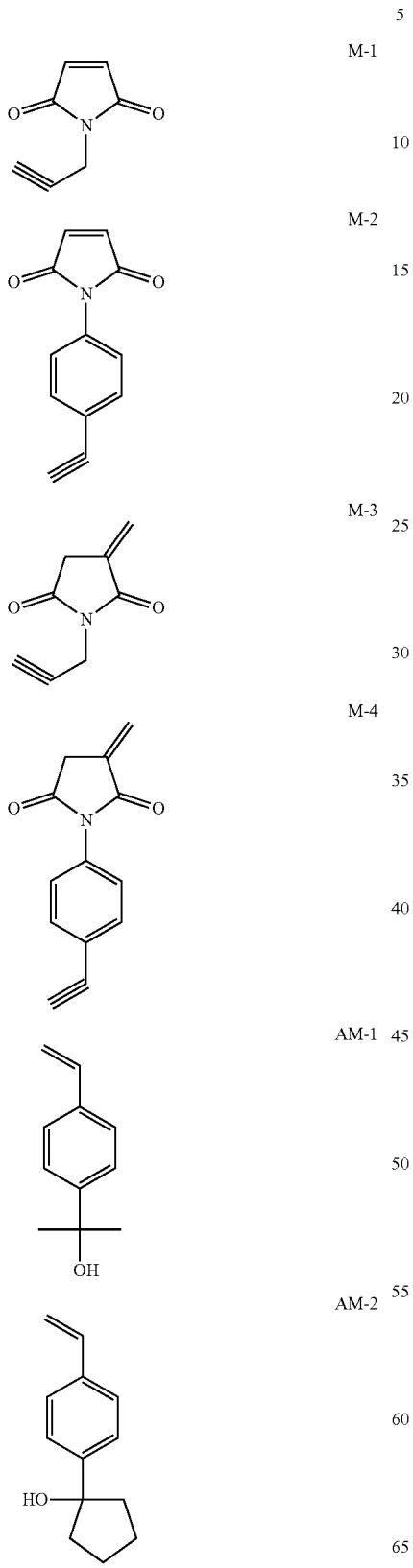
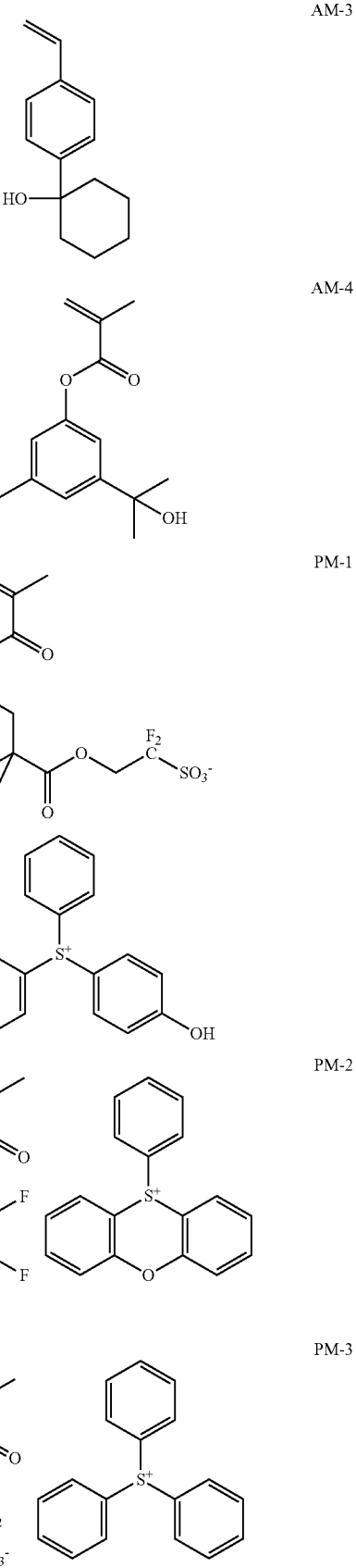

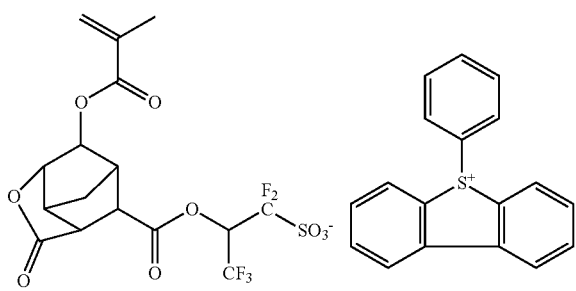

PM-4

Synthesis Example 1

Synthesis of Polymer P-1

A 2-L flask was charged with 2.4 g of Monomer M-1, 4.1 g of Monomer AM-1, 7.2 g of 4-hydroxystyrene, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of azobisisobutyronitrile (AIBN) was added. The reactor was heated at 60° C., whereupon reaction ran for 15 hours. The reaction solution was concentrated to a half volume and poured into a mixture of 1 L of methanol and 0.1 L of water for precipitation. The resulting white solid was collected by filtration and dried in vacuum at 60° C., yielding Polymer P-1. Polymer P-1 was analyzed by $^{13}$C— and $^{1}$H-NMR and GPC, with the results shown below.

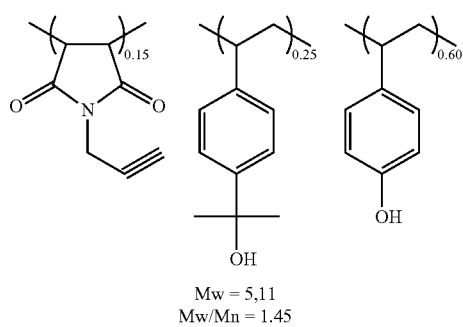

P-1

Mw = 5,11
Mw/Mn = 1.45

Synthesis Example 2

Synthesis of Polymer P-2

A 2-L flask was charged with 2.4 g of Monomer M-1, 3.8 g of Monomer AM-2, 7.8 g of 4-hydroxystyrene, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was concentrated to a half volume and poured into a mixture of 1 L of methanol and 0.1 L of water for precipitation. The resulting white solid was collected by filtration and dried in vacuum at 60° C. yielding Polymer P-2. Polymer P-2 was analyzed by $^{13}$C— and $^{1}$H-NMR and GPC, with the results shown below.

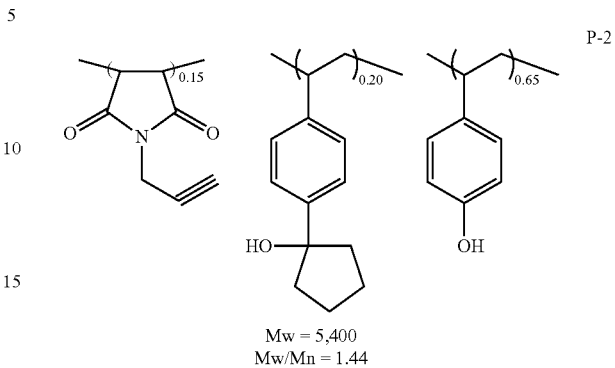

P-2

Mw = 5,400
Mw/Mn = 1.44

Synthesis Example 3

Synthesis of Polymer P-3

A 2-L flask was charged with 2.4 g of Monomer M-2, 4.0 g of Monomer AM-3, 6.0 g of 4-hydroxystyrene, 3.6 g of 4-hydroxyphenyl methacrylate, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was concentrated to a half volume and poured into a mixture of 1 L of methanol, and 0.1 L of water for precipitation. The resulting white solid was collected by filtration and dried in vacuum at 60° C., yielding Polymer P-3. Polymer P-3 was analyzed by $^{13}$C— and $^{1}$H-NMR and GPC, with the results shown below.

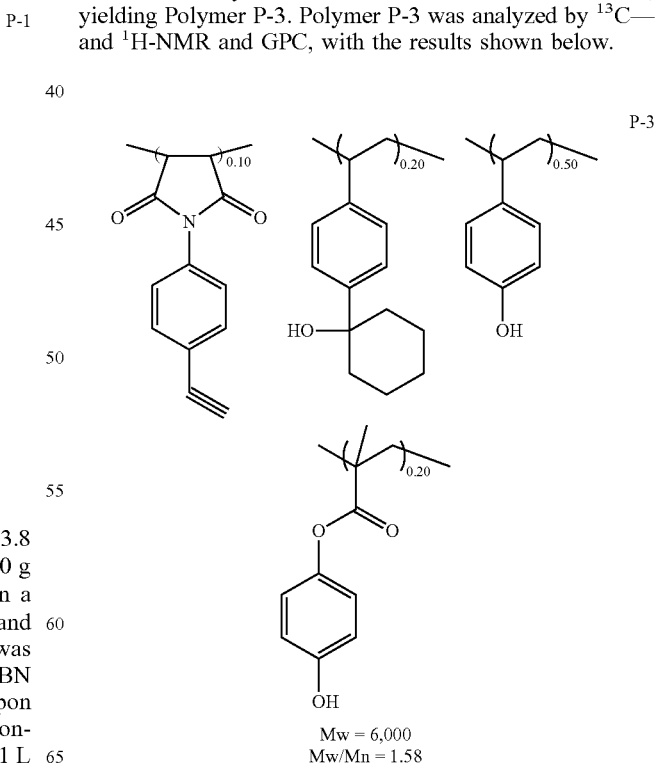

P-3

Mw = 6,000
Mw/Mn = 1.58

Synthesis Example 4

Synthesis of Polymer P-4

A 2-L flask was charged with 2.7 g of Monomer M-3, 4.9 g of Monomer AM-1, 5.4 g of 4-hydroxystyrene, 6.8 g of Monomer PM-1, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was concentrated to a half volume and poured into a mixture of 1 L of methanol and 0.1 L of water for precipitation. The resulting white solid was collected by filtration and dried in vacuum at 60° C. yielding Polymer P-4. Polymer P-4 was analyzed by $^{13}$C— and $^1$H-NMR and GPC, with the results shown below.

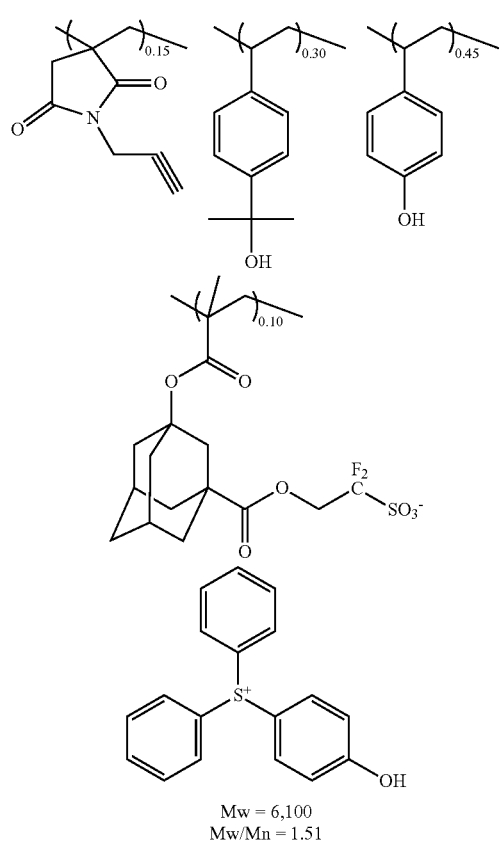

Synthesis Example 5

Synthesis of Polymer P-5

A 2-L flask was charged with 5.1 g of Monomer M-4, 4.9 g of Monomer AM-1, 4.8 g of 4-hydroxystyrene, 5.9 g of Monomer PM-2, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was concentrated to a half volume and poured into a mixture of 1 L of methanol and 0.1 L of water for precipitation. The resulting white solid was collected by filtration and dried in vacuum at 60° C., yielding Polymer P-5. Polymer P-5 was analyzed by $^{13}$C— and $^1$H-NMR and GPC, with the results shown below.

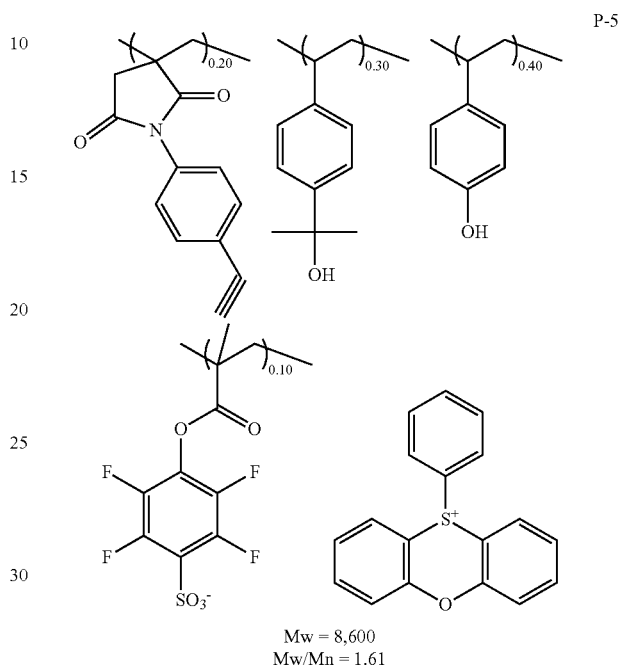

Synthesis Example 6

Synthesis of Polymer P-6

A 2-L flask was charged with 3.2 g of Monomer M-1, 4.9 g of Monomer AM-1, 4.8 g of 4-hydroxystyrene, 5.6 g of Monomer PM-3, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was concentrated to a half volume and poured into a mixture of 1 L of methanol and 0.1 L of water for precipitation. The resulting white solid was collected by filtration and dried in vacuum at 60° C., yielding Polymer P-6. Polymer P-6 was analyzed by $^{13}$C— and $^1$H-NMR and GPC, with the results shown below.

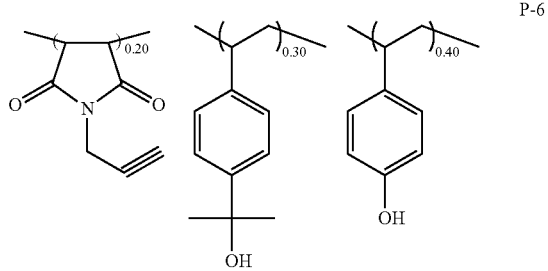

-continued

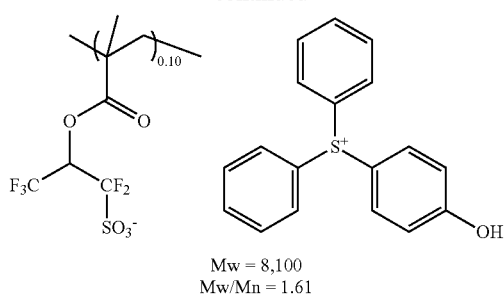

Mw = 8,100
Mw/Mn = 1.61

Synthesis Example 7

Synthesis of Polymer P-7

A 2-L flask was charged with 1.6 g of Monomer M-1, 8.3 g of Monomer AM-4, 6.0 g of 3-hydroxystyrene 7.4 g of Monomer PM-4, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was concentrated to a half volume and poured into a mixture of 1 L of methanol and 0.1 L of water for precipitation. The resulting white solid was collected by filtration and dried in vacuum at 60° C., yielding Polymer P-7. Polymer P-7 was analyzed by $^{13}$C— and $^1$H-NMR and GPC, with the results shown below.

P-7

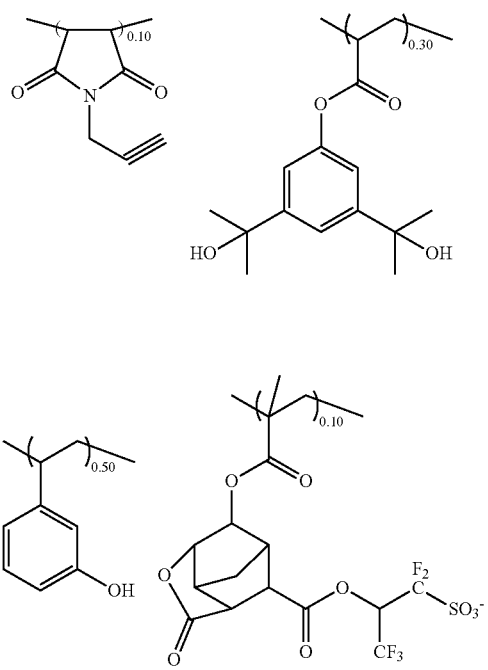

-continued

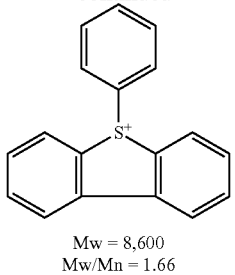

Mw = 8,600
Mw/Mn = 1.66

Synthesis Example 8

Synthesis of Polymer P-8

A 2-L flask was charged with 3.2 g of Monomer M-1, 4.9 g of Monomer AM-1, 5.9 g of 4-hydroxy-3-methoxystyrene, 5.6 g of Monomer PM-3, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was concentrated to a half volume and poured into a mixture of 1 L of methanol and 0.1 L of water for precipitation. The resulting white solid was collected by filtration and dried in vacuum at 60° C., yielding Polymer P-8. Polymer P-8 was analyzed by $^{13}$C— and $^1$H-NMR and GPC, with the results shown below.

P-8

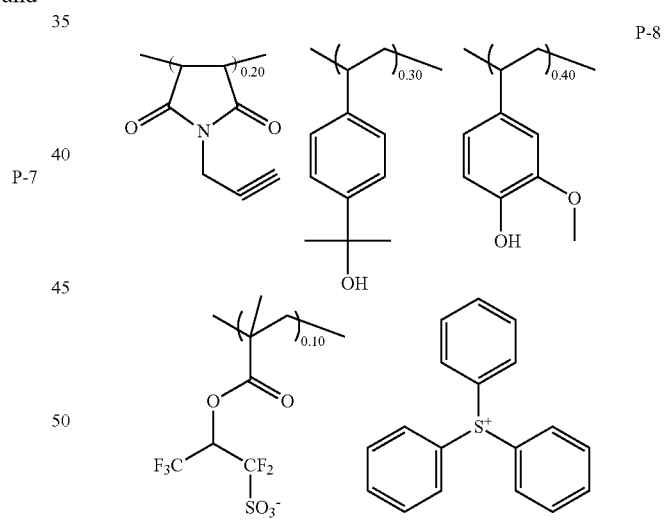

Mw = 6,100
Mw/Mn = 1.48

Comparative Synthesis Example 1

Synthesis of Comparative Polymer cP-1

A comparative polymer cP-1 was synthesized by the same procedure as in Synthesis Example 1 aside from using 2.3 g of acenaphthylene instead of Monomer M-1. The polymer was analyzed by $^{13}$C— and $^1$H-NMR and GPC, with the results shown below.

cP-1

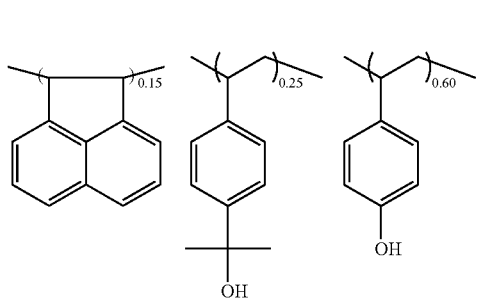

Mw = 5,500
Mw/Mn = 1.76

Comparative Synthesis Example 2

Synthesis of Comparative Polymer cP-2

A comparative polymer cP-2 was synthesized by the same procedure as in Synthesis Example 1 aside from using N-phenylmaleimide instead of Monomer M-1. The polymer was analyzed by $^{13}$C— and $^{1}$H-NMR and GPC, with the results shown below.

cP-2

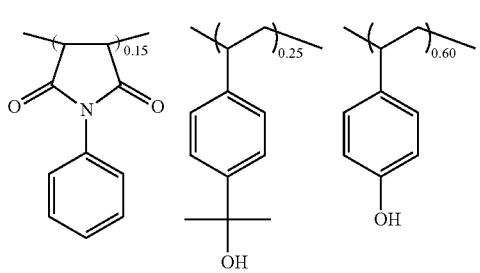

Mw = 5,500
Mw/Mn = 1.51

Comparative Synthesis Example 3

Synthesis of Comparative Polymer cP-3

A comparative polymer cP-3 was synthesized by the same procedure as in Synthesis Example 1 aside from using N-ethylitaconimide instead of Monomer M-1. The polymer was analyzed by $^{13}$C— and $^{1}$H-NMR and GPC, with the results shown below.

cP-3

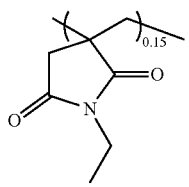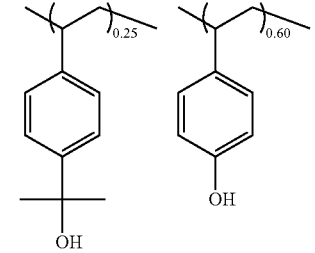

Mw = 6,600
Mw/Mn = 1.61

[2] Preparation and Evaluation of Negative Resist Compositions

Examples 1 to 10 and Comparative Examples 1 to 3

(1) Preparation of Negative Resist Compositions

A negative resist composition was prepared by dissolving the selected components in a solvent in accordance with the recipe shown in Table 1, and filtering through a filter with a pore size of 0.2 μm. The solvent contained 50 ppm of surfactant Poly Fox PF-636 (Omnova Solutions Inc.)

The components in Table 1 are identified below.

Organic Solvent

PGMEA (propylene glycol monomethyl ether acetate)
EL (ethyl lactate)

Acid Generator: PAG-1

Quencher: Q-1

PAG-1

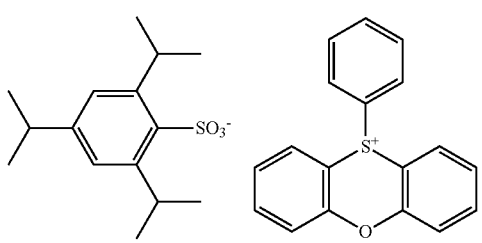

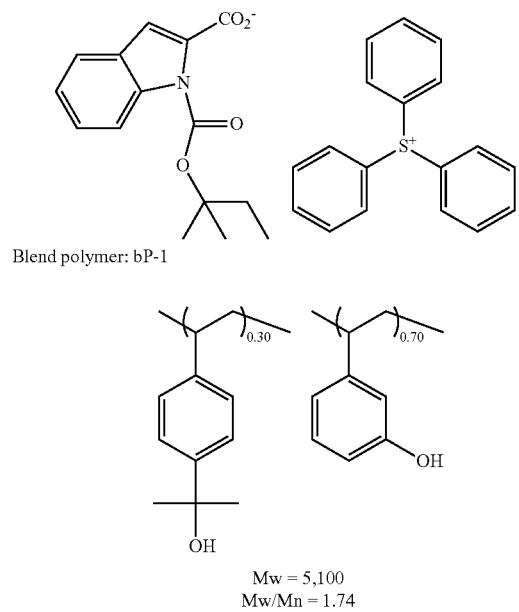

Q-1

Blend polymer: bP-1 bP-1

Mw = 5,100
Mw/Mn = 1.74

(2) EB Lithography Test

A silicon substrate having a diameter of 6 inches was vapor primed with hexamethyldisilazane (HMDS) at 110° C. for 60 seconds. Using a coater/developer system Clean Track Mark 5 (Tokyo Electron Ltd.), the negative resist composition shown in Table 1 was spin coated onto the substrate and pre-baked on a hotplate at 110° C. for 60 seconds to form a resist film of 80 nm thick. Using a system HL-800D (Hitachi Ltd.) at a HV voltage of 50 kV, the resist film was exposed imagewise to EB in a vacuum chamber.

Using Clean Track Mark 5, immediately after the imaging, the resist film was baked (PEB) on a hotplate at the temperature shown in Table 1 for 60 seconds and puddle developed in a 2.38 wt % TMAH aqueous solution for 30 seconds to form a negative pattern.

The resulting resist pattern was evaluated as follows. Sensitivity is the exposure dose that provides a 1:1 resolution of a 100-nm line-and-space (LS) pattern. Resolution is a minimum size at that dose. The 100-nm LS pattern was measured for line edge roughness (LER) under SEM. The results are shown in Table 1 together with the formulation of resist composition.

TABLE 1

|  |  | Base polymer (pbw) | Acid generator (pbw) | Quencher (pbw) | Organic solvent (pbw) | PEB temp. (° C.) | Sensitivity ($\mu C/cm^2$) | Resolution (nm) | LER (nm) |
|---|---|---|---|---|---|---|---|---|---|
| Example | 1 | P-1 (100) | PAG-1 (12) | Q-1 (4.0) | PGMEA (1,500) EL (1,000) | 110 | 39.3 | 70 | 5.2 |
|  | 2 | P-2 (100) | PAG-1 (12) | Q-1 (4.0) | PGMEA (1,500) EL (1,000) | 110 | 42.5 | 70 | 5.8 |
|  | 3 | P-3 (100) | PAG-1 (12) | Q-1 (4.0) | PGMEA (1,500) EL (1,000) | 120 | 49.6 | 70 | 5.9 |
|  | 4 | P-1 (60) P-3 (40) | PAG-1 (12) | Q-1 (4.0) | PGMEA (1,500) EL (1,000) | 120 | 45.8 | 70 | 5.7 |
|  | 5 | P-4 (100) | — | Q-1 (4.0) | PGMEA (1,500) EL (1,000) | 80 | 43.6 | 65 | 4.1 |
|  | 6 | P-5 (100) | — | Q-1 (4.0) | PGMEA (1,500) EL (1,000) | 80 | 41.2 | 65 | 4.2 |
|  | 7 | P-6 (100) | — | Q-1 (4.0) | PGMEA (1,500) EL (1,000) | 80 | 42.1 | 65 | 4.2 |
|  | 8 | P-7 (50) bP-1 (50) | PAG-1 (7) | Q-1 (4.0) | PGMEA (1,500) EL (1,000) | 80 | 46.2 | 65 | 4.8 |
|  | 9 | P-1 (50) P-6 (50) | PAG-1 (7) | Q-1 (4.0) | PGMEA (1,500) EL (1,000) | 85 | 44.7 | 65 | 4.7 |
|  | 10 | P-8 (100) | — | Q-1 (4.0) | PGMEA (1,500) EL (1,000) | 80 | 45.6 | 70 | 4.2 |
| Comparative Example | 1 | cP-1 (100) | PAG-1 (12) | Q-1 (4.0) | PGMEA (1,500) EL (1,000) | 110 | 50.0 | 80 | 7.1 |
|  | 2 | cP-2 (100) | PAG-1 (12) | Q-1 (4.0) | PGMEA (1,500) EL (1,000) | 110 | 48.0 | 80 | 7.1 |
|  | 3 | cP-3 (100) | — | Q-1 (4.0) | PGMEA (1,500) EL (1,000) | 110 | 44.0 | 75 | 6.1 |

As seen from Table 1, the negative resist composition within the scope of the invention meets satisfactory resolution and reduced LER.

Japanese Patent Application No. 2021-023472 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A negative resist composition comprising:
a quencher;
a solvent; and
a base polymer comprising repeat units (a) derived from a triple bond-containing maleimide compound,
wherein the negative resist composition further comprises a photoacid generator, and/or the base polymer further comprises repeat units having the formula (d1), (d2) or (d3):

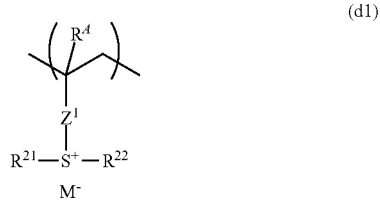

(d1)

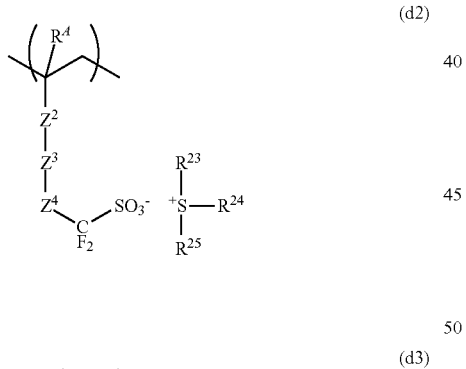

(d2)

(d3)

wherein $R^A$ is hydrogen or methyl,
$Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(=O)—O—$Z^{11}$— or —C(=O)—NH—$Z^{11}$—, $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety, $Z^2$ is a single bond or ester bond, $Z^3$ is a single bond, —$Z^{31}$—C(=O)—O—, —$Z^{31}$—O— or —$Z^{31}$—O—C(=O)—, $Z^{31}$ is a $C_1$-$C_{12}$ aliphatic hydrocarbylene group, phenylene group, or $C_7$-$C_{18}$ group obtained by combining the foregoing, which may contain a carbonyl moiety, ester bond, ether bond, bromine or iodine, $Z^4$ is methylene, 2,2,2-trifluoro-1,1-ethanediyl, or carbonyl, $Z^5$ is a single bond, methylene, ethylene, phenylene, fluorinated phenylene, trifluoromethyl-substituted phenylene group, —O—$Z^{51}$—, —C(=O)—O—$Z^{51}$—, or —C(=O)—NH—$Z^{51}$—, $Z^{51}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond, halogen or hydroxy moiety, $R^{21}$ to $R^{28}$ are each independently halogen or a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, and M— is a non-nucleophilic counter ion.

2. The negative resist composition of claim 1 wherein the repeat units (a) are repeat units (a1) having the formula (a1) or repeat units (a2) having the formula (a2):

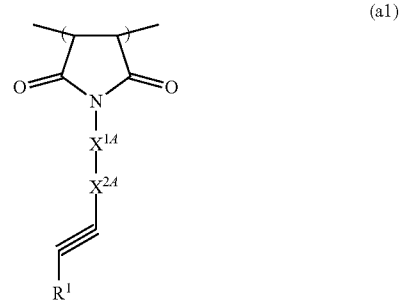

(a1)

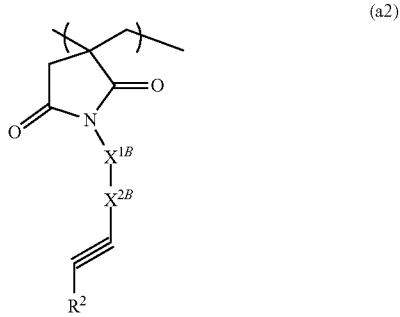

(a2)

wherein $R^1$ and $R^2$ are each independently hydrogen or methyl, $X^{1A}$ and $X^{1B}$ are each independently a single bond, a $C_1$-$C_6$ saturated hydrocarbylene group or phenylene group, $X^{2A}$ and $X^{2B}$ are each independently a single bond, ester bond or ether bond.

3. The negative resist composition of claim 1 wherein the base polymer further comprises repeat units (b) having a phenolic hydroxy group.

4. The negative resist composition of claim 3 wherein the repeat units (b) have the formula (b):

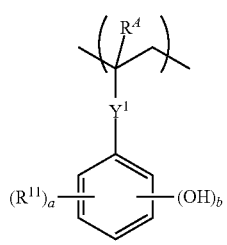

(b)

wherein $R^A$ is hydrogen or methyl, $R^{11}$ is a $C_1$-$C_4$ alkyl group, $C_1$-$C_4$ alkoxy group, acetoxy group or halogen, $Y^1$ is a single bond, ester bond or amide bond, a is an integer of 0 to 4, b is 1 or 2, and the sum of a+b is from 1 to 5.

5. The negative resist composition of claim 1 wherein the base polymer further comprises repeat units (c) having the formula (c):

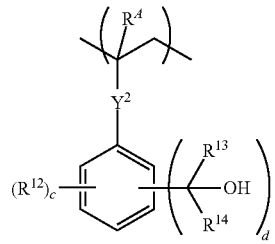

(c)

wherein $R^A$ is hydrogen or methyl, $R^{12}$ is a $C_1$-$C_6$ alkyl group or halogen, $R^{13}$ and $R^{14}$ are each independently hydrogen or a $C_1$-$C_6$ saturated hydrocarbyl group, $R^{13}$ and $R^{14}$ may bond together to form a ring with the carbon atom to which they are attached, $Y^2$ is a single bond or ester bond, c is an integer of 0 to 4, d is 1 or 2, and the sum of c+d is from 1 to 5.

6. The negative resist composition of claim 1, further comprising a surfactant.

7. A pattern forming process comprising the steps of applying the negative resist composition of claim 1 onto a substrate to form a resist film thereon, exposing the resist film to high-energy radiation, and developing the exposed resist film in a developer.

8. The process of claim 7 wherein the substrate is a photomask blank.

9. The process of claim 7 wherein the high-energy radiation is UV radiation of wavelength 180 to 400 nm.

10. The process of claim 7 wherein the high-energy radiation is EB or EUV of wavelength 3 to 15 nm.

11. A photomask blank having the negative resist composition of claim 1 coated thereon.

* * * * *